United States Patent
Tsunoda et al.

(10) Patent No.: US 11,129,309 B2
(45) Date of Patent: Sep. 21, 2021

(54) COOLING DEVICE, LID-EQUIPPED COOLING DEVICE, CASE WITH COOLING DEVICE, AND INVERTER

(71) Applicant: Mitsubishi Electric Corporation, Tokyo (JP)

(72) Inventors: Yoshikazu Tsunoda, Tokyo (JP); Kazushi Ikurumi, Tokyo (JP); Yuji Shirakata, Tokyo (JP); Keiji Harada, Tokyo (JP); Masanori Kageyama, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/982,852

(22) PCT Filed: Mar. 18, 2019

(86) PCT No.: PCT/JP2019/011125
§ 371 (c)(1),
(2) Date: Sep. 21, 2020

(87) PCT Pub. No.: WO2019/188483
PCT Pub. Date: Oct. 3, 2019

(65) Prior Publication Data
US 2021/0059068 A1 Feb. 25, 2021

(30) Foreign Application Priority Data
Mar. 27, 2018 (JP) .............................. JP2018-059549

(51) Int. Cl.
*H05K 7/20* (2006.01)
(52) U.S. Cl.
CPC ................................. *H05K 7/209* (2013.01)
(58) Field of Classification Search
None
See application file for complete search history.

(56) References Cited

U.S. PATENT DOCUMENTS

| 3,421,578 A | 1/1969 | Marton |
| 7,028,758 B2* | 4/2006 | Sheng ................. F28D 15/0275 165/104.21 |

(Continued)

FOREIGN PATENT DOCUMENTS

| DE | 10141988 C1 | 1/2003 |
| JP | S59229844 A | 12/1984 |

(Continued)

OTHER PUBLICATIONS

International Search Report (PCT/ISA/210) dated May 28, 2019, by the Japan Patent Office as the International Searching Authority for International Application No. PCT/JP2019/011125.

(Continued)

*Primary Examiner* — Courtney L Smith
(74) *Attorney, Agent, or Firm* — Buchanan Ingersoll & Rooney PC

(57) ABSTRACT

A cooling device to be provided is capable of being reduced in size, capable of cooling a heating component uniformly, having high radiating performance, and facilitating implementation of a work in a flat state. A first cooler body includes a first base plate and first blades. The first base plate has a first component mounting surface. A second cooler body includes a second base plate and second blades. The second base plate has a second component mounting surface. With the second cooler body maintained connected to the first cooler body, a rotary mechanism allows the second cooler body to rotate relative to the first cooler body between a state in which the first component mounting surface and the second component mounting surface are pointed to the same direction and a state in which the second blades get into gaps between the first blades without interfering with the first blades.

20 Claims, 64 Drawing Sheets

(56) References Cited

U.S. PATENT DOCUMENTS

| | | | | |
|---|---|---|---|---|
| 7,298,619 | B1* | 11/2007 | Malone | H05K 7/1421 |
| | | | | 165/80.2 |
| 7,339,793 | B2* | 3/2008 | Foster, Sr. | G06F 1/184 |
| | | | | 165/80.3 |
| 7,612,992 | B2* | 11/2009 | Chen | G06F 1/20 |
| | | | | 165/80.3 |
| 8,681,501 | B2* | 3/2014 | Govindasamy | G06F 1/203 |
| | | | | 361/710 |
| 10,595,439 | B2* | 3/2020 | Shia | F28D 15/0275 |
| 10,779,439 | B2* | 9/2020 | Chen | H05K 7/2039 |
| 10,856,441 | B1* | 12/2020 | Huang | H05K 7/20727 |
| 2003/0041456 | A1 | 3/2003 | Diels | |
| 2011/0286179 | A1* | 11/2011 | Motschman | H01L 23/4093 |
| | | | | 361/679.54 |
| 2012/0300403 | A1* | 11/2012 | Scholeno | H05K 7/2049 |
| | | | | 361/702 |
| 2013/0003362 | A1 | 1/2013 | Kang et al. | |
| 2018/0246547 | A1* | 8/2018 | Degner | G02B 6/001 |
| 2019/0041922 | A1* | 2/2019 | Kurma Raju | G06F 1/1616 |

FOREIGN PATENT DOCUMENTS

| | | |
|---|---|---|
| JP | H03-058456 A | 3/1991 |
| JP | 2014130846 A | 7/2014 |

OTHER PUBLICATIONS

Written Opinion (PCT/ISA/237) dated May 28, 2019, by the Japan Patent Office as the International Searching Authority for International Application No. PCT/JP2019/011125.

Office Action dated May 12, 2021, by the German Patent Office in corresponding German Patent Application No. 112019001566.4 and English translation of the Office Action. (13 pages).

* cited by examiner

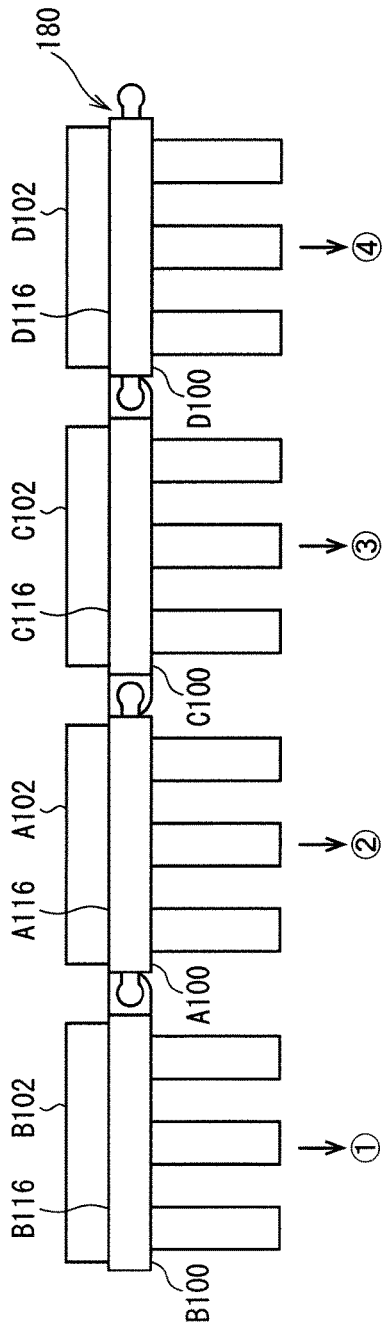
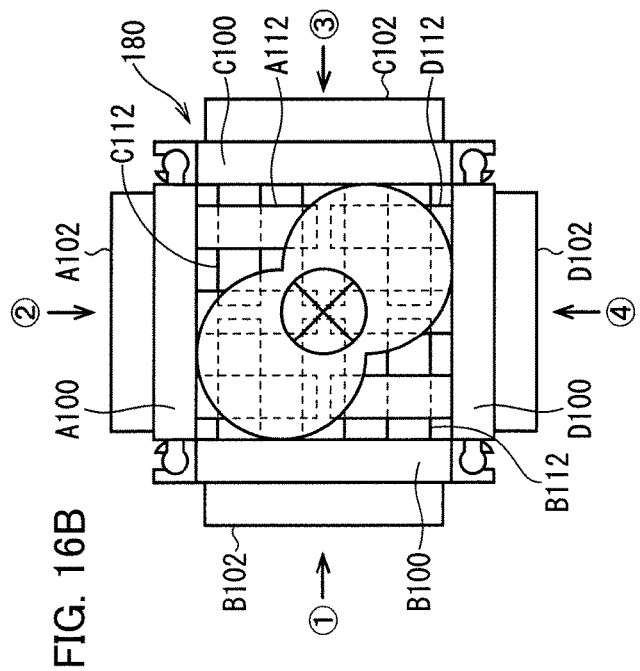

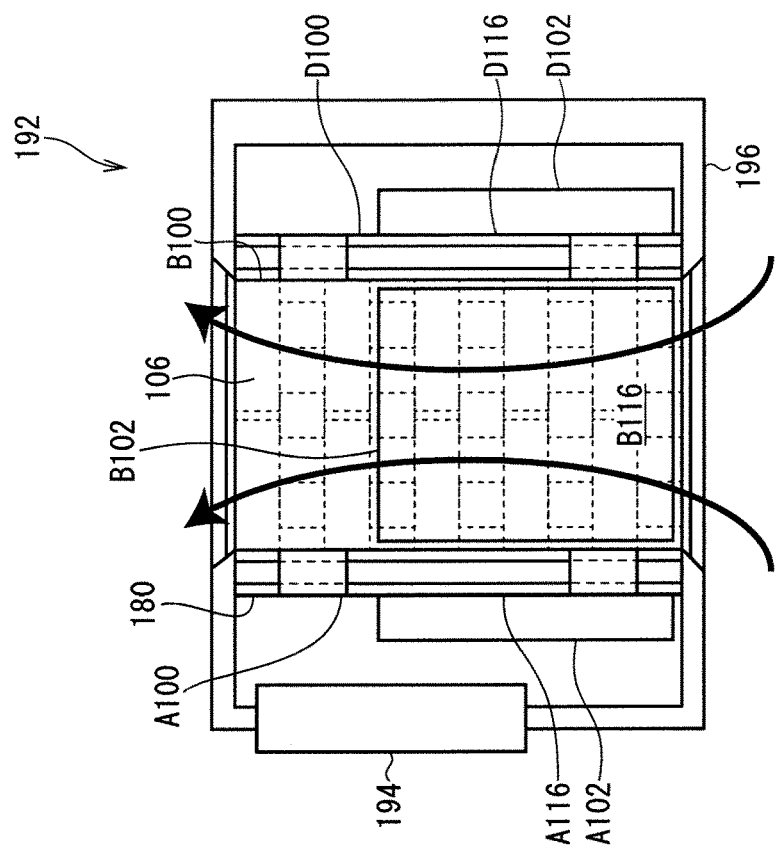
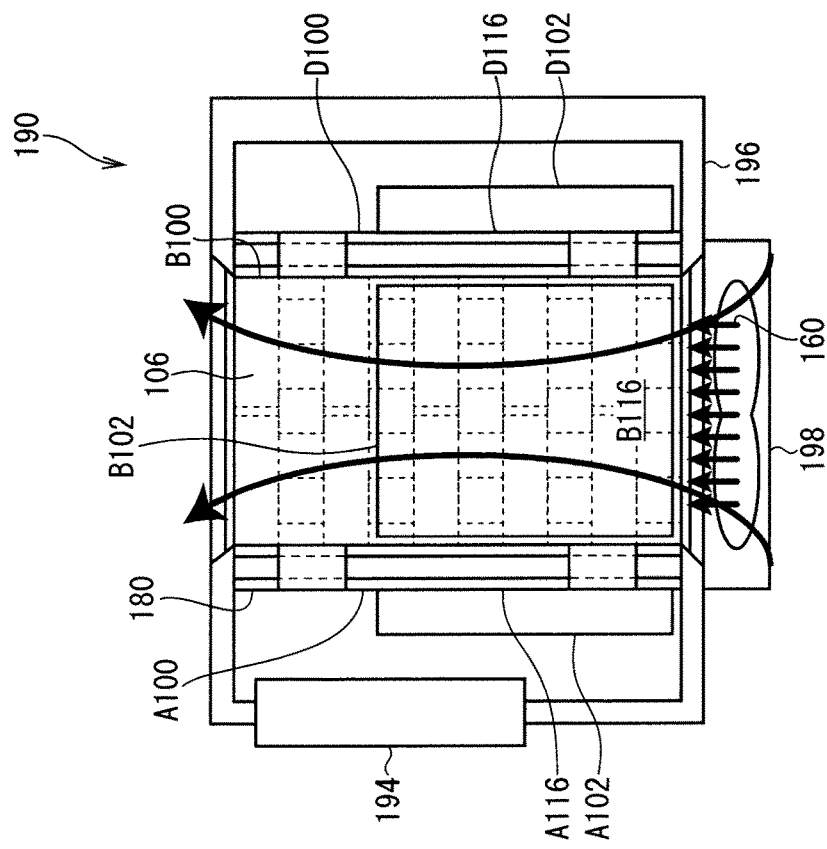
FIG. 17A
FIG. 17B

A130, B130, C130

A138, B138, C138

A132, B132, C132

A140, B140, C140

A112, B112, C112

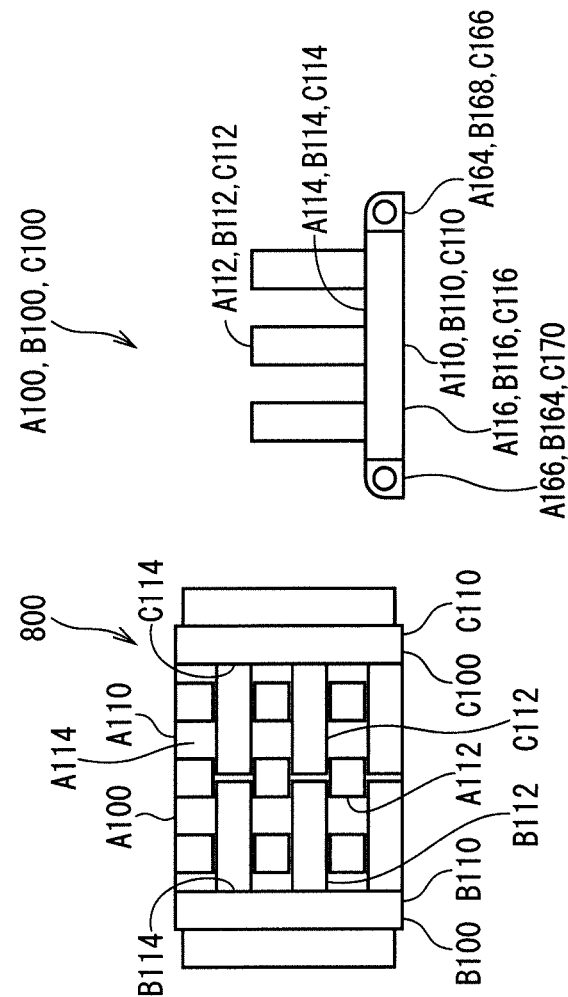

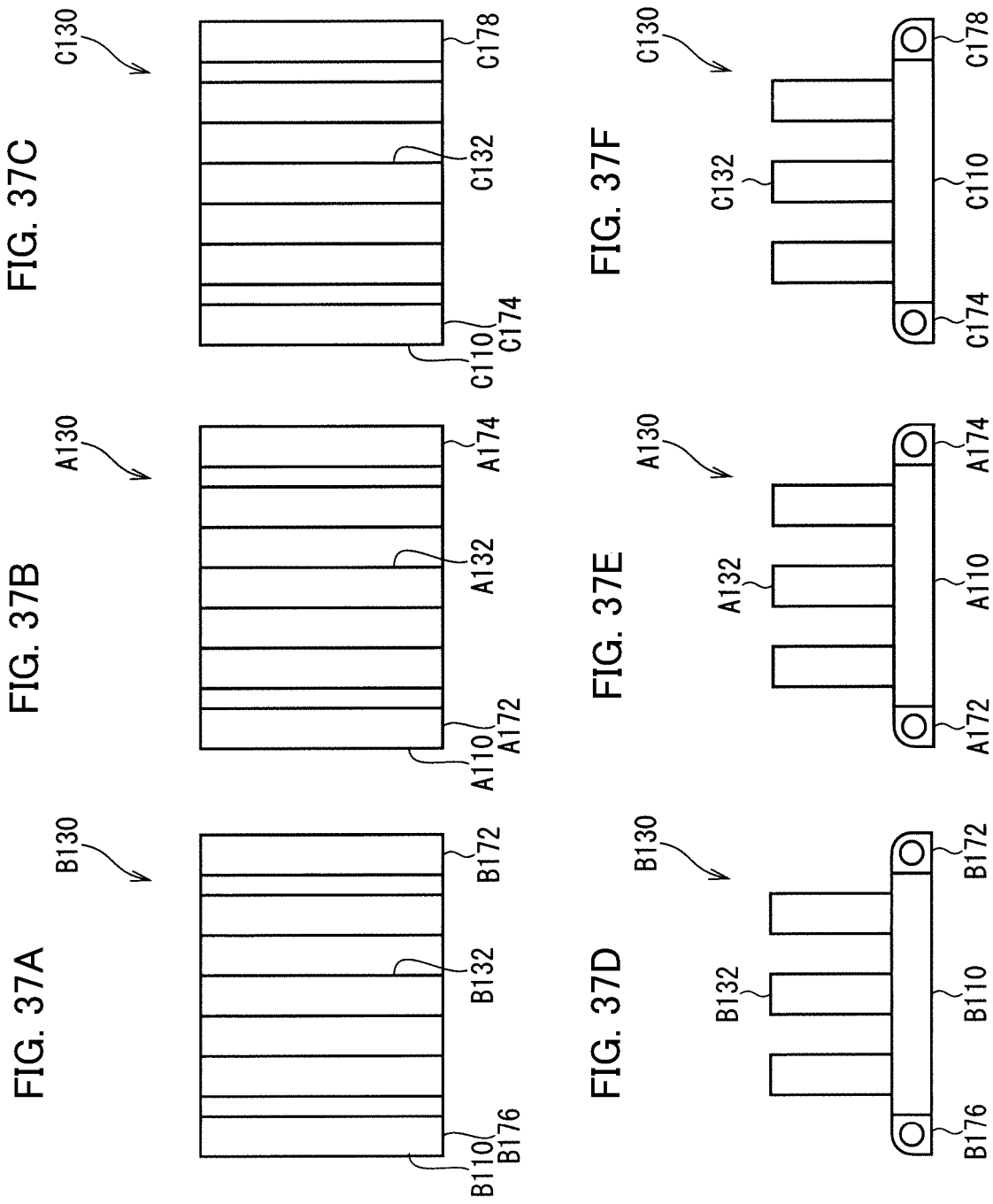

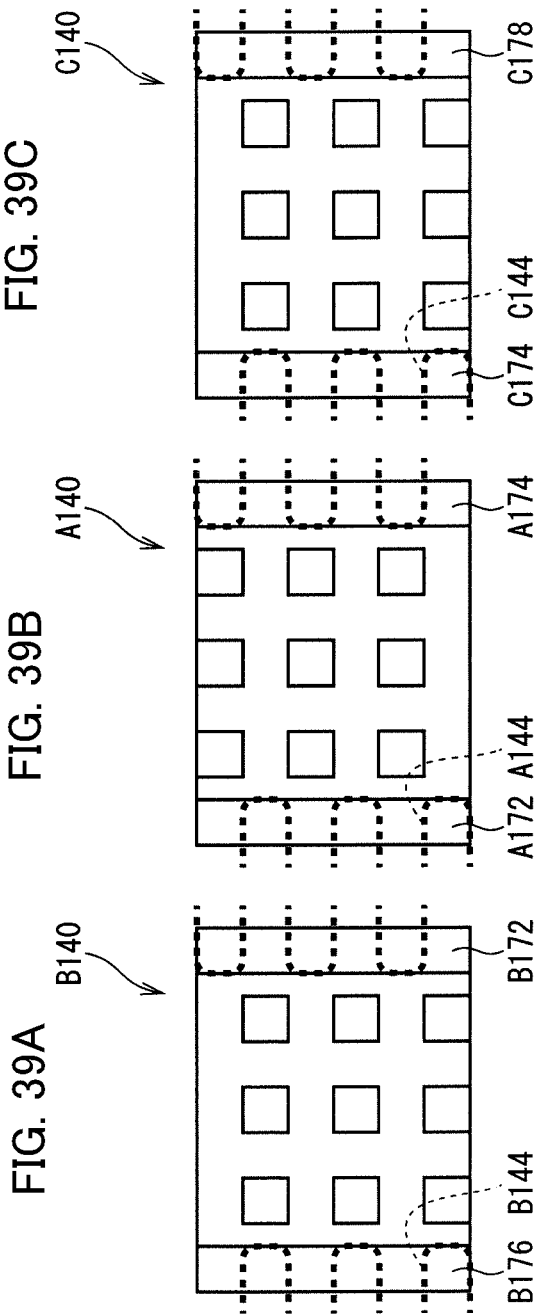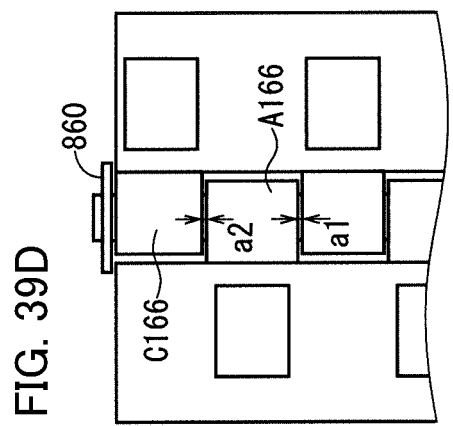

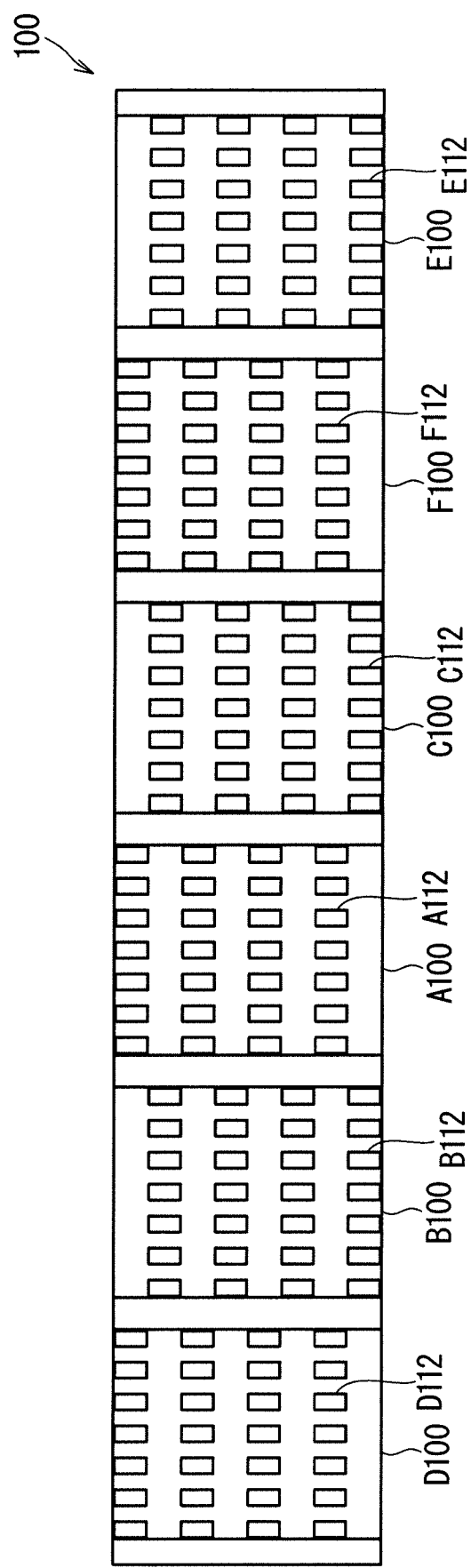

F I G. 7 1
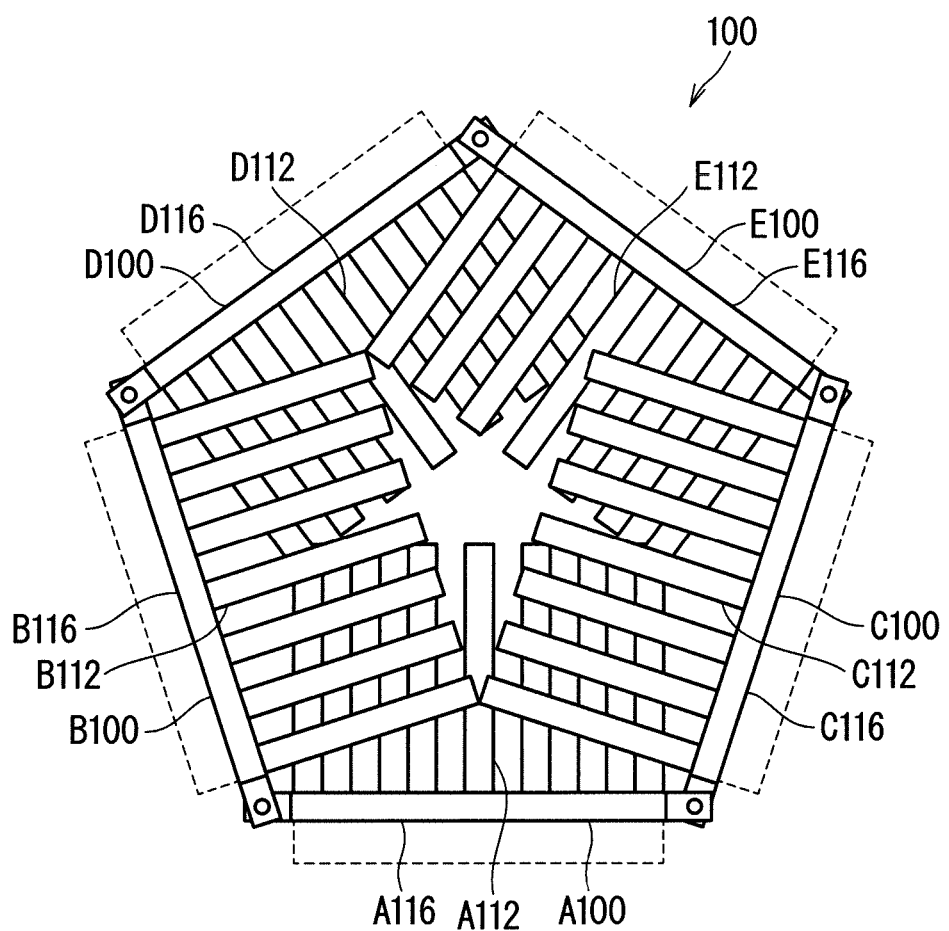

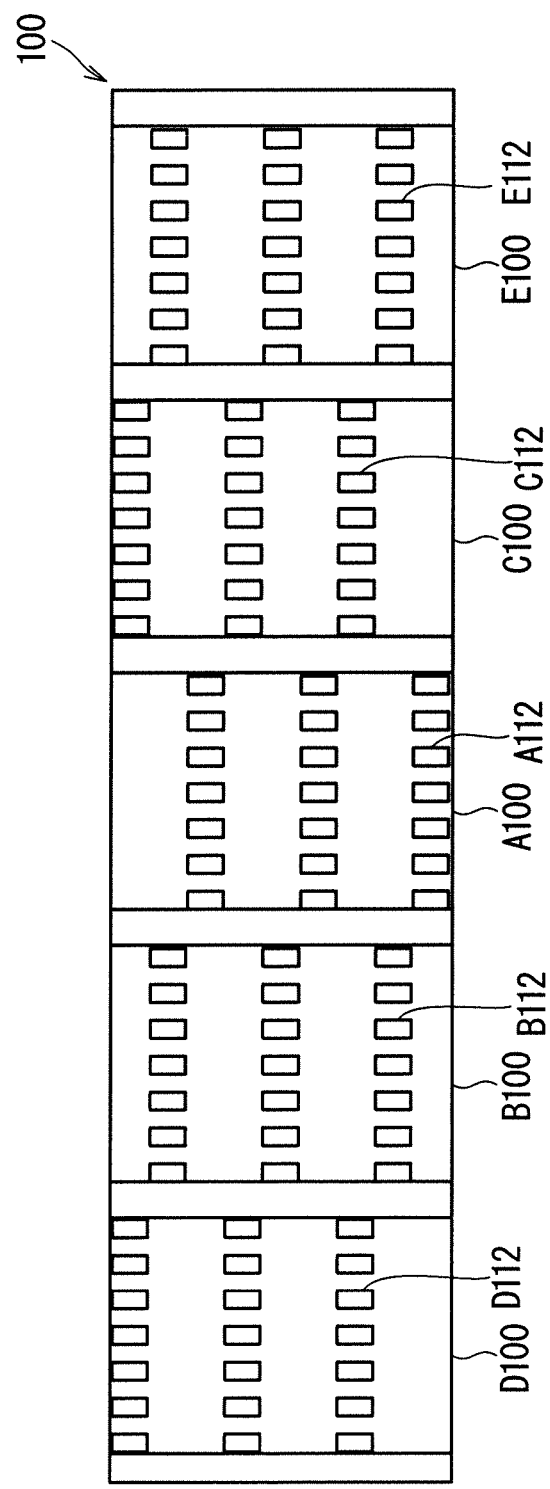

COOLING DEVICE, LID-EQUIPPED COOLING DEVICE, CASE WITH COOLING DEVICE, AND INVERTER

TECHNICAL FIELD

The present invention relates to a cooling device.

BACKGROUND ART

A device such as an electric device or an electronic device is generally required to be reduced in size.

Such a device includes a component such as a semiconductor device, an electric component, an electronic component, etc. Many electric components and many electronic components are mounted on a printed board.

If a component provided to a device generates a large amount of heat, a cooler is required for cooling the component. The cooler includes a cooler for natural air cooling, a cooler for forced air cooling, a cooler for water cooling, etc. To cool the component using the cooler for forced air cooling, a cooling fan for generating an air current to contact the cooler for forced air cooling is used in combination.

If there arises a need to cool a large number of components, provision of a plurality of coolers is required depending on a device scale. However, providing the plurality of coolers increases the size of a case provided to the device to increase the cost of the device.

In this regard, consideration has been given to a configuration in which one of two coolers is attached horizontally and the other of the two coolers is attached vertically to form an L-shape structure using the two coolers, and components are attached to a horizontal surface of the one of the two coolers and to the vertical surface of the other of the two coolers. This configuration fulfills stereoscopic arrangement of the components to achieve effective use of space.

According to a technique disclosed in patent document 1, a large number of radiating fins formed into extrudable shapes are aligned on the outer surface of a heat sink body, a male connector is formed at one end portion of the heat sink body, and a female connector is formed at the other end portion of the heat sink body (line 3 in the upper left column on page 2 to line 2 in the upper right column on page 2). A male connector and a female connector of a heat sink are coupled by fitting to a female connector and a male connector respectively of a heat sink to be used in combination. By doing so, a heat sink is configured using a plurality of heat sinks. The coupling by fitting is done at an angle of 90° or 180° (line 3 in the upper left column on page 2 to line 2 in the upper right column on page 2).

PRIOR ART DOCUMENT

Patent Document

Japanese Patent Application Laid-Open No. 59-229844 (1984)

SUMMARY

Problem to be Solved by the Invention

According to the technique disclosed in patent document 1, the radiating fins are arranged outside the heat sink configured using the plurality of heat sinks. This increases the size of the heat sink configured using the plurality of heat sinks. Additionally, the radiating fins are distributed in a wide range to cause difficulty in cooling a heating component uniformly.

A possible solution to this problem is to arrange the radiating fins inside the heat sink configured using the plurality of heat sinks. However, if the radiating fins aligned in extrudable shapes are arranged inside the heat sink configured using the plurality of heat sinks, the radiating fins are required to be extremely short in length for preventing interference between these radiating fins of the heat sink and radiating fins of a heat sink to be used in combination. However, extremely shortening the lengths of the radiating fins causes difficulty in achieving a heat sink having high radiating performance.

According to the technique disclosed in patent document 1, for making a transition from a state after coupling by fitting is done at 90° to a state for making coupling by fitting at 180°, or for making a transition from a state after coupling by fitting is done at 180° to a state for making coupling by fitting at 90°, the coupling by fitting is required to be released once. This makes it difficult to do a work such as attachment of a semiconductor element after coupling by fitting is done at 180° and a large-sized heat sink is in a flat state.

The present invention is intended to solve the foregoing problems. The present invention is intended to provide a cooling device capable of being reduced in size, capable of cooling a heating component uniformly, having high radiating performance, and facilitating implementation of a work in a flat state.

Means to Solve the Problem

The cooling device includes a first cooler body, a second cooler body, and a rotary mechanism.

The first cooler body includes a first base plate and first blades. The first base plate has a first component mounting surface. The first blades each have a pin-like shape and are coupled to the first base plate.

The second cooler body includes a second base plate and second blades. The second base plate has a second component mounting surface. The second blades each have a pin-like shape and are coupled to the second base plate.

With the second cooler body maintained connected to the first cooler body, the rotary mechanism allows the second cooler body to rotate relative to the first cooler body between a state in which the first component mounting surface and the second component mounting surface are pointed to the same direction and a state in which the second blades get into gaps between the first blades without interfering with the first blades.

Effects of the Invention

According to the present invention, the cooling device has a stereoscopic configuration. The first blades and the second blades are arranged inside the cooling device. Thus, while the cooling device includes the first cooler and the second cooler coupled to each other, size reduction of the cooling device is still achieved.

According to the present invention, the first blades and the second blades are arranged inside the cooling device. Thus, a radiator unit including the first blades and a radiator unit including the second blades are centralized in one place. This can form one cooling fan for cooling a heating component uniformly to improve the cooling performance of the cooling device.

According to the present invention, various works are done on the cooling device having a flat configuration. Thus, such various works proceed while the component mounting surface is looked down from above. This facilitates implementation of the various works. After the various works are done on the cooling device having a flat configuration, the cooling device is assembled into a stereoscopic configuration. These ways encourage the work of assembling the cooling device having a stereoscopic configuration to be done easily.

These and other objects, features, aspects and advantages of the present invention will become more apparent from the following detailed description of the present invention when taken in conjunction with the accompanying drawings.

BRIEF DESCRIPTION OF DRAWINGS

FIGS. 16A and 16B are front views schematically showing mounting of a heating component and assembling of the cooling device in a finished state during manufacture of the cooling device according to the fourth embodiment;

FIGS. 17A and 17B are cross-sectional views schematically illustrating a device including the cooling device according to the fourth embodiment;

FIGS. 35A to 35C schematically illustrate the cooling device according to the eighth embodiment and each cooler provided in the cooling device according to the eighth embodiment;

FIGS. 37A to 37F schematically illustrate an extruded cooler formed during manufacture of the cooling device according to the eighth embodiment;

FIGS. 39A to 39D are top views schematically showing additional working on an extruded circular fitting part during manufacture of the cooling device according to the eighth embodiment;

FIG. 70 is a top view schematically illustrating the cooling device in a semi-finished state according to the fifteenth embodiment;

FIG. 71 is a front view schematically illustrating a cooling device in a finished state and a heating component according to a sixteenth embodiment;

FIG. 73 is a front view schematically illustrating the cooling device in a semi-finished state according to the sixteenth embodiment;

DESCRIPTION OF EMBODIMENT(S)

1 First Embodiment 1.1 Preface

A first embodiment relates to a cooling device.

1.2 Outline of Cooling Device

Figure 1:
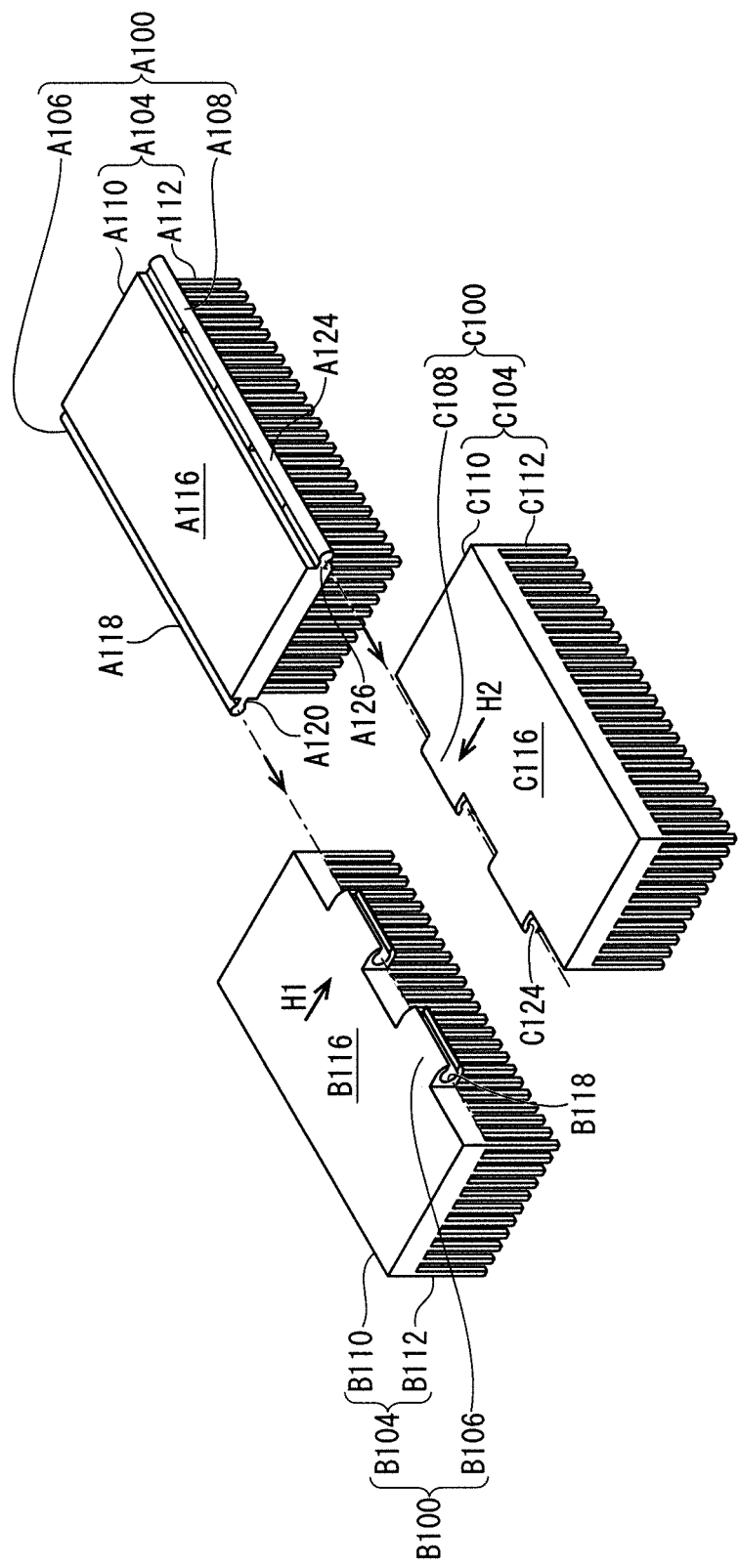
FIG. 1 schematically shows assembling of a cooling device according to a first embodiment.
Figure 2:
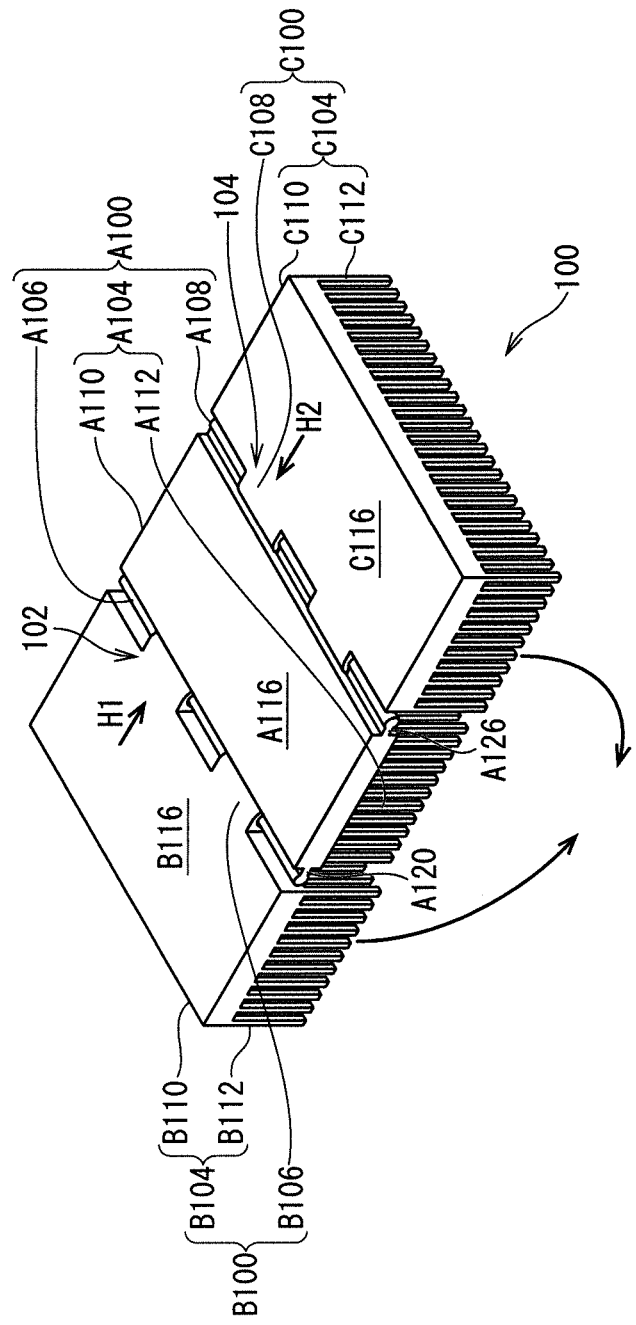
FIG. 2 schematically shows assembling of the cooling device according to the first embodiment.
Figure 3:
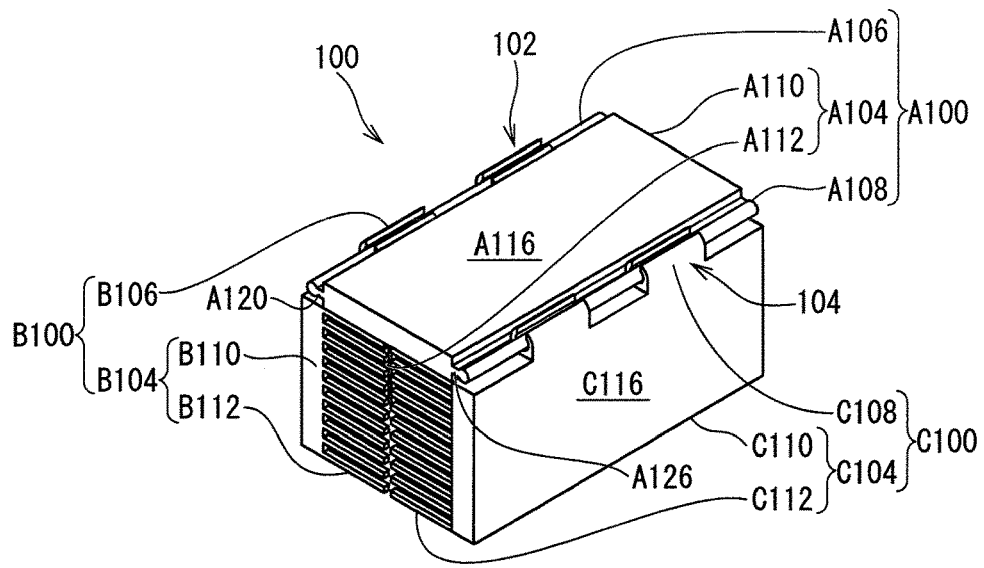
FIG. 3 schematically shows assembling of the cooling device according to the first embodiment.
Figure 4:
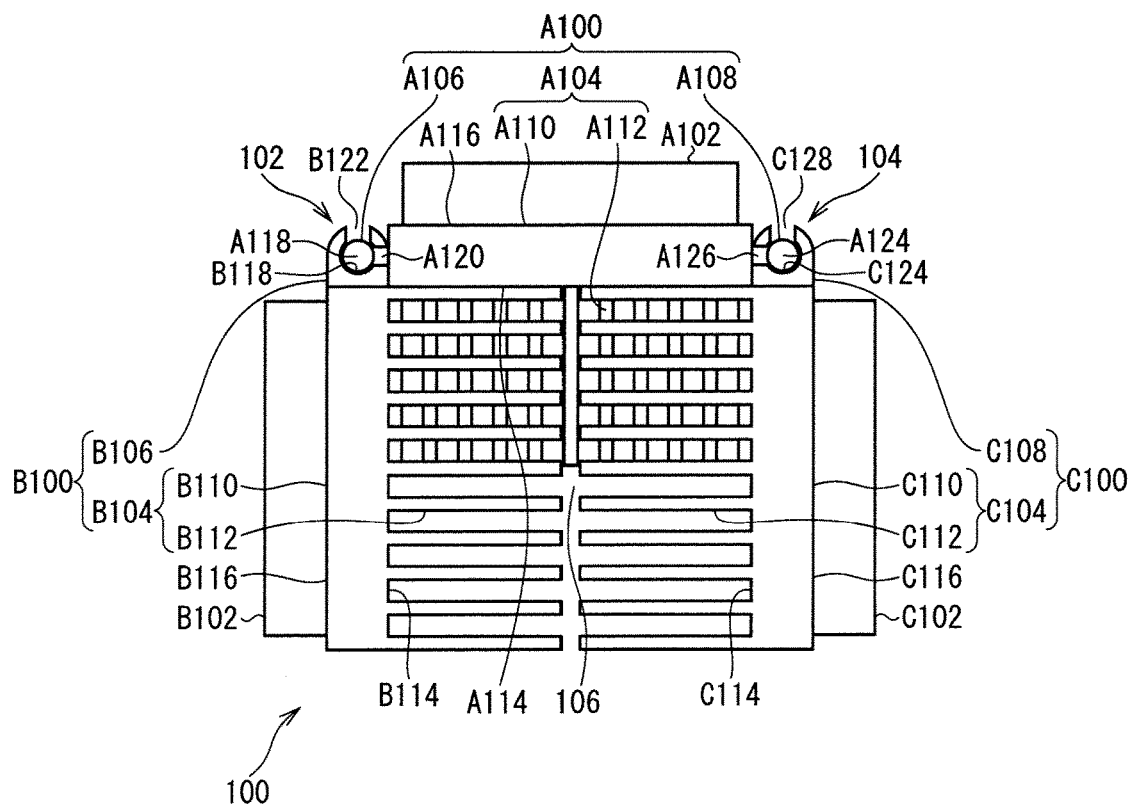
FIG. 4 schematically shows assembling of the cooling device according to the first embodiment.

FIGS. 1 to 4 schematically show assembling of a cooling device 100 according to the first embodiment. FIGS. 1, 2, and 3 are perspective views. FIG. 4 is a front view.

The cooling device 100 in a semi-finished state illustrated in FIG. 2 is assembled by coupling a cooler A100, a cooler B100, and a cooler C100 illustrated in FIG. 1. The cooling device 100 in a finished state illustrated in FIGS. 3 and 4 is assembled by rotary assembling of the cooling device 100 in a semi-finished state illustrated in FIG. 2.

The cooling device 100 in a finished state illustrated in FIGS. 3 and 4 is incorporated into a device such as an electric device or an electronic device. The cooling device 100 in a finished state is used for cooling a heating component A102, a heating component B102, and a heating component C102 such as a semiconductor device, an electric component, or an electronic component provided in the device in which the cooling device 100 is incorporated.

1.3 Configuration of Cooling Device

The cooling device 100 illustrated in FIGS. 2, 3, and 4 includes the coolers A100, B100, and C100. The cooling device 100 may include an element other than these elements. The coolers A100, B100, and C100 are coupled. Thus, the coolers A100, B100, and C100 form a three-strand cooler. Three coolers including the coolers A100, B100, and C100 may be replaced with two coolers, or four or more coolers. Namely, the three-strand cooler may be replaced with a two-strand cooler or replaced with a cooler of four strands or more. The coolers A100, B100, and C100 are also called heat sinks or radiators, for example.

The cooler A100 includes a cooler body A104, a male fitting part A106, and a male fitting part A108. The cooler A100 may include an element other than these elements. The cooler B100 includes a cooler body B104 and a female fitting part B106. The cooler B100 may include an element other than these elements. The cooler C100 includes a cooler body C104 and a female fitting part C108. The cooler C100 may include an element other than these elements. The male fitting part A106 and the female fitting part B106 may be switched to each other. The male fitting part A108 and the female fitting part C108 may be switched to each other.

The cooler body A104 includes a base plate A110 and blades A112. The cooler body A104 may include an element other than these elements. The cooler body B104 includes a base plate B110 and blades B112. The cooler body B104 may include an element other than these elements. The cooler body C104 includes a base plate C110 and blades C112. The cooler body C104 may include an element other than these elements. The blades A112, B112, and C112 are also called fins, etc.

The blades A112, B112, and C112 each have a pin-like shape. Desirably, the blades A112, B112, and C112 each have a square columnar shape of a thickness of equal to or greater than 0.8 mm square, or a circular columnar shape having a diameter of equal to or greater than 0.8 mm. The shape of each of the blades A112, B112, and C112 thinner than these shapes tends to cause insufficient cooling performance of the coolers A100, B100, and C100. Desirably, respective pitches of the blades A112, B112, and C112 are equal to or greater than 1.6 mm.

The base plates A110, B110, and C110 have blade coupling surfaces A114, B114, and C114 respectively. The blades A112, B112, and C112 are coupled to the blade coupling surfaces A114, B114, and C114 respectively. Each of the blade coupling surfaces A114, B114, and C114 forms one main surface of a corresponding one of the base plates A110, B110, and C110.

The base plates A110, B110, and C110 have component mounting surfaces A116, B116, and C116 respectively. Heating components A102, B102, and C102 are mounted on the component mounting surfaces A116, B116, and C116 respectively. Each of the component mounting surfaces A116, B116, and C116 forms the other main surface of a corresponding one of the base plates A110, B110, and C110.

The heating components A102, B102, and C102 generate heat. The heating components A102, B102, and C102 are semiconductor devices, electric components, or electronic components, for example. The semiconductor devices are power semiconductors or integrated circuits (ICs) to cause large power consumption, for example. The electric components and the electronic components are reactors, transformers, power relays, cement resistors, or electrolytic capacitors, for example. The power semiconductors are power modules, insulated gate bipolar transistors (IGBTs), metal-oxide semiconductor field-effect transistors (MOS-FETs), or diodes, for example, The ICs are processors, field-programmable gate arrays (FPGAs), or digital signal processors (DSPs), for example. In the absence of a cooler or a cooling fan at the power semiconductor, the power semiconductor is not cooled sufficiently. Hence, the power semiconductor may be placed at a temperature exceeding its heatproof temperature, and this may cause breakdown of the power semiconductor in the worst case. For this reason, the power semiconductor is generally cooled by a cooler or a cooling fan, for example.

Heat generated by the heating component A102 passes through the base plate A110 and the blades A112 sequentially to be released into the air. Heat generated by the heating component B102 passes through the base plate B110 and the blades B112 sequentially to be released into the air. Heat generated by the heating component C102 passes through the base plate C110 and the blades C112 sequentially to be released into the air. In this way, the heating components A102, B102, and C102 are cooled by the cooler bodies A104, B104, and C104 respectively.

The cooling device 100 includes a mounted component other than the heating components A102, B102, and C102. The mounted component is a control substrate or device, for example. A wire for electrically connecting such mounted components is coupled to these components mounted on the cooling device 100. The wire is coupled to the mounted components with a connector, for example.

The male fitting part A106 is coupled to one end of the base plate A110. The male fitting part A108 is coupled to the other end of the base plate A110. The female fitting part B106 is coupled to one end of the base plate B110. The female fitting part C108 is coupled to one end of the base plate C110. An additional female fitting part may be coupled to the other end of the base plate B110. An additional female fitting part may be coupled to the other end of the base plate C110.

Regarding the coolers A100, B100, and C100 illustrated in FIG. 1, the female fitting part B106 is not fitted to the male fitting part A106 so the cooler B100 is not coupled to the cooler A100. Further, the female fitting part C108 is not fitted to the male fitting part A108 so the cooler C100 is not coupled to the cooler A100. Regarding the cooling device 100 illustrated in FIGS. 2, 3, and 4, the female fitting part B106 is fitted to the male fitting part A106 so the cooler B100 is coupled to the cooler A100. Further, the female fitting part C108 is fitted to the male fitting part A108 so the cooler C100 is coupled to the cooler A100.

The cooling device 100 in a semi-finished state illustrated in FIG. 2 has a flat configuration. In the cooling device 100 in a semi-finished state, the component mounting surfaces A116 and B116 are pointed to the same direction. Further, the component mounting surfaces A116 and C116 are pointed to the same direction. In the cooling device 100 in a semi-finished state, the component mounting surfaces A116, B116, and C116 form the same plane.

The cooling device 100 in a finished state illustrated in FIGS. 3 and 4 has a stereoscopic configuration. In the cooling device 100 in a finished state, the component mounting surfaces A116 and B116 are pointed to directions differing from each other by 90°. Further, the component mounting surfaces A116 and C116 are pointed to directions differing from each other by 90°. The angle of 90° may be changed to a different angle. In the cooling device 100 in a finished state, the blades B112 get into gaps between the blades A112 and do not interfere with the blades A112. Further, the blades C112 get into gaps between the blades A112 and do not interfere with the blades A112. The blades C112 do not get into gaps between the blades B112. Further, the blades B112 do not get into gaps between the blades C112.

A rotary mechanism 102 includes the male fitting part A106 and the female fitting part B106. The male fitting part A106 is coupled to the cooler body A104 as one of the cooler bodies A104 and B104. The female fitting part B106 is coupled to the cooler body B104 as the other of the cooler bodies A104 and B104. If the male fitting part A106 and the female fitting part B106 are switched to each other, the cooler body B104 corresponds to the one cooler body to which the male fitting part A106 is coupled. Further, the cooler body A104 corresponds to the other cooler body to which the female fitting part B106 is coupled. The female fitting part B106 is fitted to the male fitting part A106. By doing so, the rotary mechanism 102 becomes functional to connect the cooler body B104 to the cooler body A104, thereby coupling the cooler B100 to the cooler A100. The female fitting part B106 is rotatable relative to the male fitting part A106 while maintained fitted to the male fitting part A106. By doing so, while the cooler body B104 is maintained connected to the cooler body A104, the rotary mechanism 102 becomes functional to allow the cooler body B104 to rotate relative to the cooler body A104 between a state in which the component mounting surfaces A116 and B116 are pointed to the same direction and a state in which the blades B112 get into gaps between the blades A112 without interfering with the blades A112. The rotary mechanism 102 may be replaced with a rotary mechanism having a different configuration.

Likewise, a rotary mechanism 104 includes the male fitting part A108 and the female fitting part C108. The male fitting part A108 is coupled to the cooler body A104 as one of the cooler bodies A104 and C104. The female fitting part C108 is coupled to the cooler body C104 as the other of the cooler bodies A104 and C104. If the male fitting part A108 and the female fitting part C108 are switched to each other, the cooler body C104 corresponds to the one cooler body to which the male fitting part A108 is coupled. Further, the cooler body A104 corresponds to the other cooler body to which the female fitting part C108 is coupled. The female fitting part C108 is fitted to the male fitting part A108. By doing so, the rotary mechanism 104 becomes functional to connect the cooler body C104 to the cooler body A104, thereby coupling the cooler C100 to the cooler A100. The female fitting part C108 is rotatable relative to the male fitting part A108 while maintained fitted to the male fitting part A108. By doing so, while the cooler body C104 is maintained connected to the cooler body A104, the rotary mechanism 104 becomes functional to allow the cooler body C104 to rotate relative to the cooler body A104 between a state in which the component mounting surfaces A116 and C116 are pointed to the same direction and a state in which the blades C112 get into gaps between the blades A112 without interfering with the blades A112. The rotary mechanism 104 may be replaced with a rotary mechanism having a different configuration.

The male fitting part A106 includes a shaft A118 and a connector A120. The connector A120 connects the shaft A118 and the cooler body A104. The female fitting part B106 includes a shaft hole B118 and a cutout B122. The shaft A118 is housed in the shaft hole B118. The shaft A118 is rotatable inside the shaft hole B118. This makes the female fitting part B106 rotatable relative to the male fitting part A106. The cutout B122 extends from the shaft hole B118 to reach a surface of the female fitting part B106. The cutout B122 is arranged in a horizontal direction H1 as viewed from the shaft hole B118. The horizontal direction H1 is a direction vertical to both a direction in which the component mounting surface B116 is pointed and a direction in which the shaft hole B118 extends.

Likewise, the male fitting part A108 includes a shaft A124 and a connector A126. The connector A126 connects the shaft A124 and the cooler body A104. The female fitting part C108 includes a shaft hole C124 and a cutout C128. The shaft A124 is housed in the shaft hole C124. The shaft A124 is rotatable inside the shaft hole C124.

This makes the female fitting part C108 rotatable relative to the male fitting part A108. The cutout B128 extends from the shaft hole C124 to reach a surface of the female fitting part C108. The cutout C128 is arranged in a horizontal direction H2 as viewed from the shaft hole C124. The horizontal direction H2 is a direction vertical to both a direction in which the component mounting surface C116 is pointed and a direction in which the shaft hole C124 extends.

The shafts A118 and A124 both have circular cross-sectional shapes as viewed from directions in which the shafts A118 and A124 extend respectively. The shaft holes B118 and C124 both have circular cross-sectional shapes as viewed from directions in which the shaft holes B118 and C124 extend respectively. The shaft holes B118 and C124 have cross-sectional shapes conforming to the cross-sectional shapes of the shafts A118 and A124 respectively. The cutout B122 is arranged in such a manner as not to generate offset from the center of the shaft hole B118 as viewed in the direction in which the component mounting surface B116 is pointed. The cutout C128 is arranged in such a manner as not to generate offset from the center of the shaft hole C124 as viewed in the direction in which the component mounting surface C116 is pointed.

The male fitting part A106 includes two shafts A118 and the female fitting part B106 includes two shaft holes B118. By doing so, the cooler B100 is connected to the cooler A100 at two joints. This makes it possible to ensure strength at each of the joints. If the cooler B100 is connected to the cooler A100 at three or more joints, strength can also be ensured at each of the joints.

Likewise, the male fitting part A108 includes two shafts A124 and the female fitting part C108 includes two shaft holes C124. By doing so, the cooler C100 is connected to the cooler A100 at two joints. This makes it possible to ensure strength at each of the joints. If the cooler C100 is connected to the cooler A100 at three or more joints, strength can also be ensured at each of the joints.

The cooling device 100 in a finished state has an air passage 106. The air passage 106 is used for forced air cooling or natural air cooling. Cooling air flows in the air passage 106. The air passage 106 is provided inside the cooling device 100 in a finished state. Three sides of the air passage 106 are surrounded by the coolers A100, B100, and C100. The blades A112, B112, and C112 are arranged inside the cooling device 100 in a finished state and inside the air passage 106. In this arrangement, cooling air flowing in the air passage 106 hits the blades A112, B112, and C112 to efficiently remove heat released into the air via the blades A112, B112, and C112. For forced air cooling, a cooling fan is provided to generate cooling air to flow in the air passage 106.

The blades A112 coupled to the base plate A110 may include a coupled blade on one end in a region along a boundary between the base plate A110 and the male fitting part A106, and a coupled blade on the other end in a region along a boundary between the base plate A110 and the male fitting part A108. In this case, when the coolers B100 and C100 rotate 90° relative to the cooler A100, the coolers B100 and C100 abut on the blade on the one end and the blade on the other end respectively. This makes it possible to easily fix the angles of rotations of the coolers B100 and C100 relative to the cooler A100 at 90°. The blade on the one end and the blade on the other end may have shapes different from the shapes of the other blades of the blades A112.

Likewise, the blades B112 coupled to the base plate B110 may include a coupled blade in a region along a boundary between the base plate B110 and the female fitting part B106. This blade may have a shape different from the shapes of the other blades of the blades B112. The blades C112 coupled to the base plates C110 may include a coupled blade in a region along a boundary between the base plate C110 and the female fitting part C108. This blade may have a shape different from the shapes of the other blades of the blades C112.

As described above, in the first embodiment, the cooling device 100 in a finished state has a stereoscopic configuration. The blades A112, B112, and C112 are arranged inside the cooling device 100 in a finished state. Thus, while the cooling device 100 in a finished state includes the coolers A100, B100, and C100 coupled to each other, size reduction of the cooling device 100 in a finished state is still achieved.

In the first embodiment, the blades A112, B112, and C112 are arranged inside the cooling device 100 in a finished state. Thus, a radiator unit including the blades A112, a radiator unit including the blades B112, and a radiator unit including the blades C112 are centralized in one place. This can form one cooling fan for cooling the heating components A102, B102, and C102 uniformly to improve the cooling performance of the cooling device 100.

Achieving cooling of the heating components A102, B102, and C102 using one cooling fan encourages reduction in initial cost of manufacturing the cooling device 100. The cooling fan is a component having lifetime requiring regular maintenance. Thus, achieving cooling of the heating components A102, B102, and C102 using one cooling fan encourages reduction in parts to be changed during maintenance and reduction in cost for changing parts during maintenance.

1.4 Method of Manufacturing Cooling Device

An exemplary method of manufacturing the cooling device 100 will be described below. According to the exemplary method of manufacturing the cooling device 100 described below, extruded coolers A130, B130, and C130 having basic shapes are formed by extrusion. Machining is performed on the resultant extruded coolers A130, B130, and C130. As a result, the coolers A100, B100, and C100 illustrated in FIG. 1 are formed. All or some of steps of the exemplary method of manufacturing the cooling device 100 described below may be replaced with different steps.

Figure 5A:
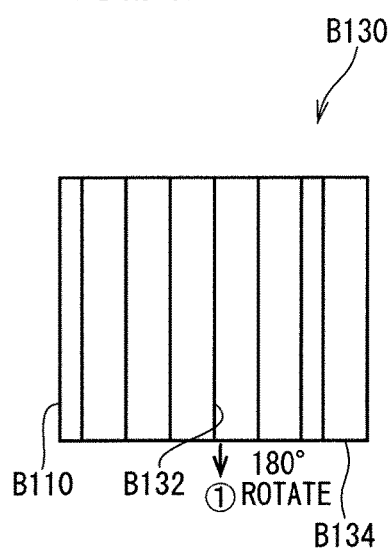
FIGS. 5A to 5F schematically show formation of an extruded cooler during manufacture of the cooling device according to the first embodiment.
Figure 5B:
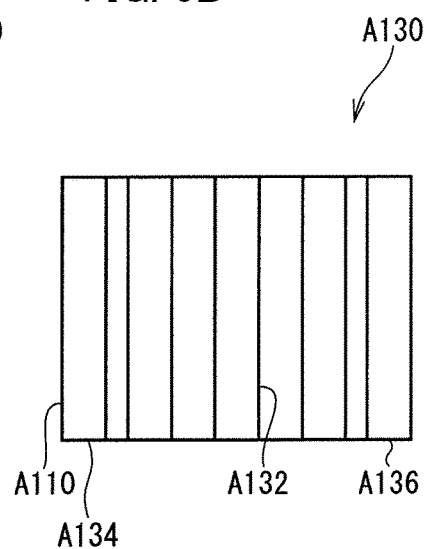
Figure 5C:
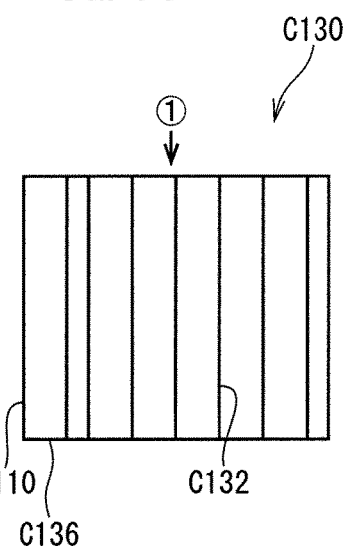
Figure 5D:
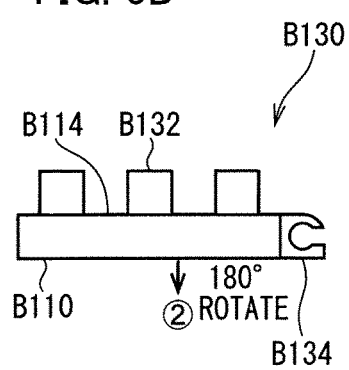
Figure 5E:
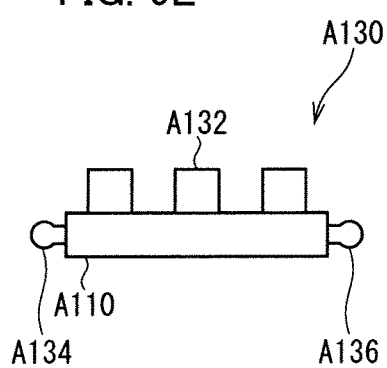
Figure 5F:
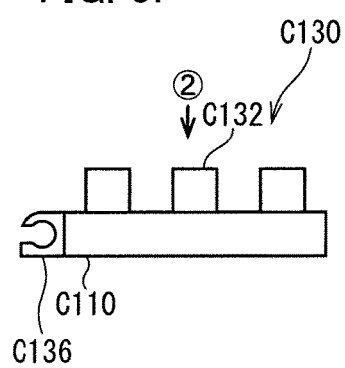
Figure 6A:
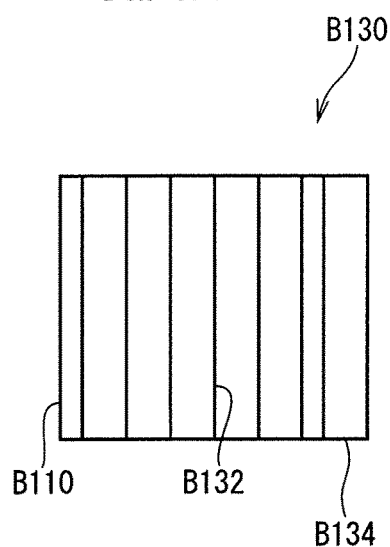
FIGS. 6A to 6F schematically illustrate the extruded cooler formed during manufacture of the cooling device according to the first embodiment.
Figure 6B:
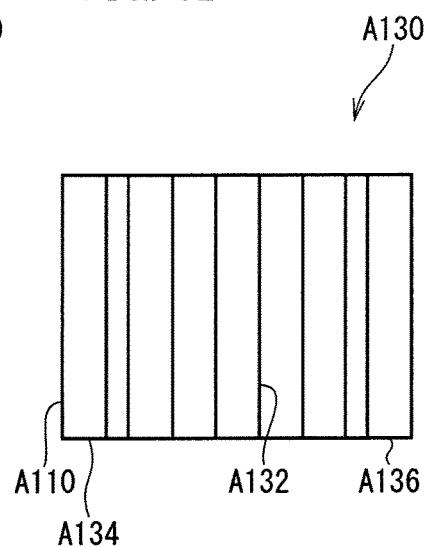
Figure 6C:
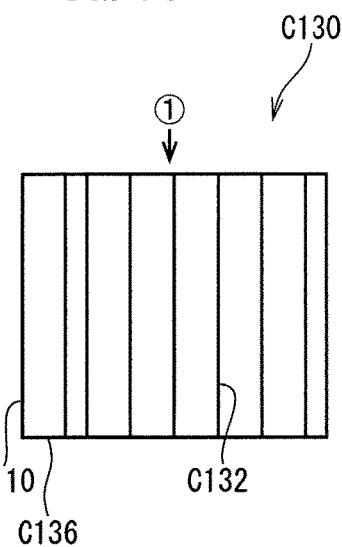
Figure 6D:
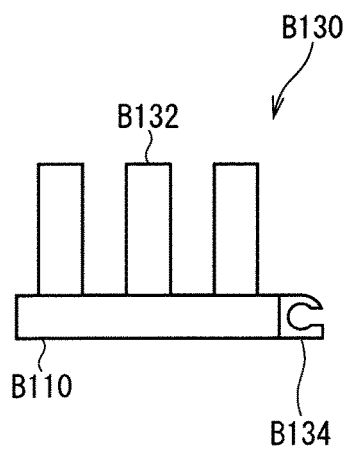
Figure 6E:
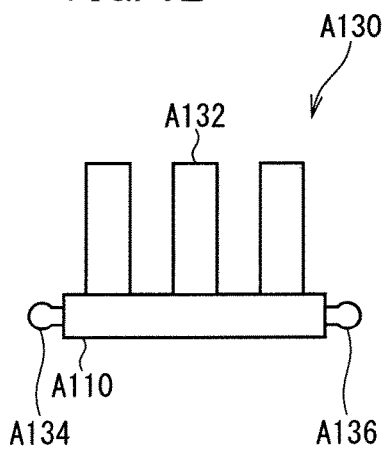
Figure 6F:
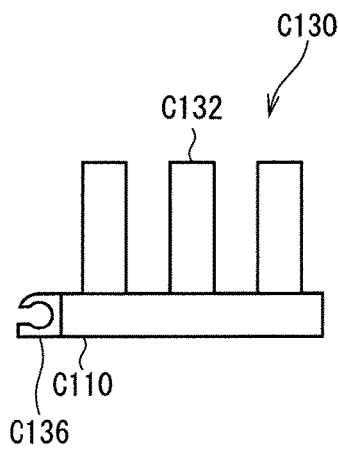

FIGS. 5A to 5F schematically show formation of the extruded coolers A130, B130, and C130 during manufacture of the cooling device 100 according to the first embodiment. FIGS. 5A, 5B, and 5C are top views. FIGS. 5D, 5E, and 5F are front views. FIGS. 6A to 6F schematically illustrate the extruded coolers A130, B130, and C130 formed during manufacture of the cooling device 100 according to the first embodiment. FIGS. 6A, 6B, and 6C are top views. FIGS. 6D, 6E, and 6F are front views.

During manufacture of the cooling device 100, the extruded cooler A130 illustrated in FIGS. 5B and 5E is formed by extrusion. The resultant extruded cooler A130 becomes the extruded cooler A130 illustrated in FIGS. 6B and 6E. Further, two extruded coolers having the same shape are formed by extrusion. One of the two resultant extruded coolers corresponds to the extruded cooler B130 illustrated in FIGS. 5A and 5D. The one of the two resultant extruded coolers becomes the extruded cooler B130 illustrated in FIGS. 6A and 6D. The other one of the two resultant extruded coolers is rotated 180° as viewed from a direction in which the blade coupling surface B114 is pointed. As a result, the extruded cooler C130 illustrated in FIGS. 5C and 5F is obtained. The resultant extruded cooler C130 becomes the extruded cooler C130 illustrated in FIGS. 6C and 6F. The resultant extruded coolers A130, B130, and C130 become intermediary products of the coolers A100, B100, and C100 respectively.

The extruded cooler A130 includes the base plate A110, extruded blades A132, an extruded male fitting part A134, and an extruded male fitting part A136. The extruded cooler B130 includes the base plate B110, extruded blades B132, and an extruded female fitting part B134. The extruded cooler C130 includes the base plate C110, extruded blades C132, and an extruded female fitting part C136. The extruded blades A132, B132, and C132 each have a shape like a flat plate obtainable by extrusion. The base plate A110 has one end to which the extruded male fitting part A134 is coupled. The base plate A110 has the other end to which the extruded male fitting part A136 is coupled. The base plate B110 has one end to which the extruded female fitting part B134 is coupled. If an additional female fitting part is coupled to the other end of the base plate B110 as described above, an additional extruded female fitting part is coupled to the other end of the base plate B110. The base plate C110 has one end to which the extruded female fitting part C136 is coupled. If an additional female fitting part is coupled to the other end of the base plate C110 as described above, an additional extruded female fitting part is coupled to the other end of the base plate C110.

The extruded coolers A130, B130, and C130 are desirably made of aluminum or aluminum alloy. In comparison to a material other than aluminum and aluminum alloy, aluminum and aluminum alloy are available in much quantities and have advantage in terms of cost. However, the extruded coolers A130, B130, and C130 may be made of a material other than aluminum and aluminum alloy.

The cooler B100 is to be arranged on one side of the cooler A100, so that the female fitting part B106 is coupled to the other side of the base plate B110. The cooler C100 is to be arranged on the other side of the cooler A100, so that the female fitting part C108 is coupled to one side of the base plate C110. For this reason, the extruded female fitting part B134 is coupled to the other side of the base plate B110. Further, the extruded female fitting part C136 is coupled to the one side of the base plate C110. This seemingly indicates that forming the extruded coolers B130 and C130 by extrusion requires two types of molds including a mold for extrusion for the extruded cooler B130 and a mold for extrusion for the extruded cooler C130. In this regard, however, the extruded cooler C130 is obtained by rotating the extruded cooler B130 180° as viewed from a direction in which the blade coupling surface B114 is pointed. This means that only one type of mold for extrusion is sufficient for forming the extruded cooler B130 and the extruded cooler C130 by the extrusion.

1.5 Pin Working on Extruded Blade

Figure 7A:
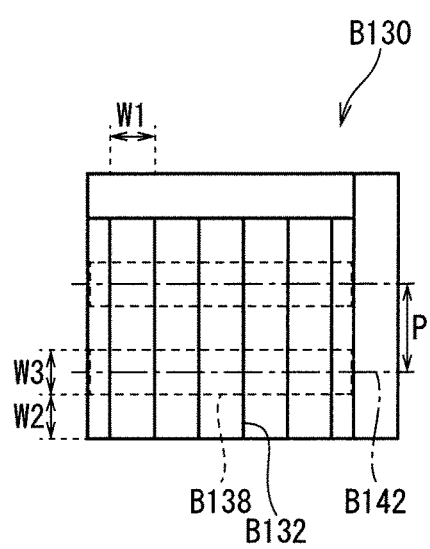
FIGS. 7A to 7C are top views schematically showing pin working on an extruded blade during manufacture of the cooling device according to the first embodiment.
Figure 7B:
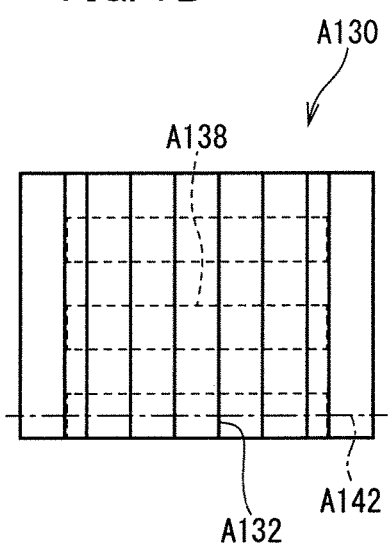
Figure 7C:
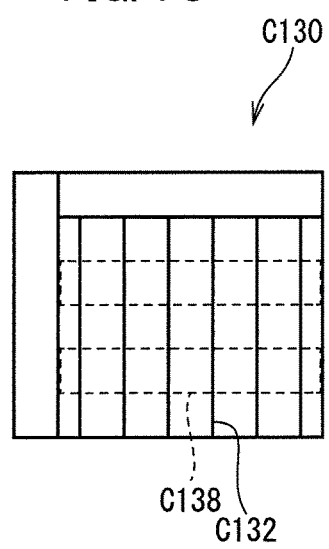

FIGS. 7A to 7C are top views schematically showing pin working on the extruded blades A132, B132, and C132 during manufacture of the cooling device 100 according to the first embodiment.

After the extruded blades A132, B132, and C132 illustrated in FIGS. 7B, 7A, and 7C respectively are prepared, the extruded blades A132, B132, and C132 are subjected to pin working.

For implementation of pin working on the extruded blades A132, B132, and C132, cutting is performed to cut regions A138, B138, and C138 respectively with a cutter. As a result, the blades A112, B112, and C112 having pin-like shapes are formed. Then, pin-worked coolers A140, B140, and C140 including the blades A112, B112, and C112 respectively are formed (FIGS. 8A to 8E).

Desirably, the blades A112, B112, and C112 each have a square columnar shape of a thickness of equal to or greater than 0.8 mm square. The shape of each of the blades A112, B112, and C112 thinner than this shape tends to cause insufficient cooling performance of the coolers A100, B100, and C100, as described above. Such a shape also tends to cause difficulty in the cutting. A width w1 of each of the extruded blades A132, B132, and C132 formed by the extrusion, and a width w2 of each of the blades A112, B112, and C112 formed by the pin working, are determined in such a manner as to form each of the blades A112, B112, and C112 into a square columnar shape of a thickness of equal to or greater than 0.8 mm square. The width w1 is 1.0 mm, for example. The pin width 2 is 0.9 mm, for example. If the width w1 is set at 1.0 mm and the width w2 is set at 0.9 mm, setting for working is employed under which a cutting width w3 for the cutting is set at 1.1 mm, a pitch P for the cutting is set at 2.0 mm, and a value of shift between a start position B142 of the cutting on the extruded blades B132 and C132 and a start position A142 of the cutting on the extruded blades A132 is set at 1.0 mm. By doing so, the pin working is performed in such a manner as to prevent the blades B112 and C112 from interfering with the blades A112 and as to make the blades C112 and B112 face each other.

If the blades A112, B112, and C112 each having a pin-like shape are formed by cutting, each of the blades A112, B112, and C112 is given a sharp edge at a corner to increase a turbulent flow and a burble flow starting from the corner. As a result, heat resistance is reduced in the coolers A100, B100, and C100. If the blades A112, B112, and C112 each having a pin-like shape are formed by precision casting, an edge at a corner is unlikely to be sharpened as a result of demolding.

Figure 8A:
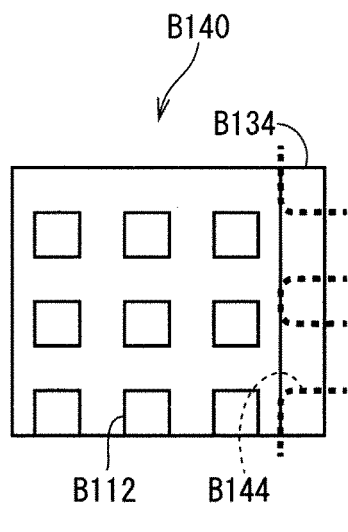
FIGS. 8A to 8E are top views schematically showing additional working on an extruded male fitting part and an extruded female fitting part during manufacture of the cooling device according to the first embodiment.
Figure 8B:
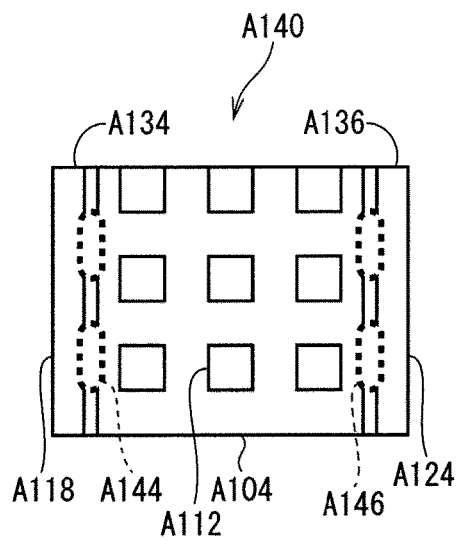
Figure 8C:
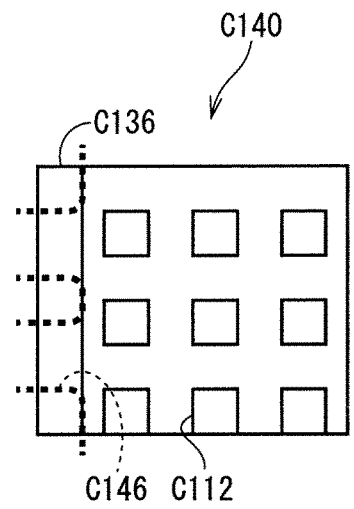
Figure 8D:
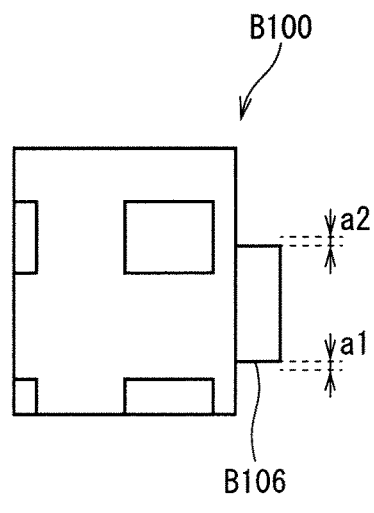
Figure 8E:
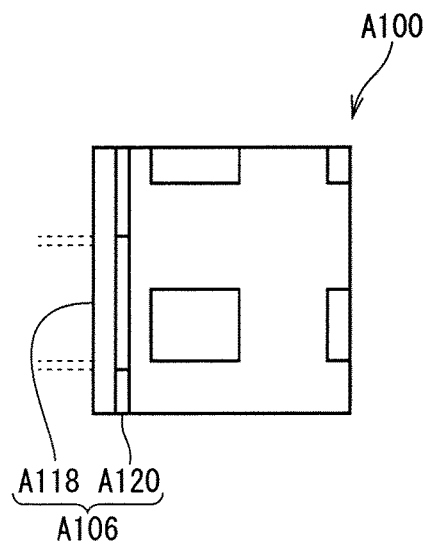

1.6 Additional Working on Extruded Male Fitting Part and Extruded Female Fitting Part FIGS. 8A to 8E are top views schematically showing additional working on the extruded male fitting part A134, the extruded male fitting part A136, the extruded female fitting part B134, and the extruded female fitting part C136 during manufacture of the cooling device 100 according to the first embodiment. FIGS. 8A, 8B, and 8C are top views. FIGS. 8E and 8D are enlarged top views.

After formation of the pin-worked cooler A140, the pin-worked cooler B140, and the pin-worked cooler C140 illustrated in FIGS. 8B, 8A, and 8C respectively, additional working is performed on the extruded male fitting part A134, the extruded male fitting part A136, the extruded female fitting part B134, and the extruded female fitting part C136. The additional working on the extruded male fitting part A134, the extruded male fitting part A136, the extruded female fitting part B134, and the extruded female fitting part C136 may be performed before implementation of the pin working on the extruded blades A132, B132, and C132.

For implementation of the additional working on the extruded male fitting part A134, the extruded male fitting part A136, the extruded female fitting part B134, and the extruded female fitting part C136, the extruded male fitting parts A134 and A136 are subjected to boring. Further, the extruded female fitting parts B134 and C136 are subjected to cutting out.

For implementation of boring on the extruded male fitting part A134, the extruded male fitting part A134 is removed in a region A144 to remove a portion caught between the shaft A118 and the cooler body A104. By doing so, the shaft A118 and the connector A120 remain unremoved to form the male fitting part A106 including the shaft A118 and the connector A120.

Likewise, for implementation of boring on the extruded male fitting part A136, the extruded male fitting part A136 is removed in a region A146 to remove a portion caught between the shaft A124 and the cooler body A104. By doing so, the shaft A124 and the connector A126 remain unremoved to form the male fitting part A108 including the shaft A124 and the connector A126.

As a result of the foregoing, the cooler A100 including the male fitting parts A106 and A108 is formed.

For cutting out in the extruded female fitting part B134, a portion along a cutting line B144 is removed. By doing so, the female fitting part B106 remains unremoved to form the female fitting part B106.

Likewise, for cutting out in the extruded female fitting part C136, a portion along a cutting line C146 is removed. By doing so, the female fitting part C108 remains unremoved to form the female fitting part C108.

As a result of the foregoing, the cooler B100 including the female fitting parts B106 and the cooler C100 including the female fitting parts C108 are formed.

The resultant female fitting parts B106 and C108 are fitted to the shafts A118 and A124 respectively during coupling of the coolers B100 and C100 to the cooler A100 to get into the holes formed by the boring. This allows the female fitting parts B106 and C108 to rotate 90° relative to the male fitting parts A106 and A108 respectively.

A play a1 and a play a2 exist between the female fitting part B106 and the connector A120 of the male fitting part A106, and between the female fitting part C108 and the connector A126 of the male fitting part A108. The plays a1 and a2 are determined in such a manner as to prevent interference of the blades B112 and C112 with the blades A112. A total of the plays a1 and a2 is 0.05 mm, for example. With the pin width w2 set at 0.9 mm, and the precision of the male fitting parts A106 and A108 relative to the blades A112, the precision of the female fitting part B106 relative to the blades B112, and the precision of the female fitting part C108 relative to the blades C112 set at plus or minus 0.05 mm, setting a total of the plays a1 and a2 at 0.05 mm allows assembling of the cooling device 100 in which the coolers B100 and C100 are rotatable relative to the cooler A100 only in a state in which the blades B112 and C112 do not interfere with the blades A112.

1.7 Coupling Between Coolers

FIGS. 9A to 9D are top views schematically showing coupling between the coolers A100, B100, and C100 during manufacture of the cooling device 100 according to the first embodiment.

Figure 9A:
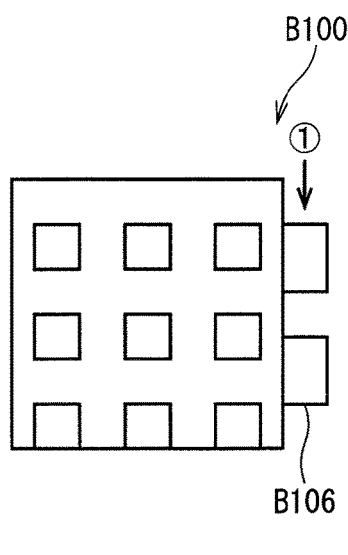
FIGS. 9A to 9D are top views schematically showing coupling between coolers during manufacture of the cooling device according to the first embodiment.
Figure 9B:
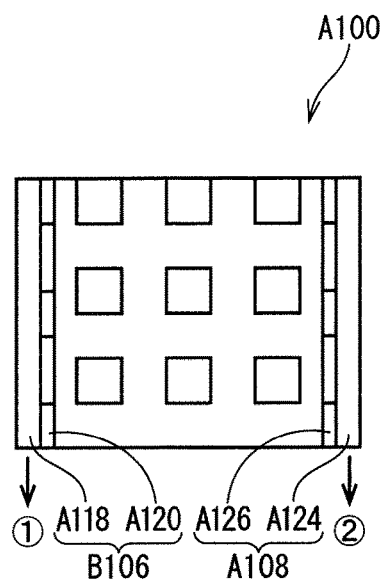
Figure 9C:
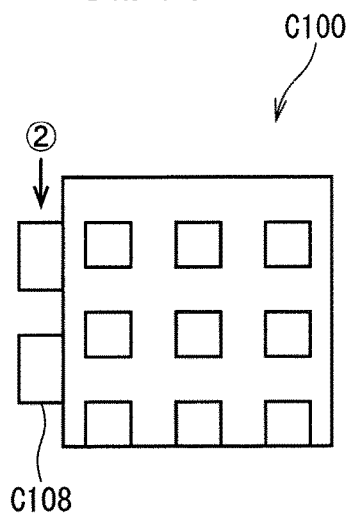
Figure 9D:
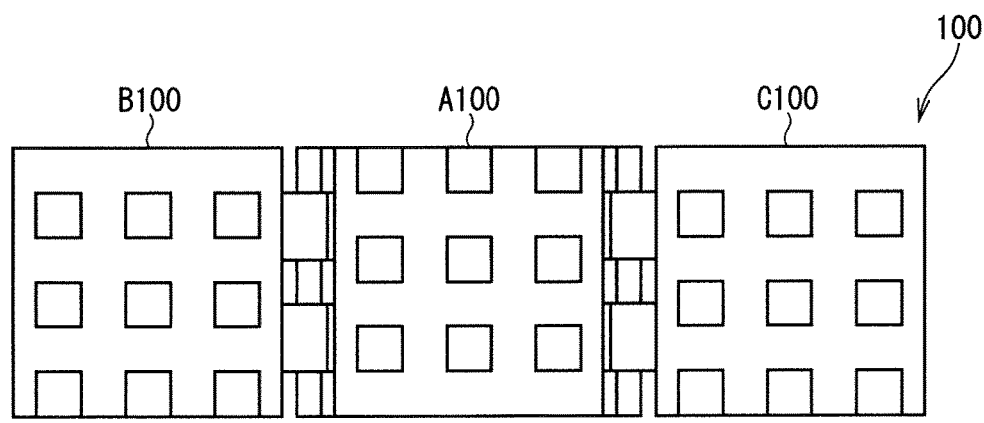

After formation of the coolers A100, B100, and C100 illustrated in FIGS. 9B, 9A, and 9C respectively, the coolers A100, B100, and C100 are coupled. As a result, the cooling device 100 in a semi-finished state illustrated in FIG. 9D is assembled.

For coupling of the cooler B100 to the cooler A100, the shaft A118 is placed on the center axis of the shaft hole B118 of the female fitting part B106, moved toward the shaft hole B118, and inserted into the shaft hole B118 (see FIG. 4). By doing so, the female fitting part B106 is fitted to the male fitting part A106 to couple the cooler B100 to the cooler A100.

Likewise, for coupling of the cooler C100 to the cooler A100, the shaft A124 is placed on the center axis of the shaft hole C124 of the female fitting part C108, moved toward the shaft hole C124, and inserted into the shaft hole C124 (see FIG. 4). By doing so, the female fitting part C108 is fitted to the male fitting part A108 to couple the cooler C100 to the cooler A100.

During insertion of the shaft A118 into the shaft hole B118, the connector A120 passes through the cutout B122 of the female fitting part B106 (see FIG. 4). As described above, the cutout B122 is arranged in the horizontal direction H1 as viewed from the shaft hole B118 (see FIG. 1).

Thus, the work of inserting the shaft A118 into the shaft hole B118 can be done by causing the male fitting part A106 to slide toward the female fitting part B106 while the coolers A100 and B100 are placed horizontally.

Likewise, during insertion of the shaft A124 into the shaft hole C124, the connector A126 passes through the cutout C128 of the female fitting part C108 (see FIG. 4). As described above, the cutout C128 is arranged in the horizontal direction H2 as viewed from the shaft hole C124 (see FIG. 1). Thus, the work of inserting the shaft A124 into the shaft hole C124 during coupling of the cooler C100 to the cooler A100 can be done by causing the male fitting part A108 to slide toward the female fitting part C108 while the coolers A100 and C100 are placed horizontally.

In the cooling device 100 in a semi-finished state, the coolers A100, B100, and C100 are arranged in a planar pattern to align the coolers A100, B100, and C100.

Figure 10A:
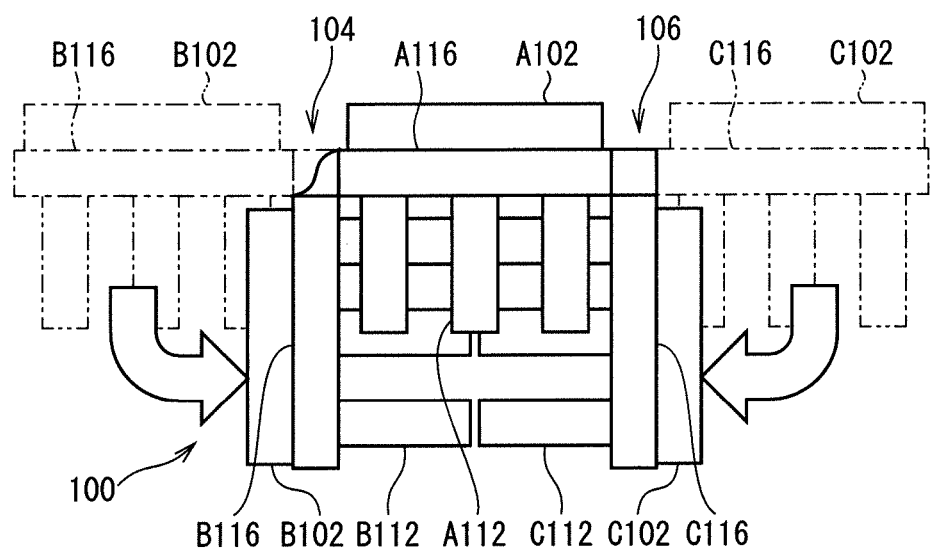
FIGS. 10A and 10B schematically show mounting of a heating component and assembling of the cooling device in a finished state during manufacture of the cooling device according to the first embodiment.
Figure 10B:
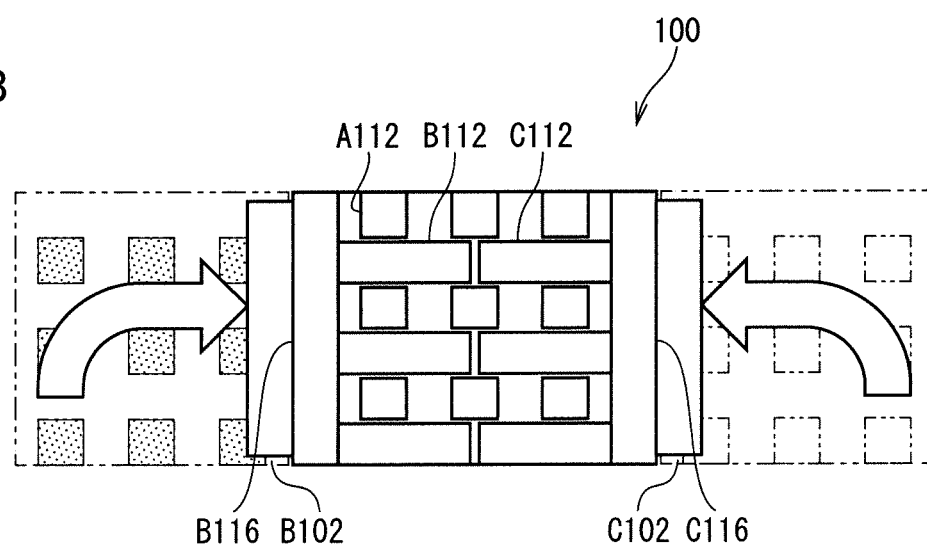
Figure 11A:
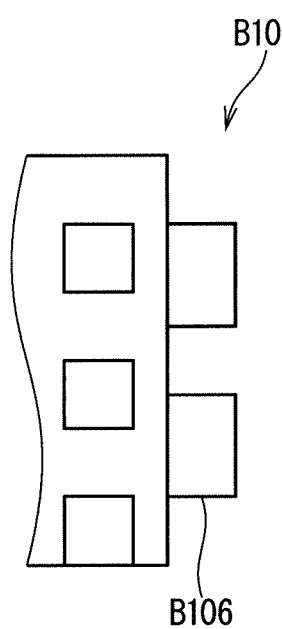
FIGS. 11A to 11D schematically show mounting of the heating component and assembling of the cooling device in a finished state during manufacture of the cooling device according to the first embodiment.
Figure 11B:
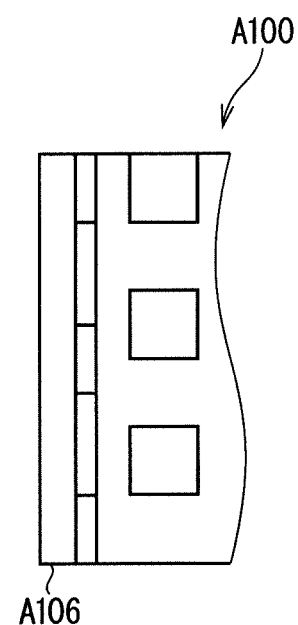
Figure 11C:
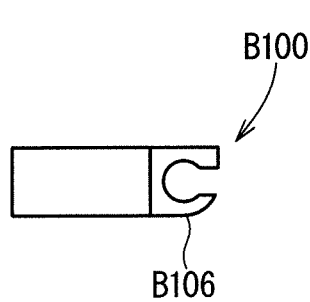
Figure 11D:
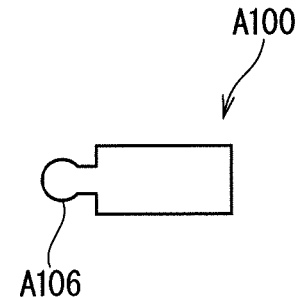
Figure 12A:
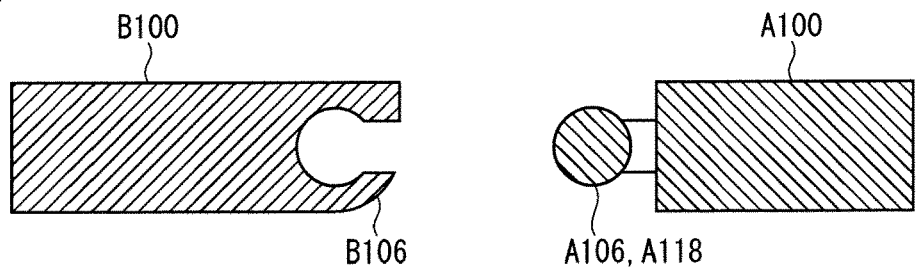
FIGS. 12A to 12D schematically show mounting of the heating component and assembling of the cooling device in a finished state during manufacture of the cooling device according to the first embodiment.
Figure 12B:
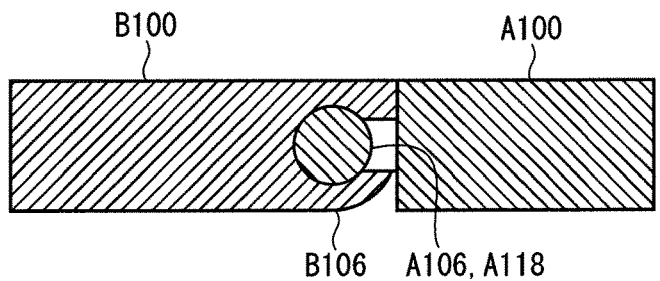
Figure 12C:
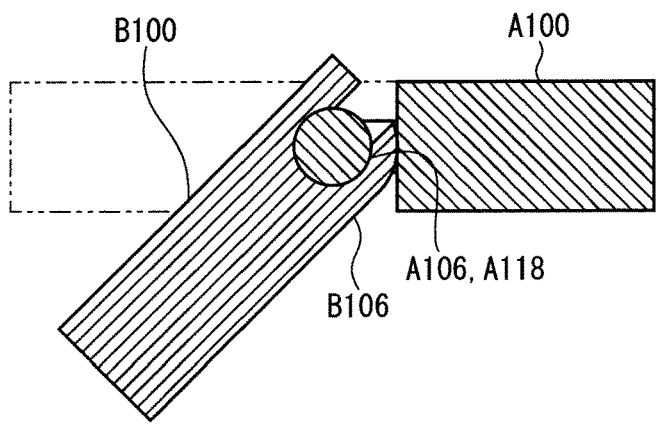
Figure 12D:
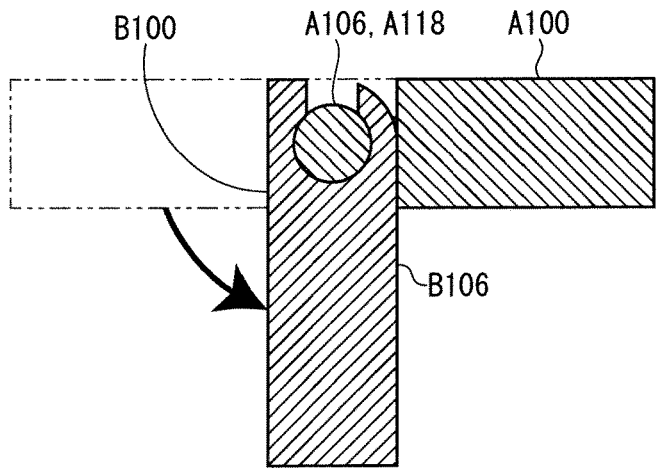

1.8 Mounting of Heating Component and Assembling of Cooling Device in Finished State FIGS. 10A, 10B, 11A to 11D, and 12A to 12D schematically show mounting of the heating components A102, B102, and C102, and assembling of the cooling device 100 in a finished state during manufacture of the cooling device 100 according to the first embodiment. FIG. 10A is a front view. FIG. 10B is a bottom view. FIGS. 11A and 11B are enlarged top views. FIGS. 11C and 11D are enlarged front views. FIGS. 12A to 12D are enlarged cross-sectional views.

After assembling of the cooling device 100 in a semi-finished state indicated by alternate long and two short dashed lines illustrated in FIGS. 10A and 10B, the heating components A102, B102, and C102 are mounted on the component mounting surfaces A116, B116, and C116 respectively. Further, components other than the heating components A102, B102, and C102 are mounted on the cooling device 100 in a semi-finished state. Then, the mounted components are electrically connected with wires. In this way, the electrically finished state is formed.

After mounting of the heating components A102, B102, and C102, the cooling device 100 in a finished state is assembled. For assembling of the cooling device 100 in a finished state, while the female fitting part B106 is fitted to the male fitting part A106, the female fitting part B106 is rotated 90° inwardly about the shaft A118 relative to the male fitting part A106. Further, while the female fitting part C108 is fitted to the male fitting part A108, the female fitting part C108 is rotated 90° inwardly about the shaft A124 relative to the male fitting part A108. In this way, rotary assembling is done by which the coolers B100 and C100 are rotated 90° relative to the cooler A100 using the rotary mechanisms 102 and 104 respectively as rotary axes. As a result, the cooling device 100 in a finished state is assembled in which the blades A112, B112, and C112 are arranged inside the cooling device 100. This forms a structurally finished state.

According to the first embodiment, various works including the work of mounting the heating components A102, B102, and C102, the work of mounting components other than the heating components A102, B102, and C102, and the work of electrically connecting the mounted components with wires, are done on the cooling device 100 in a semi-finished state having a flat configuration. Thus, such various works proceed while the component mounting surfaces A116, B116, and C116 are looked down from above. This facilitates implementation of the various works. After the various works are done on the cooling device 100 having a flat configuration, the cooling device 100 is assembled into a stereoscopic configuration. These ways encourage the work of assembling the cooling device 100 having a stereoscopic configuration to be done easily. These ways further encourage reduction in a burden on a worker to assemble the cooling device 100 having a stereoscopic configuration, and encourage improvement in productivity of the work of assembling the cooling device 100 having a stereoscopic configuration.

According to the first embodiment, if a device equipped with the cooling device 100 having a stereoscopic configuration goes out of order and undergoes repair, a work for the repair can be done after the cooling device 100 having a stereoscopic configuration is returned to the cooling device 100 having a flat configuration. Thus, the work for the repair can be done easily. Further, a burden on a service worker to do the work for the repair can be reduced.

1.9 Different Example of Method of Manufacturing Cooling Device

According to the foregoing method of manufacturing the cooling device 100, the extruded blades A132, B132, and C132 each having a shape like a flat plate are subjected to cutting to form the blades A112, B112, and C112 each having a pin-like shape.

The blades A112, B112, and C112 each having a pin-like shape may be formed by a different method. As an example, the blades A112, B112, and C112 each having a pin-like shape may be formed by forming the coolers A100, B100, and C100 with the pin-like blades A112, B112, and C112 respectively by forging or casting. This can eliminate time required for machining. Alternatively, the blades A112, B112, and C112 may be formed by machining performed further on an intermediary product formed by forging or casting. In this case, precision of working on the blades A112, B112, and C112 can be improved partially. In another case, the blades A112, B112, and C112 may be formed independently from remaining portions of the coolers A100, B100, and C100 respectively, and then the resultant blades A112, B112, and C112 may be joined to the base plates A110, B110, and C110 respectively. For this joining, welding, friction stir joining, or brazing is employed, for example. For this joining, the respective tips of the blades A112, B112, and C112 may be buried in insertion holes formed at the base plates A110, B110, and C110 respectively.

2 Second Embodiment

A second embodiment relates to a lid-equipped cooling device.

Figure 13A:
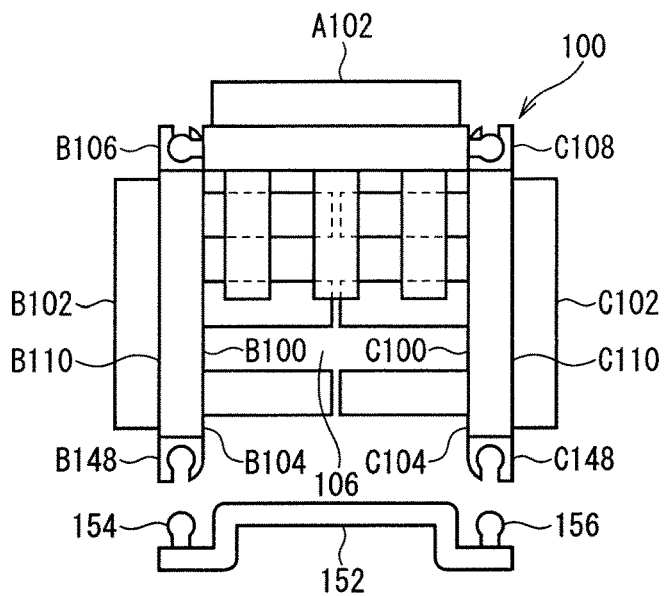
FIGS. 13A to 13C schematically show assembling of a lid-equipped cooling device according to a second embodiment.
Figure 13B:
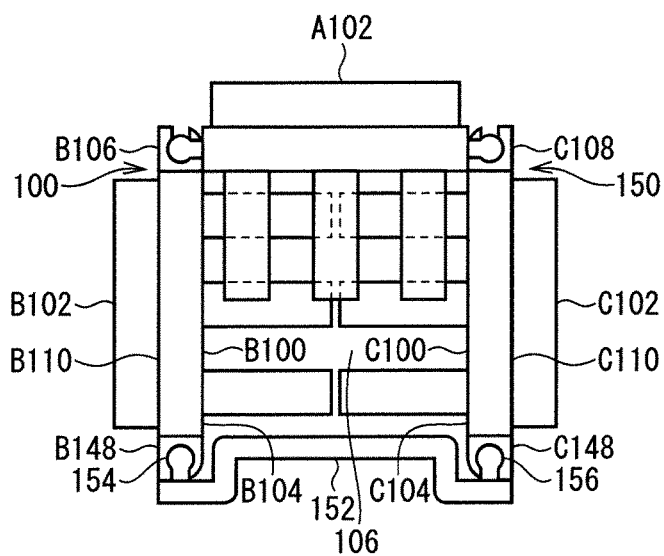
Figure 13C:
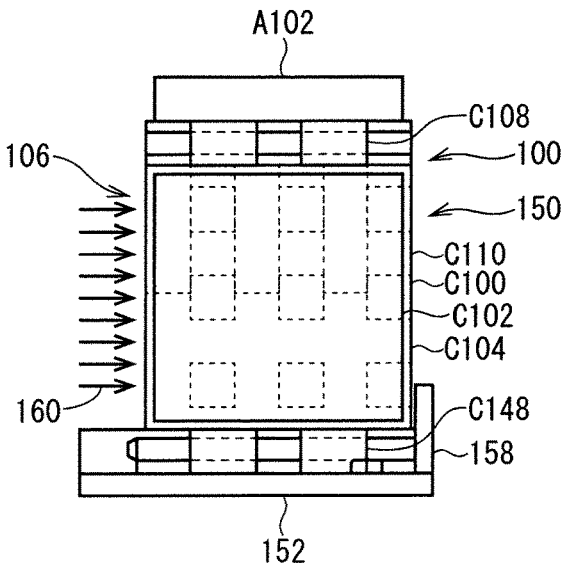

FIGS. 13A to 13C schematically show assembling of a lid-equipped cooling device 150 according to the second embodiment. FIGS. 13A and 13B are front views. FIG. 13C is a side view.

The lid-equipped cooling device 150 illustrated in FIGS. 13B and 13C includes a cooling device 100 in a finished state, a lid 152, a male fitting part 154, a male fitting part 156, and a stopper 158.

The cooling device 100 differs from the cooling device 100 in a finished state according to the first embodiment in that the cooler B100 further includes a female fitting part B148, and the cooler C100 further includes a female fitting part C148.

The female fitting parts B148 and C148 are coupled to the cooler bodies B104 and C104 respectively. The female fitting parts B106 and B148 are coupled to one end and the other end of the base plate B110 respectively. The female fitting parts C108 and C148 are coupled to one end and the other end of the base plate C110 respectively. This means that the cooler C100 has the same shape as the cooler B100. Thus, one type of cooler is applicable to both the coolers B100 and C100. The female fitting parts B148 and C148 are used in attaching the lid 152 to the cooling device 100 in a finished state. The female fitting parts B148 and C148 are formed by the foregoing extrusion and cutting out. The cutting out is omissible.

The lid 152 surrounds the air passage 106 together with the cooling device 100 in a finished state.

The male fitting parts 154 and 156 are coupled to the lid 152. The female fitting parts B148 and C148 are fitted to the male fitting parts 154 and 156 respectively. As a result, the lid 152 is attached to the cooling device 100 in a finished state. Four sides of the air passage 106 in which cooling air 160 is to flow are surrounded by the lid 152 and the cooling device 100 in a finished state. The male fitting parts 154 and 156 are formed by the foregoing extrusion. The foregoing boring on the male fitting parts 154 and 156 is omissible. The male fitting parts 154 and 156 function as rails for attachment of the lid 152. The lid 152 may be formed by extrusion together with the male fitting parts 154 and 156.

The formation of the lid-equipped cooling device 150 is finished by fitting the female fitting parts B148 and C148 to the male fitting parts 154 and 156 respectively and forming the air passage 106. The finished lid-equipped cooling device 150 is an integrated unit.

3 Third Embodiment

A third embodiment relates to a cooler-equipped case.

Figure 14A:
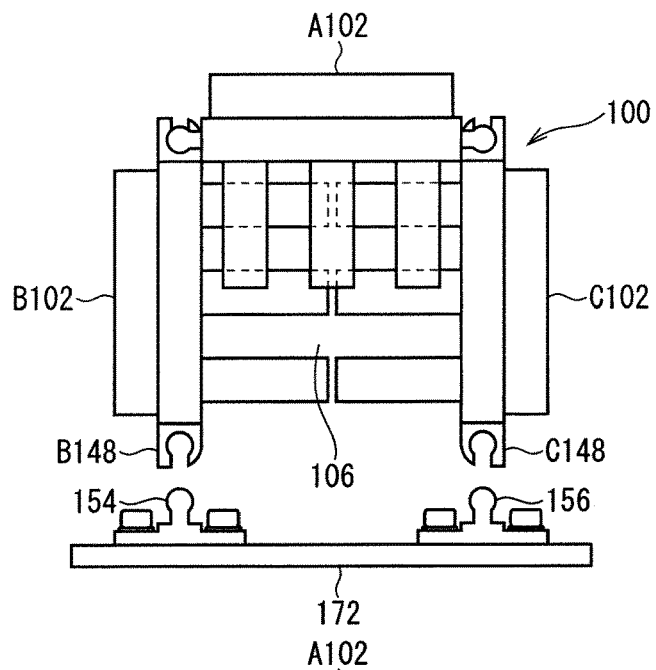
FIGS. 14A to 14C schematically show assembling of a case with a cooling device according to a third embodiment.
Figure 14B:
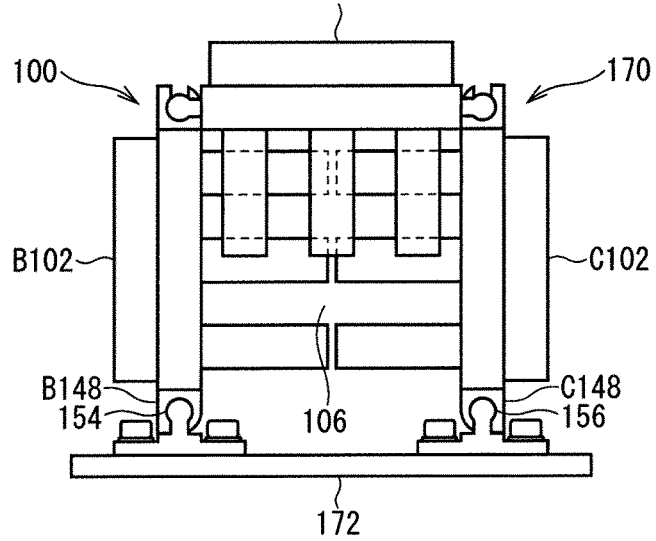
Figure 14C:
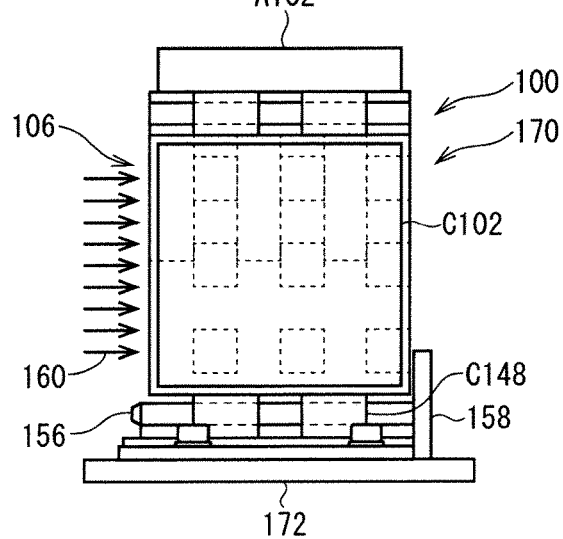

FIGS. 14A to 14C schematically show assembling of a case 170 with a cooling device according to the third embodiment. FIGS. 14A and 14B are front views. FIG. 14C is a side view.

The case 170 with a cooling device illustrated in FIGS. 14A, 14B and 14C includes a cooling device 100 in a finished state, a case 172, a male fitting part 154, a male fitting part 156, and a stopper 158.

The cooling device 100 in a finished state is the same as the cooling device 100 in a finished state provided in the lid-equipped cooling device 150 of the second embodiment. The female fitting parts B148 and C148 are used in incorporating the cooling device 100 in a finished state into the case 172.

The case 172 houses the cooling device 100 in a finished state.

The male fitting parts 154 and 156 are coupled to the case 172. The female fitting parts B148 and C148 are coupled to the male fitting parts 154 and 156 respectively. By doing so, the cooling device 100 in a finished state is incorporated into the case 172. Four sides of the air passage 106 in which the cooling air 160 is to flow are surrounded by the case 172 and the cooling device 100 in a finished state. The male fitting parts 154 and 156 are formed by the foregoing extrusion. The foregoing boring on the male fitting parts 154 and 156 is omissible. The male fitting parts 154 and 156 function as rails for incorporation of the cooling device 100 in a finished state.

The cooling device 100 in a finished state may be incorporated into a half-finished product instead of the case 172.

For temporary storage during manufacture, the cooling device 100 in a finished state may be attached to a carriage, a shelf, or a rack for temporary storage to which the male fitting parts functioning as attachment rails are coupled. This can prevent the occurrence of an unstable state of the cooling device 100 in a finished state when the cooling device 100 in a finished state is stored, transported to a next step, or placed on a property testing device, for example.

4 Fourth Embodiment

A fourth embodiment relates to a cooling device.

A cooling device 180 of the fourth embodiment differs from the cooling device 100 of the first embodiment in that the three-strand cooler including the coolers A100, B100, and C100 is replaced with a four-strand cooler including coolers A100, B100, C100, and D100 described below.

This difference will be described below. Regarding a structure not to be described below, a corresponding structure of the first embodiment is employed as it is or a modification of such a structure is employed in the fourth embodiment. A structure employed in an embodiment other than the first embodiment may be employed as it is or a modification of such a structure may be employed in the fourth embodiment.

FIGS. 15A to 15E are top views schematically showing coupling between the coolers A100, B100, C100, and D100 during manufacture of the cooling device 180 according to the fourth embodiment.

Figure 15A:
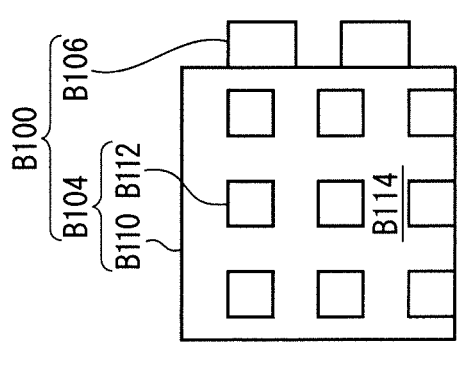
FIGS. 15A to 15E are top views schematically showing coupling between coolers during manufacture of a cooling device according to a fourth embodiment.
Figure 15B:
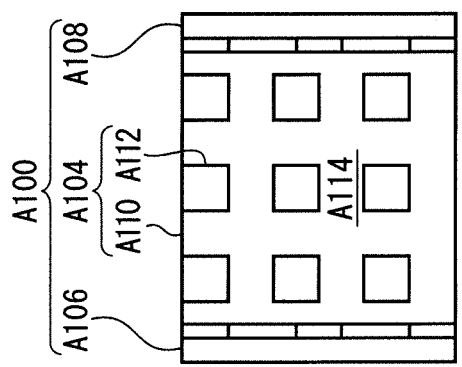
Figure 15C:
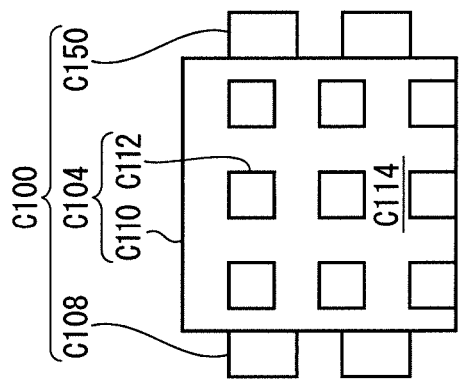
Figure 15D:
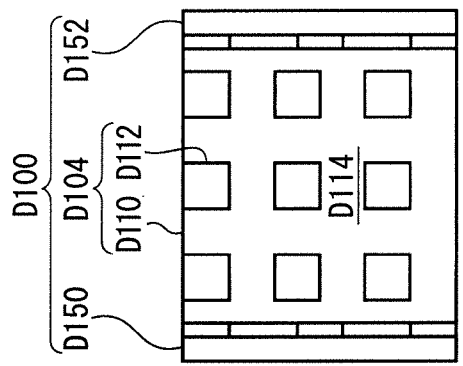
Figure 15E:
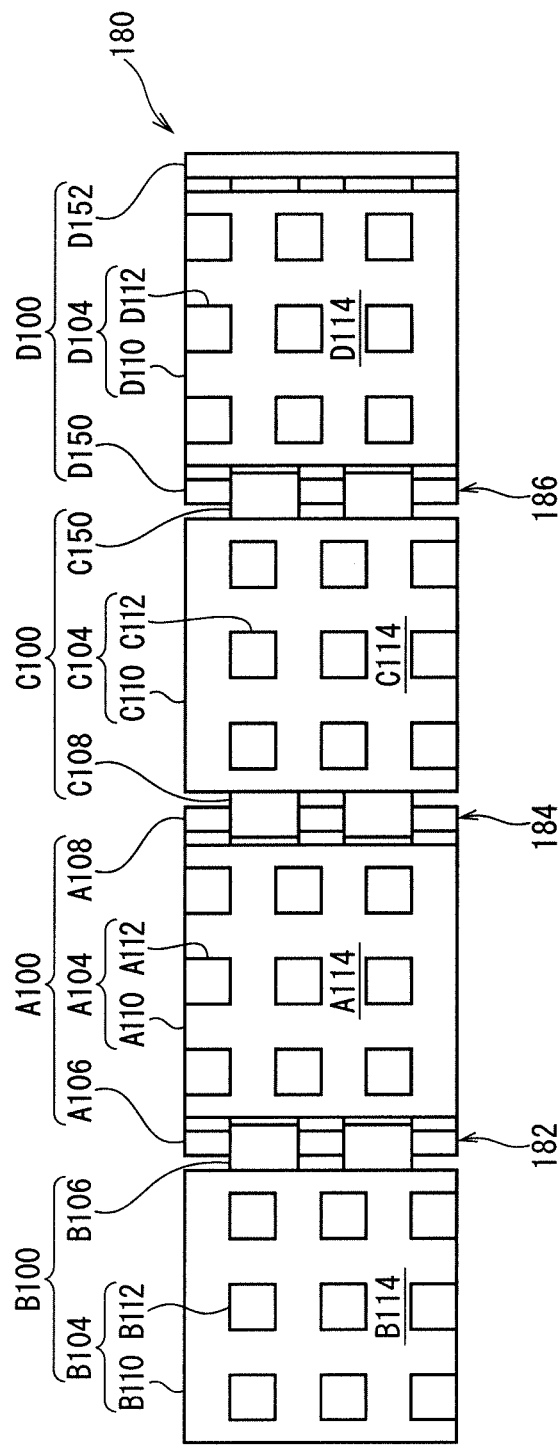

The cooling device 180 illustrated in FIG. 15E includes the coolers A100, B100, C100, and D100.

The cooler A100 includes a cooler body A104, a male fitting part A106, and a male fitting part A108. The cooler B100 includes a cooler body B104 and a female fitting part B106. The cooler C100 includes a cooler body C104, a female fitting part C108, and a female fitting part C150. The cooler D100 includes a cooler body D104, a male fitting part D150, and a male fitting part D152. The male fitting part A106 and the female fitting part B106 may be switched to each other. The male fitting part A108 and the female fitting part C108 may be switched to each other. The male fitting part D150 and the female fitting part C150 may be switched to each other. The male fitting part D152 may be replaced with a female fitting part. The male fitting part D152 is omissible.

The cooler body A104 includes a base plate A110 and blades A112. The cooler body B104 includes a base plate B110 and blades B112. The cooler body C104 includes a base plate C110 and blades C112. The cooler body D104 includes a base plate D110 and blades D112.

The blades A112, B112, C112, and D112 each have a pin-like shape.

The base plates A110, B110, C110, and D110 have blade coupling surfaces A114, B114, C114, and D114 respectively. The blades A112, B112, C112, and D112 are coupled to the blade coupling surfaces A114, B114, C114, and D114 respectively The base plates A110, B110, C110, and D110 have component mounting surfaces A116, B116, C116, and D116 respectively (FIG. 16A). Heating components A102, B102, C102, and D102 are mounted on the component mounting surfaces A116, B116, C116, and D116 respectively.

The heating components A102, B102, C102, and D102 are cooled by the cooler bodies A104, B104, C104, and D104 respectively.

The male fitting part A106 is coupled to one end of the base plate A110. The male fitting part A108 is coupled to the other end of the base plate A110. The female fitting part B106 is coupled to one end of the base plate B110. The female fitting part C108 is coupled to one end of the base plate C110. The female fitting part C150 is coupled to the other end of the base plate C110. The male fitting part D150 is coupled to one end of the base plate D110. The male fitting part D152 is coupled to the other end of the base plate D110. A female fitting part is not coupled to the other end of the base plate B110 for the reason that, if a female fitting part is coupled to the other end of the base plate B110, this female fitting part will interfere with the male fitting part D152 during rotary assembling.

A rotary mechanism 182 includes the male fitting part A106 and the female fitting part B106. The male fitting part A106 is coupled to the cooler body A104 as one of the cooler bodies A104 and B104. The female fitting part B106 is coupled to the cooler body B104 as the other of the cooler bodies A104 and B104. If the male fitting part A106 and the female fitting part B106 are switched to each other, the cooler body B104 corresponds to the one cooler body to which the male fitting part A106 is coupled. Further, the cooler body A104 corresponds to the other cooler body to which the female fitting part B106 is coupled. The female fitting part B106 is fitted to the male fitting part A106. While the cooler body B104 is maintained connected to the cooler body A104, the rotary mechanism 182 allows the cooler body B104 to rotate relative to the cooler body A104 between a state in which the component mounting surfaces A116 and B116 are pointed to the same direction and a state in which the blades B112 get into gaps between the blades A112 without interfering with the blades A112.

Likewise, a rotary mechanism 184 includes the male fitting part A108 and the female fitting part C108. The male fitting part A108 is coupled to the cooler body A104 as one of the cooler bodies A104 and C104. The female fitting part C108 is coupled to the cooler body C104 as the other of the cooler bodies A104 and C104. If the male fitting part A108 and the female fitting part C108 are switched to each other, the cooler body C104 corresponds to the one cooler body to which the male fitting part A108 is coupled. Further, the cooler body A104 corresponds to the other cooler body to which the female fitting part C108 is coupled. The female fitting part C108 is fitted to the male fitting part A108. While the cooler body C104 is maintained connected to the cooler body A104, the rotary mechanism 184 allows the cooler body C104 to rotate relative to the cooler body A104 between a state in which the component mounting surfaces A116 and C116 are pointed to the same direction and a state in which the blades C112 get into gaps between the blades A112 without interfering with the blades A112.

A rotary mechanism 186 includes the male fitting part D150 and the female fitting part C150. The male fitting part D150 is coupled to the cooler body D104 as one of the cooler bodies C104 and D104. The female fitting part C150 is coupled to the cooler body C104 as the other of the cooler bodies C104 and D104. If the male fitting part D150 and the female fitting part C150 are switched to each other, the cooler body C104 corresponds to the one cooler body to which the male fitting part D150 is coupled. Further, the cooler body D104 corresponds to the other cooler body to which the female fitting part C150 is coupled. The female fitting part C150 is fitted to the male fitting part D150. While the cooler body C104 is maintained connected to the cooler body D104, the rotary mechanism 186 allows the cooler body C104 to rotate relative to the cooler body D104 between a state in which the component mounting surfaces C116 and D116 are pointed to the same direction and a state in which the blades C112 get into gaps between the blades D112 without interfering with the blades D112.

For formation of the coolers A100 and D100, two extruded coolers having the same shape are formed by extrusion. The resultant two extruded coolers are subjected to the same pin working and the same boring. In this way, two coolers are formed. One of the two resultant coolers corresponds to the cooler A100. The other of the two resultant coolers corresponds to the cooler D100.

For formation of the coolers B100 and C100, two extruded coolers having the same shape are formed by extrusion. The resultant two extruded coolers are subjected to the same pin working. One of the two resultant extruded coolers is subjected to cutting out for removing an unnecessary extruded female fitting part. In this way, one cooler is formed. The one resultant cooler corresponds to the cooler B100. The other of the two resultant extruded coolers is subjected to cutting out not involving removal of an unnecessary extruded female fitting part. In this way, the other cooler is formed. The other resultant cooler corresponds to the cooler C100.

After formation of the coolers A100, B100, C100, and D100, the coolers A100, B100, C100, and D100 are coupled. As a result, the cooling device 180 in a semi-finished state is assembled.

FIGS. 16A and 16B are front views schematically showing mounting of the heating components A102, B102, C102, and D102, and assembling of the cooling device 180 in a finished state during manufacture of the cooling device 180 according to the fourth embodiment.

After assembling of the cooling device 180 in a semi-finished state illustrated in FIG. 16A, the heating components A102, B102, C102, and D102 are mounted on the component mounting surfaces A116, B116, C116, and D116 respectively of the cooling device 180 in a semi-finished state. Further, components other than the heating components A102, B102, C102, and D102 are mounted on the cooling device 180 in a semi-finished state. Then, the mounted components are electrically connected with wires. In this way, the electrically finished state is formed.

After mounting of the heating components A102, B102, C102, and D102, the cooling device 180 in a finished state illustrated in FIG. 16B is assembled. As a result, the cooling device 180 in a finished state is formed in which the blades A112, B112, C112, and D112 are arranged inside the cooling device 180. This forms a structurally finished state.

A frame is attached to the coolers A100, B100, C100, and D100 provided in the cooling device 180 in a finished state for fixing the coolers A100, B100, C100, and D100 desirably in a rectangular shape as viewed from the front. This makes it possible to maintain the assembled state of the cooling device 180 in a finished state. The frame may be attached using an attachment hole for a cooling fan. Generally, the attachment hole for the cooling fan is arranged at each of the four corners.

FIGS. 17A and 17B are cross-sectional views schematically illustrating a device 190 and a device 192 each including the cooling device 180 according to the fourth embodiment.

The device 190 illustrated in FIG. 17A includes the cooling device 180 in a finished state, a semiconductor device A102, a semiconductor device B102, a semiconductor device C102, a semiconductor device D102, an operation panel 194, a case 196, and a cooling fan 198. The semiconductor device C102 is not illustrated in FIG. 17A.

The cooling device 180 in a finished state, the semiconductor device A102, the semiconductor device B102, the semiconductor device C102, and the semiconductor device D102 are housed in the case 196. The operation panel 194 and the cooling fan 198 are attached to the case 196. The semiconductor devices A102, B102, C102, and D102 are mounted on the component mounting surfaces A116, B116, C116, and D116 respectively. An air passage 106 in the cooling device 180 in a finished state extends in the vertical direction from a lower opening of the case 196 to an upper opening of the case 196. The cooling fan 198 generates cooling air 160 to flow from the lower opening to the upper opening through the air passage 106.

The device 192 illustrated in FIG. 17B includes the cooling device 180 in a finished state, a semiconductor device A102, a semiconductor device B102, a semiconductor device C102, a semiconductor device D102, an operation panel 194, and a case 196. The semiconductor device C102 is not illustrated in FIG. 17B.

The cooling device 180 in a finished state, the semiconductor device A102, the semiconductor device B102, the semiconductor device C102, and the semiconductor device D102 are housed in the case 196. The operation panel 194 is attached to the case 196. The semiconductor devices A102, B102, C102, and D102 are mounted on the component mounting surfaces A116, B116, C116, and D116 respectively. The air passage 106 in the cooling device 180 in a finished state extends in the vertical direction from a lower opening of the case 196 to an upper opening of the case 196.

An air passage 106 is formed in the cooling device 180 in a finished state. The air passage 106 is surrounded by a cylindrical body formed of the coolers A100, B100, C100, and D100 on which the semiconductor devices A102, B102, C102, and D102 are mounted respectively. Thus, if the air passage 106 extends in the vertical direction, the chimney effect is achieved to generate an ascending current starting from the lower opening to reach the upper opening through the air passage 106. This achieves higher cooling effect than in a case in which the air passage 106 does not extend in the vertical direction. Thus, on the occurrence of loss at the semiconductor devices A102, B102, C102, and D102 to reduce heat generated from these devices, a switch can be made from forced air cooling conducted in the device 190 illustrated in FIG. 17A to natural air cooling conducted in the device illustrated in FIG. 17B. As an example, if semiconductor modules provided in the semiconductor devices A102, B102, C102, and D102 are changed from semiconductor modules made of silicon semiconductors to generate high heat to semiconductor power modules such as SiC MOSFETs or GaN devices to generate low heat, a switch can be made from forced air cooling to natural air cooling.

6 Fifth Embodiment

A fifth embodiment relates to a cooling device.

The cooling device of the fifth embodiment differs from the cooling device 100 of the first embodiment in that each of the female fitting parts B106 and C108 provided in the cooling device 100 of the first embodiment is replaced with a female fitting part 300 described below.

This difference will be described below. Regarding a structure not to be described below, a corresponding structure of the first embodiment is employed as it is or a modification of such a structure is employed in the fifth embodiment. A structure employed in an embodiment other than the first embodiment may be employed as it is or a modification of such a structure may be employed in the fifth embodiment.

Figure 18A:
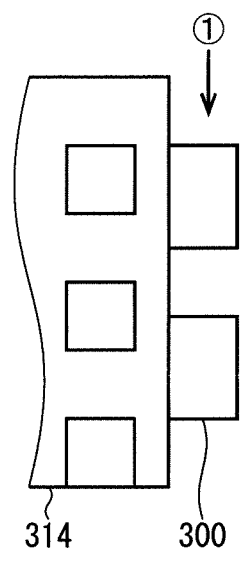
FIGS. 18A to 18D schematically illustrate a female fitting part and its surrounding provided in a cooling device according to a fifth embodiment.
Figure 18B:
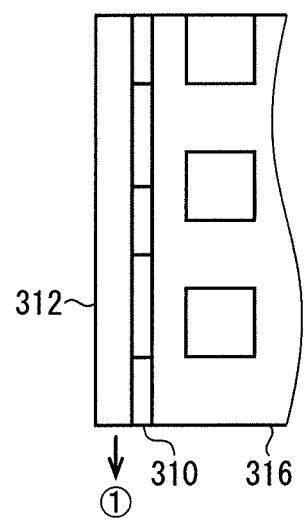
Figure 18C:
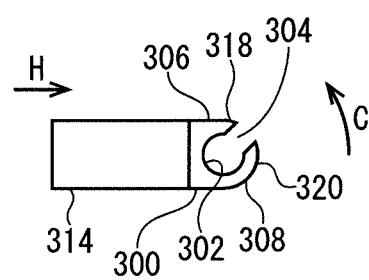
Figure 18D:
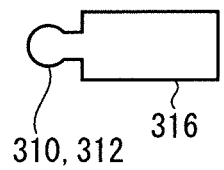

FIGS. 18A to 18D and 19A to 19F each schematically illustrate the female fitting part 300 and its surrounding provided in the cooling device according to the fifth embodiment. FIGS. 18A and 18B are top views. FIGS. 18C and 18D are front views. FIGS. 19A to 19F are enlarged cross-sectional views.

The female fitting part 300 illustrated in FIGS. 18A to 18D and 19A to 19F includes a shaft hole 302 and a cutout 304. The female fitting part 300 includes an upper end portion 306 and a lower end portion 308. The cutout 304 is caught between the upper end portion 306 and the lower end portion 308 in a peripheral direction C of the shaft hole 302.

The shaft hole 302 houses a shaft 312 provided to a male fitting part 310 to which the female fitting part 300 is fitted. The cutout 304 extends from the shaft hole 302 to reach a surface of the female fitting part 300. The cutout 304 is arranged in a direction tilted from a horizontal direction H toward the peripheral direction C of the shaft hole 302 as viewed from the shaft hole 302. As described in the first embodiment, the horizontal direction H is a direction vertical to both a direction in which a component mounting surface of a cooler 314 including the female fitting part 300 is pointed and a direction in which the shaft hole 302 extends. A cutout angle, which is an angle between the horizontal direction H and the direction in which the cutout 304 is arranged, is 45°. The cutout angle of 45° may be replaced with a different cutout angle. As an example, the cutout angle of 45° may be replaced with a cutout angle from 1 to 120°.

Figure 19A:
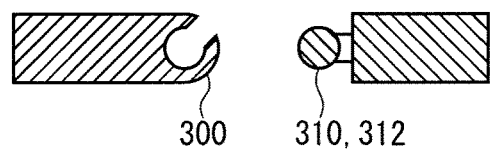
FIGS. 19A to 19F are enlarged cross-sectional views schematically illustrating the female fitting part and its surrounding provided in the cooling device according to the fifth embodiment.
Figure 19B:
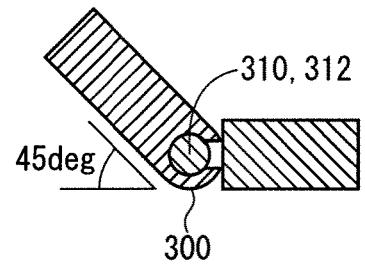
Figure 19C:
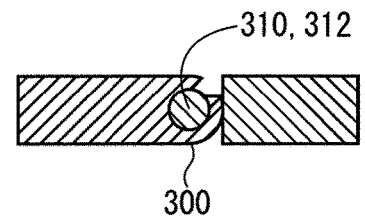
Figure 19D:
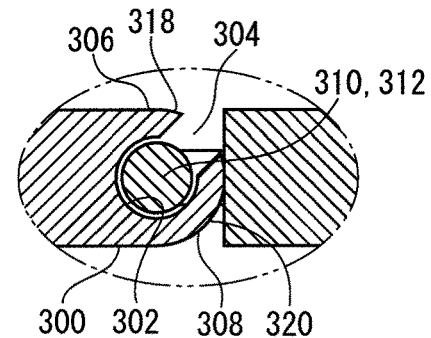
Figure 19E:
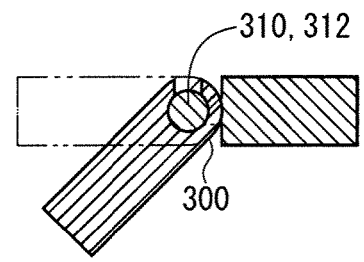
Figure 19F:
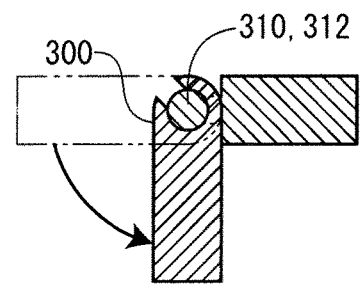

As illustrated in FIG. 19D, with the cutout 304 arranged in this manner, the lower end portion 308 gets snagged on the male fitting part 310 in the cooling device 100 in a semi-finished state, for example. Thus, even if at least one of the cooler 314 including the female fitting part 300 and a cooler 316 including the male fitting part 310 receives force acting to cause the cooler 314 to slide toward the cooler 316, the sliding motion of the cooler 314 toward the cooler 316 is limited. By doing so, the position of the cooler 314 relative to the cooler 316 is maintained at a constant position.

The upper end portion 306 has an R surface 318. The lower end portion 308 has an R surface 320. When a transition is made from a state in which the component mounting surface of the cooler 314 and a component mounting surface of the cooler 316 are pointed to the same direction to a state in which blades provided in the cooler 314 get into gaps between blades provided in the cooler 316 without interfering with these blades in the cooler 316, the R surface 318 of the upper end portion 306 is arranged at a position closer to a cooler body of the cooler 316. However, the R surface 318 of the upper end portion 306 does not interfere with this cooler body when this transition is made. The R surface 318 may be replaced with a C chamfered surface.

Like in the first embodiment, for formation of the cooler 314, an extruded cooler having a basic shape is formed by extrusion. Machining is performed on the resultant extruded cooler. An R surface and a C chamfered surface are formed by forming a cross-sectional shape of the extruded cooler into a cross-sectional view with the R surface and the C chamfered surface respectively. In this way, during coupling between the coolers 314 and 316 or assembling of the cooling device in a finished state, for example, the female fitting part 300 is subjected to the working for reducing the occurrence of interference of the female fitting part 300 with a cooler body of the cooler 316. Instead of performing the working on the female fitting part 300 for reducing the occurrence of interference of the female fitting part 300 with this cooler body, this cooler body may be subjected to relief cutting for reducing the occurrence of interference of the female fitting part 300 with this cooler body. A relief cut is formed by forming a cross-sectional shape of the extruded cooler into a cross-sectional shape with the relief cut.

Like in manufacture of the cooling device 100 of the first embodiment, the manufacturing methods described in the section "1.9 Different example of method of manufacturing cooling device" are employed in manufacture of the cooling device of the fifth embodiment.

Figure 20A:
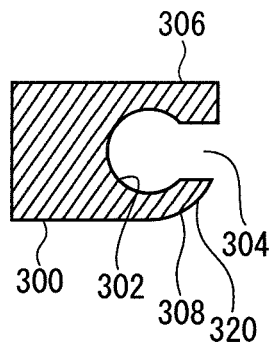
FIGS. 20A to 20C are enlarged cross-sectional views schematically illustrating an example of a cutout angle in the cooling device according to the first embodiment.
Figure 20B:
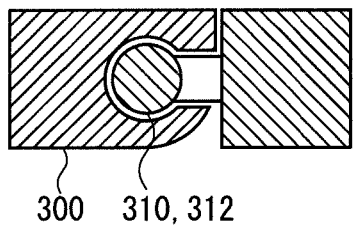
Figure 20C:
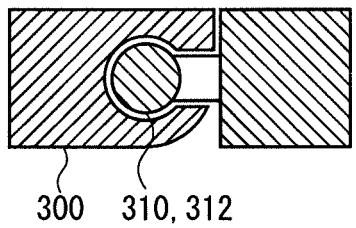
Figure 21A:
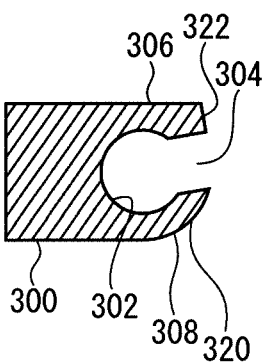
FIGS. 21A to 21C are enlarged cross-sectional views schematically illustrating an example of various cutout angles in the cooling device according to the fifth embodiment.
Figure 21B:
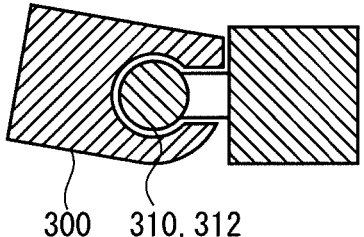
Figure 21C:
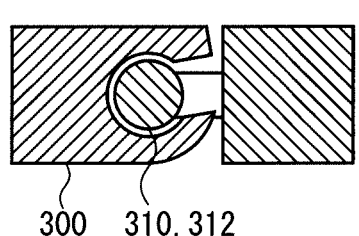
Figure 22A:
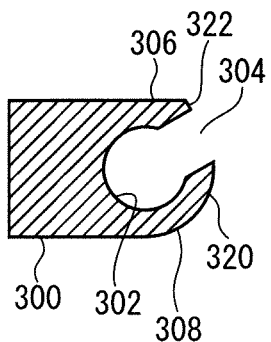
FIGS. 22A to 22C are enlarged cross-sectional views schematically illustrating an example of the various cutout angles in the cooling device according to the fifth embodiment.
Figure 22B:
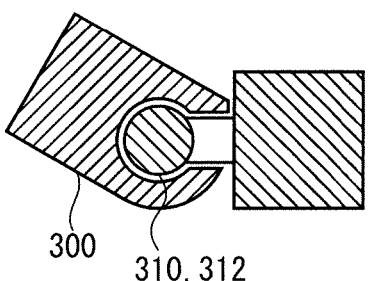
Figure 22C:
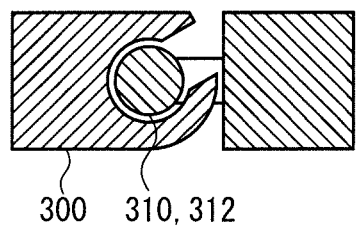
Figure 23A:
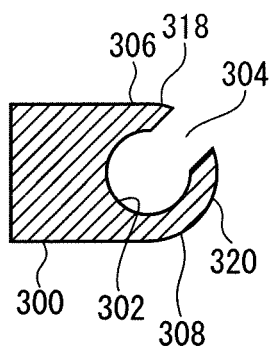
FIGS. 23A to 23C are enlarged cross-sectional views schematically illustrating an example of the various cutout angles in the cooling device according to the fifth embodiment.
Figure 23B:
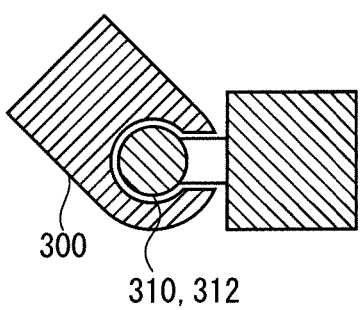
Figure 23C:
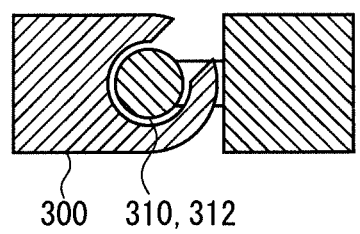
Figure 24A:
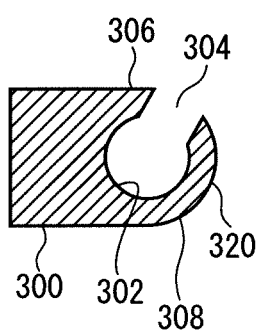
FIGS. 24A to 24C are enlarged cross-sectional views schematically illustrating an example of the various cutout angles in the cooling device according to the fifth embodiment.
Figure 24B:
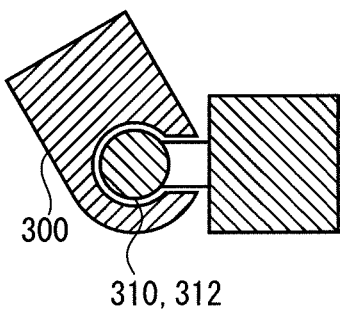
Figure 24C:
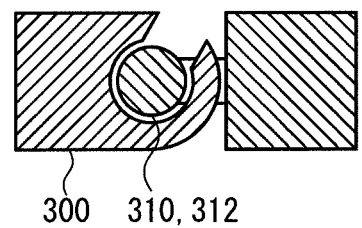
Figure 25A:
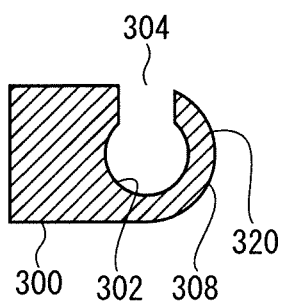
FIGS. 25A to 25C are an enlarged cross-sectional views schematically illustrating an example of the various cutout angles in the cooling device according to the fifth embodiment.
Figure 25B:
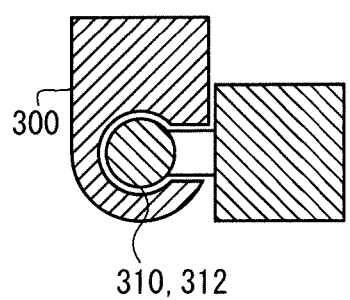
Figure 25C:
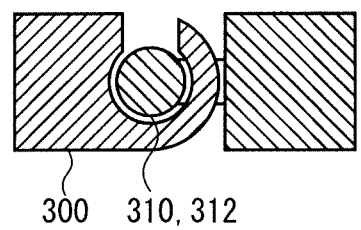
Figure 26A:
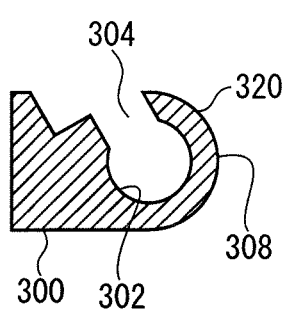
FIGS. 26A to 26C are enlarged cross-sectional views schematically illustrating an example of the various cutout angles in the cooling device according to the fifth embodiment.
Figure 26B:
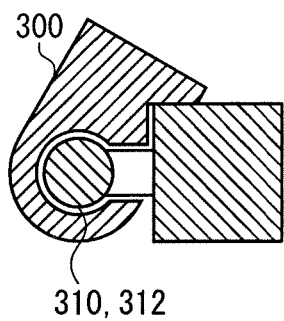
Figure 26C:
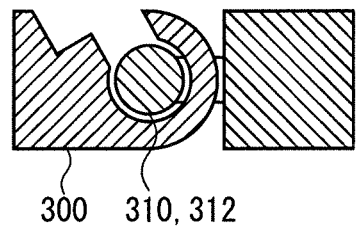

FIGS. 20A to 20C are enlarged cross-sectional views schematically illustrating an example of a cutout angle in the cooling device according to the first embodiment. FIGS. 21A to 26C are enlarged cross-sectional view schematically illustrating examples of various cutout angles in the cooling device according to the fifth embodiment.

In the examples illustrated in FIGS. 20A to 26C, a cutout angle is set at 0°, 10°, 30°, 45°, 60°, 90°, and 120° respectively.

The upper end portion 306 illustrated in FIGS. 21A to 21C and 22A to 22C has a C chamfered surface 322. The upper end portion 306 illustrated in FIGS. 23A to 23C has the R surface 318. The lower end portion 308 illustrated in FIGS. 21A to 21C, 22A to 22C, 23A to 23C, 24A to 24C, 25A to 25C, and 26A to 26C has the R surface 320. The R surface 318 and the C chamfered surface 322 are formed to fulfill the same purpose of preventing interference with an end surface of the cooler body. For this reason, the C chamfered surface 322 may be replaced with an R surface, or the R surface 318 may be replaced with a C chamfered surface.

The fifth embodiment achieves effect comparable to that achieved by the first embodiment.

As described above, various works including the work of mounting the heating components A102, B102, and C102, the work of mounting components other than the heating components A102, B102, and C102, and the work of electrically connecting the mounted components with wires, are done on the cooling device in a semi-finished state. These works are required to be done while the coolers A100, B100, and C100 provided in the cooling device in a semi-finished state are aligned with each other at their end surfaces, etc. The reason therefor is that failing to do so causes the likelihood of manufacture of a failed part due to stress applied to a wire during rotary assembling, for example.

In the fifth embodiment, even if each of the coolers A100, B100, and C100 receives force acting to cause each of the coolers A100, B100, and C100 to slide toward a cooler coupled to this cooler, the lower end portion 308 gets snagged. Thus, sliding motion of each cooler toward a cooler coupled to this cooler is limited. In this way, the position of each cooler is maintained at a constant position. This encourages the various works to be done easily on the cooling device in a semi-finished state, making it possible to reduce the occurrence of a failed part. Additionally, the need for an alignment work for arranging the coolers A100, B100, and C100 in positions can be eliminated. Allowing reduction in the occurrence of a failed part and allowing elimination of the alignment work encourage reduction in a psychological burden on a worker responsible for assembling.

In the fifth embodiment, in constructing a manufacturing line, a measure for alignment to be taken by a part supplier can be simplified. This can reduce a burden on a person to construct the manufacturing line.

6 Sixth Embodiment

A sixth embodiment relates to a cooling device.
The cooling device of the sixth embodiment differs from the cooling device 100 of the first embodiment in that each of the female fitting parts B106 and C108 provided in the cooling device 100 of the first embodiment is replaced with a female fitting part 300 described below.

This difference will be described below. Regarding a structure not to be described below, a corresponding structure of the first embodiment is employed as it is or a modification of such a structure is employed in the sixth embodiment. A structure employed in an embodiment other than the first embodiment may be employed as it is or a modification of such a structure may be employed in the sixth embodiment.

Figure 27A:
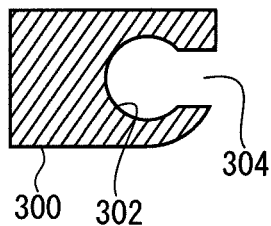
FIGS. 27A to 27C are enlarged cross-sectional views schematically illustrating a female fitting part and its surrounding provided in the cooling device according to the first embodiment.
Figure 27B:
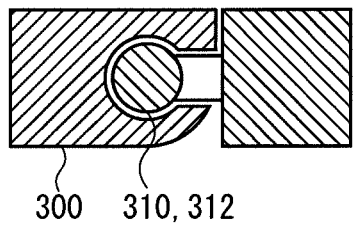
Figure 27C:
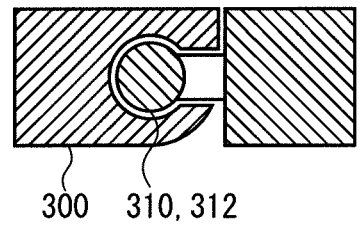

FIGS. 27A to 27C are enlarged cross-sectional views schematically illustrating a female fitting part 300 and its surrounding provided in the cooling device 100 according to the first embodiment. FIGS. 28A to 28C and 29A to 29C are enlarged cross-sectional view schematically illustrating the female fitting part 300 and its surrounding provided in the cooling device according to the sixth embodiment.

In the female fitting part 300 illustrated in FIGS. 27A to 27C, the shaft hole 302 has a circular cross-sectional shape as viewed from a direction in which the shaft hole 302 extends. The cutout 304 extends from the shaft hole 302 to reach a surface of the female fitting part 300, and is arranged in such a manner as not to generate offset from the center of the shaft hole 302 as viewed in the direction in which a component mounting surface of a cooler including the female fitting part 300 is pointed.

In the female fitting part 300 illustrated in FIGS. 28A to 28C and 29A to 29C, the shaft hole 302 has an oval cross-sectional shape as viewed from a direction in which the shaft hole 302 extends. The oval cross-sectional shape extends long in the direction in which the component mounting surface of the cooler including the female fitting part 300 is pointed, and has a longer axis extending in this direction. Further, the cutout 304 is arranged in such a manner as to generate offset from a center 360 of the shaft hole 302 as viewed in this direction. In the female fitting part 300 illustrated in FIGS. 28A to 28C, this offset is positive offset of making a shift in this direction. In the female fitting part 300 illustrated in FIGS. 29A to 29C, this offset is negative offset of making a shift in a direction opposite this direction.

Figure 28A:
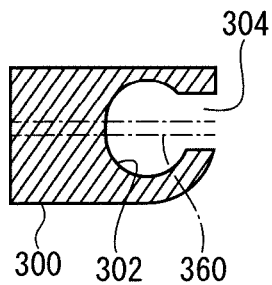
FIGS. 28A to 28C are enlarged cross-sectional views schematically illustrating a female fitting part and its surrounding provided in a cooling device according to a sixth embodiment.
Figure 28B:
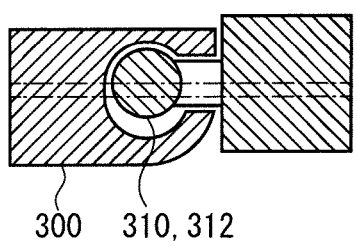
Figure 28C:
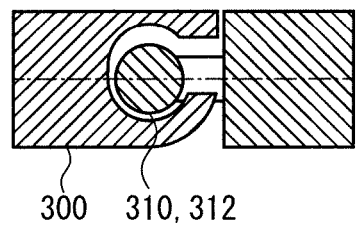
Figure 29A:
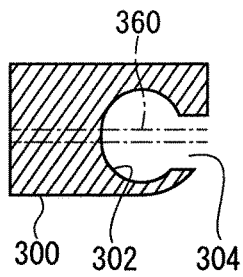
FIGS. 29A to 29C are enlarged cross-sectional views schematically illustrating the female fitting part and its surrounding provided in the cooling device according to the sixth embodiment.
Figure 29B:
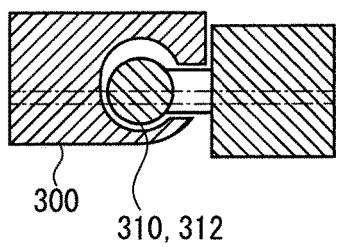
Figure 29C:
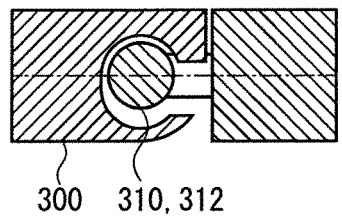

If the shaft 312 is arranged so as not to generate offset from the center 360 of the shaft hole 302 as illustrated in FIGS. 28C and 29C, the component mounting surface of the cooler including the female fitting part 300 and a component mounting surface of a cooler including the male fitting part 310 form the same plane.

The sixth embodiment achieves effect comparable to that achieved by the first embodiment.

In the sixth embodiment, if after-sales service is offered and an old unit including a cooler and a heating component mounted on this cooler is to be changed to a new unit, the old unit can be placed in a state of being ready to slide relative to a unit coupled to the old unit toward a direction opposite an insertion direction by lifting the old unit or the unit coupled to the old unit. This facilitates removal and attachment for changing the old unit to the new unit. In the fifth embodiment, the old unit is required to be tilted to a predefined angle relative to the unit coupled to the old unit for unit changing by means of removal and attachment.

7 Seventh Embodiment

A seventh embodiment relates to a cooling device.

The cooling device of the seventh embodiment differs from the cooling device 100 of the first embodiment in that the blades A112, B112, and C112 provided in the cooling device 100 of the first embodiment are replaced with blades A112, B112, and C112 described below.

This difference will be described below. Regarding a structure not to be described below, a corresponding structure of the first embodiment is employed as it is or a modification of such a structure is employed in the seventh embodiment. A structure employed in an embodiment other than the first embodiment may be employed as it is or a modification of such a structure may be employed in the seventh embodiment.

Figure 30A:
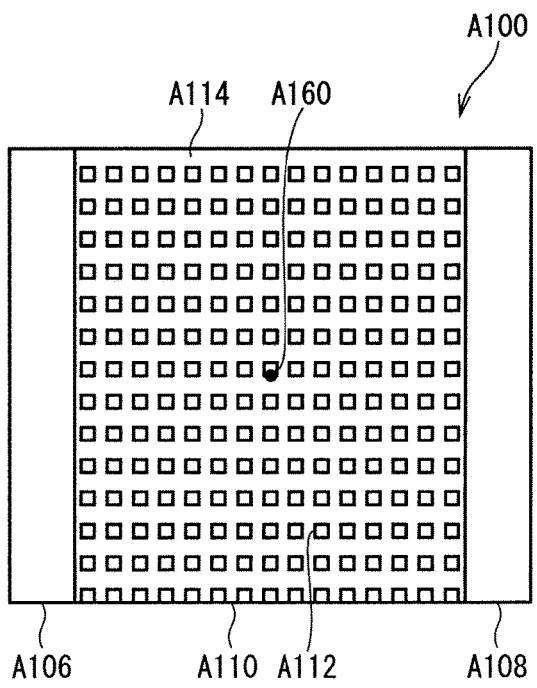
FIGS. 30A to 30C schematically illustrate a cooler provided in a cooling device according to a seventh embodiment.
Figure 30B:
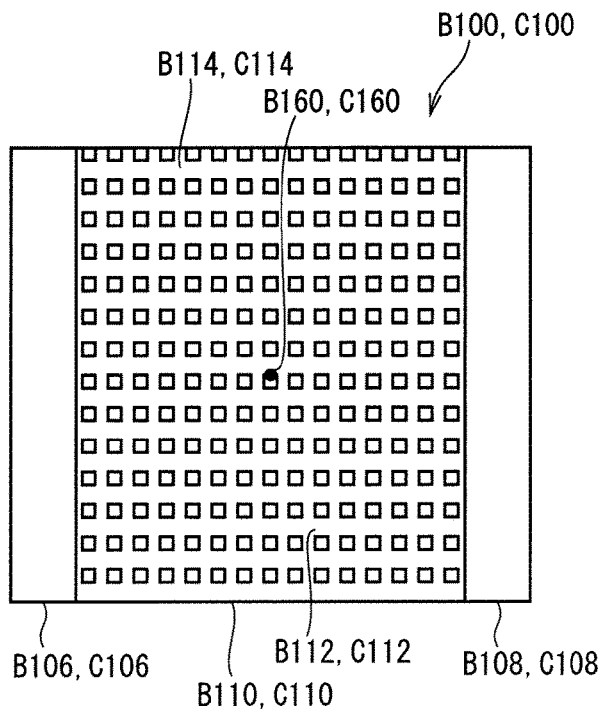
Figure 30C:
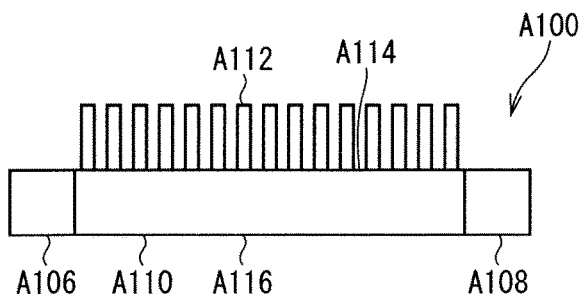
Figure 31A:
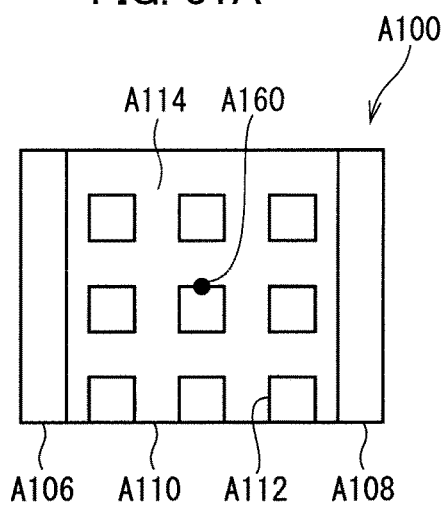
FIGS. 31A and 31B are enlarged top views schematically illustrating the cooler provided in the cooling device according to the seventh embodiment.
Figure 31B:
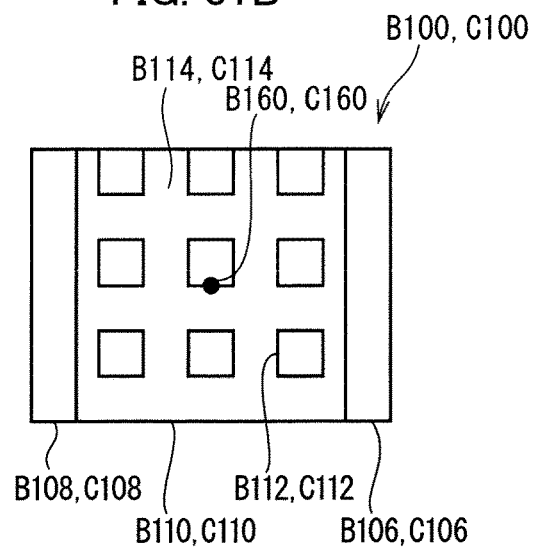

FIGS. 30A to 30C schematically illustrate coolers A100, B100, and C100 provided in the cooling device according to the seventh embodiment. FIGS. 30A and 30B are top views. FIG. 30C is a front view. FIGS. 31A and 31B are enlarged top views schematically illustrating a cooler provided in the cooling device of the seventh embodiment.

The cooler A100 illustrated in FIGS. 30A, 30C, and 31A includes a base plate A110, blades A112, a male fitting part A106, and a male fitting part A108. The base plate A110 has a blade coupling surface A114. The coolers B100 and C100 illustrated in FIGS. 30B and 31B include base plates B110 and C110 respectively, include blades B112 and blades C112 respectively, include female fitting parts B106 and C106 respectively, and include female fitting parts B108 and C108 respectively. The base plates B110 and C110 have blade coupling surfaces B114 and C114 respectively.

In plan views of the base plates A110 and B110 taken from directions in which the blade coupling surfaces A114 and B114 are pointed respectively, when a center A160 of the base plate A110 and a center B160 of the base plate B110 are matched to each other, the blades B112 are brought into point symmetry with the blades A112 with respect to the center A160 of the base plate A110 and the center B160 of the base plate B110. For this reason, the blades B112 are obtained by rotating the blades A112 180° about the center A160 of the base plate A110 as viewed from the direction in which the blade coupling surface A114 is pointed.

Likewise, in plan views of the base plates A110 and C110 taken from directions in which the blade coupling surfaces A114 and C114 are pointed respectively, when the center A160 of the base plate A110 and a center C160 of the base plate C110 are matched to each other, the blades C112 are brought into point symmetry with the blades A112 with respect to the center A160 of the base plate A110 and the center C160 of the base plate C110. For this reason, the blades C112 are obtained by rotating the blades A112 180° about the center A160 of the base plate A110 as viewed from the direction in which the blade coupling surface A114 is pointed.

Figure 32A:
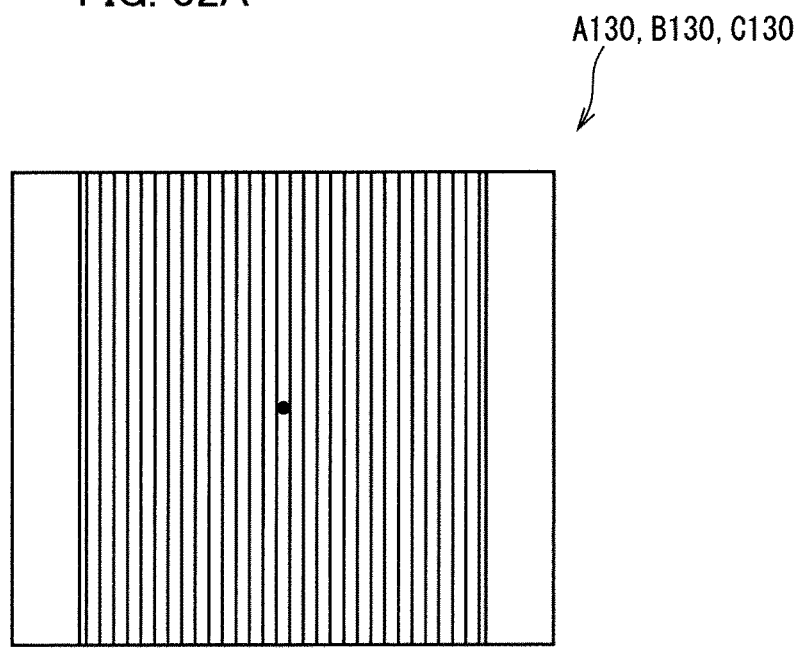
FIGS. 32A and 32B schematically show pin working on an extruded blade during manufacture of the cooling device according to the seventh embodiment.
Figure 32B:
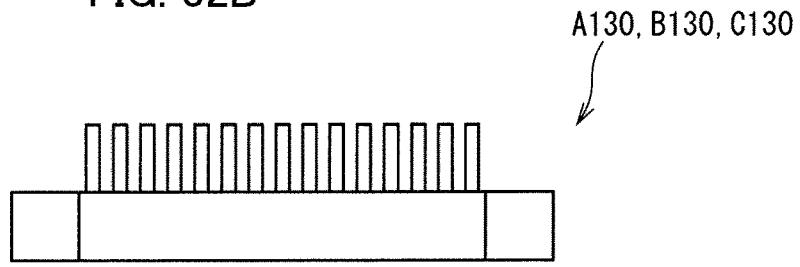
Figure 33A:
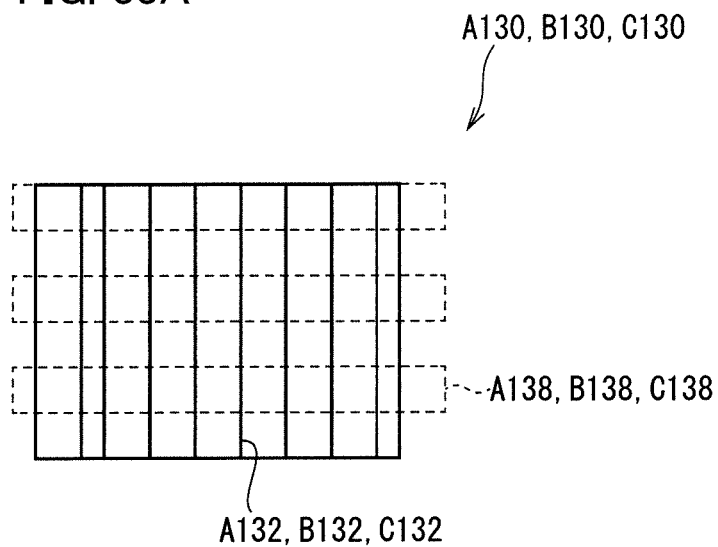
FIGS. 33A and 33B schematically show pin working on the extruded blade during manufacture of the cooling device according to the seventh embodiment.
Figure 33B:
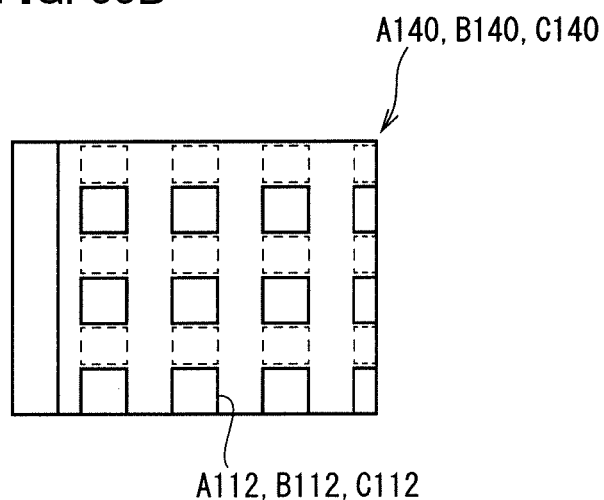

FIGS. 32A, 32B, 33A and 33B schematically show pin working on extruded blades A132, B132, and C132 during manufacture of the cooling device according to the seventh embodiment. FIG. 32A is a top view. FIG. 32B is a front view. FIGS. 33A and 33B are enlarged top views.

During manufacture of the cooling device, extruded coolers A130, B130, and C130 illustrated in FIGS. 32A, 32B and 33A are formed by extrusion. During formation of the extruded coolers A130, B130, and C130, a molded item is cut into a specified length.

Next, as illustrated in FIG. 33A, pin working is performed on the extruded blades A132, B132, and C132 provided in the extruded coolers A130, B130, and C130 respectively. As a result, the blades A112, B112, and C112 illustrated in FIG. 33B are formed. Then, pin-worked coolers A140, B140, and C140 including the blades A112, B112, and C112 respectively are formed. For implementation of pin working on the extruded blades A132, B132, and C132, cutting is performed to cut regions A138, B138, and C138 respectively with a cutter. Residual blades get into gaps between the resultant blades A112, gaps between the resultant blades B112, and gaps between the resultant blades C112.

Like in manufacture of the cooling device 100 of the first embodiment, the manufacturing methods described in the section "1.9 Different example of method of manufacturing cooling device" are employed in manufacture of the cooling device of the seventh embodiment.

The seventh embodiment achieves effect comparable to that achieved by the first embodiment.

In the seventh embodiment, when the cooler A100 is rotated 180° as viewed from the blade coupling surface A114, the blades A112 of the cooler A100 are arranged in a staggered configuration relative to the arrangements of the blades B112 and C112 of the coolers B100 and C100 respectively. This makes it possible to check the positions relative to each other easily.

In the seventh embodiment, when the coolers B100 and C100 are rotated inwardly relative to the cooler A100 by rotary assembling about the rotary mechanisms 102 and 104 as rotary axes, the blades B112 and C112 do not interfere with the blades A112.

In the seventh embodiment, pin working for forming the blades B112 and C112 is performed in the same way as pin working for forming the blades A112. This makes it possible to prevent a working mistake to be caused due to an erroneous direction of incorporation into a processing machine, a working mistake to be caused by erroneous selection of a program to be set for an automatic machine, etc. This further makes it possible to reduce time required for set-up change, thereby allowing improved productivity.

As a result of the foregoing, in the seventh embodiment, an environment reducing the likelihood of manufacture of a failed part is provided, the quality of a cooling device is improved, and a psychological burden on an operator for working can be reduced.

8 Eighth Embodiment

A cooling device 800 of an eighth embodiment differs from the cooling device 100 of the first embodiment in that the rotary mechanisms 102 and 140 provided in the cooling device 100 of the first embodiment are replaced with rotary mechanisms 102 and 104 described below respectively. The cooling device 800 of the eighth embodiment further differs from the cooling device 100 of the first embodiment in that the blades A112, B112, and C112 provided in the cooling device 100 of the first embodiment are replaced with blades A112, B112, and C112 described below respectively. The cooling device 800 of the eighth embodiment further differs from the cooling device 100 of the first embodiment in that the cooler B100 includes a circular fitting part B168 described below, and the cooler C100 includes a circular fitting part C170 described below.

These differences will be described below. Regarding a structure not to be described below, a corresponding structure of the first embodiment is employed as it is or a modification of such a structure is employed in the eighth embodiment. A structure employed in an embodiment other than the first embodiment may be employed as it is or a modification of such a structure may be employed in the eighth embodiment.

Figure 34A:
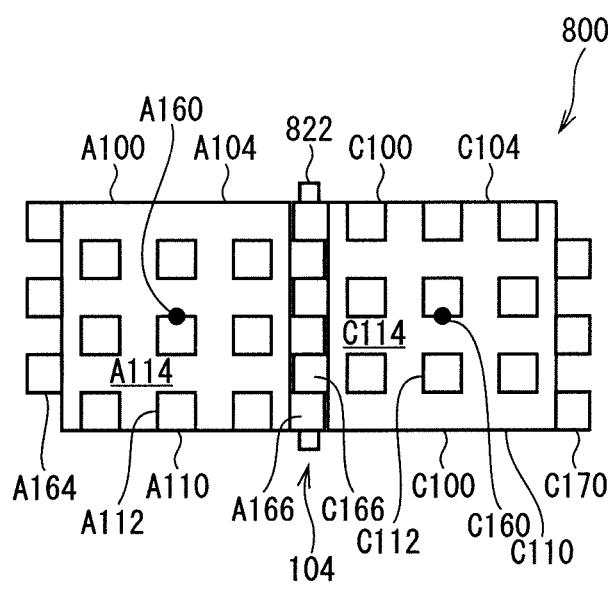
FIGS. 34A and 34B schematically illustrate a cooling device according to an eighth embodiment and each cooler provided in the cooling device according to the eighth embodiment.
Figure 34B:
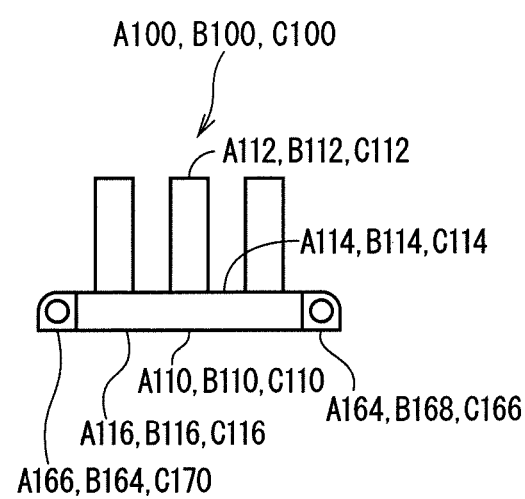

FIGS. 34A and 34B schematically illustrate the cooling device 800 according to the eighth embodiment and each of the coolers A100, B100, and C100 provided in the cooling device 800 according to the eighth embodiment. FIG. 34A is a top view. FIG. 34B is a front view. FIG. 35A is a front view. FIG. 35B is a bottom view. FIG. 35C is a front view.

The rotary mechanism 102 illustrated in FIG. 35A includes a coupling rod 820, a circular fitting part A164, and a circular fitting part B164. The rotary mechanism 104 illustrated in FIGS. 34A and 35A includes a coupling rod 822, a circular fitting part A166, and a circular fitting part C166. The cooler B100 illustrated in FIG. 35A further includes the circular fitting part B168. The cooler C100 illustrated in FIGS. 34A and 35A further includes the circular fitting part C170.

The circular fitting part A164 is coupled to one end of the base plate A110. The circular fitting part A166 is coupled to the other end of the base plate A110. The circular fitting part B164 is coupled to one end of the base plate B110. The circular fitting part B168 is coupled to the other end of the base plate B110. The circular fitting part C166 is coupled to one end of the base plate C110. The circular fitting part C170 is coupled to the other end of the base plate C110. One or both of the circular fitting part B168 and the circular fitting part C170 are omissible.

The circular fitting parts A164 and B164 are arranged in a staggered configuration. The circular fitting parts A164 and B164 are fitted to the coupling rod 820. By doing so, the rotary mechanism 102 becomes functional to connect the cooler body B104 to the cooler body A104, thereby coupling the cooler B100 to the cooler A100. The circular fitting parts A164 and B164 are rotatable relative to the coupling rod 820 while maintained fitted to the coupling rod 820. By doing so, while the cooler body B104 is maintained connected to the cooler body A104, the rotary mechanism 102 becomes functional to allow the cooler body B104 to rotate relative to the cooler body A104 between a state in which the component mounting surfaces A116 and B116 are pointed to the same direction and a state in which the blades B112 get into gaps between the blades A112 without interfering with the blades A112.

Likewise, the circular fitting parts A166 and C166 are arranged in a staggered configuration. The circular fitting parts A166 and C166 are fitted to the coupling rod 822. By doing so, the rotary mechanism 104 becomes functional to connect the cooler body C104 to the cooler body A104, thereby coupling the cooler C100 to the cooler A100. The circular fitting parts A166 and C166 are rotatable relative to the coupling rod 822 while maintained fitted to the coupling rod 822. By doing so, while the cooler body C104 is maintained connected to the cooler body A104, the rotary mechanism 104 becomes functional to allow the cooler body C104 to rotate relative to the cooler body A104 between a state in which the component mounting surfaces A116 and C116 are pointed to the same direction and a state in which the blades C112 get into gaps between the blades A112 without interfering with the blades A112.

The circular fitting part A164 has a shaft hole. The circular fitting part B164 has a shaft hole. The coupling rod 820 is housed in the shaft holes in the circular fitting parts A164 and B164. The coupling rod 820 is rotatable inside the shaft hole in the circular fitting part A164 and inside the shaft hole in the circular fitting part B164. In this way, the circular fitting part B164 becomes rotatable relative to the circular fitting part A164.

Likewise, the circular fitting part A166 has a shaft hole. The circular fitting part C166 has a shaft hole. The coupling rod 822 is housed in the shaft hole in the circular fitting part A166 and in the shaft hole in the circular fitting part C166. The coupling rod 822 is rotatable inside the shaft hole in the circular fitting part A166 and inside the shaft hole in the circular fitting part C166. In this way, the circular fitting part C166 becomes rotatable relative to the circular fitting part A166.

The shaft holes in the circular fitting parts A164, B164, A166, and C166 have circular cross-sectional shapes as viewed from directions in which the shaft holes in the circular fitting parts A164, B164, A166, and C166 extend respectively. The coupling rods 820 and 822 have circular cross-sectional shapes as viewed from directions in which the coupling rods 820 and 822 extend respectively.

The cooler A100 includes three circular fitting parts A164. By doing so, the cooler A100 is connected to the coupling rod 820 at three joints. This eliminates a cantilever shape, so that strength can be ensured at each of the joints.

Also, the cooler A100 includes three circular fitting parts A166. By doing so, the cooler A100 is connected to the coupling rod 822 at three joints. This eliminates a cantilever shape, so that strength can be ensured at each of the joints. The cooler B100 includes three circular fitting parts B164. By doing so, the cooler B100 is connected to the coupling rod 820 at three joints. This eliminates a cantilever shape, so that strength can be ensured at each of the joints. Further, the cooler C100 includes three circular fitting parts C166. By doing so, the cooler C100 is connected to the coupling rod 822 at three joints. This eliminates a cantilever shape, so that strength can be ensured at each of the joints.

Figure 36A:
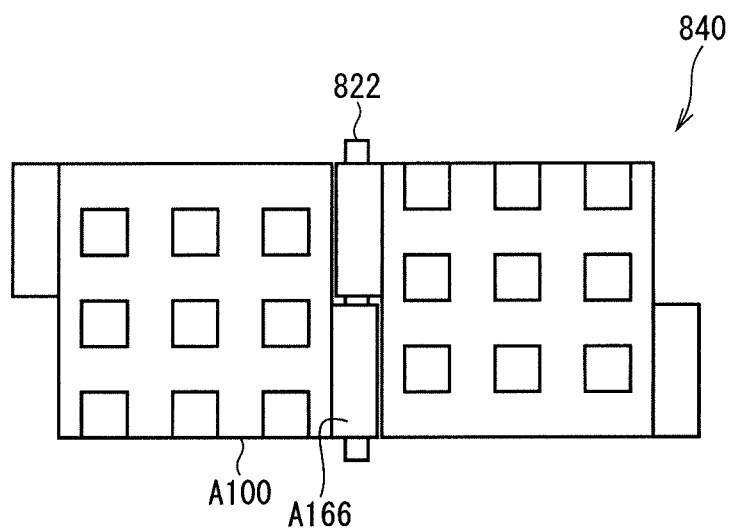
FIGS. 36A and 36B are top views schematically illustrating a cooling device according to a modification of the eighth embodiment.
Figure 36B:
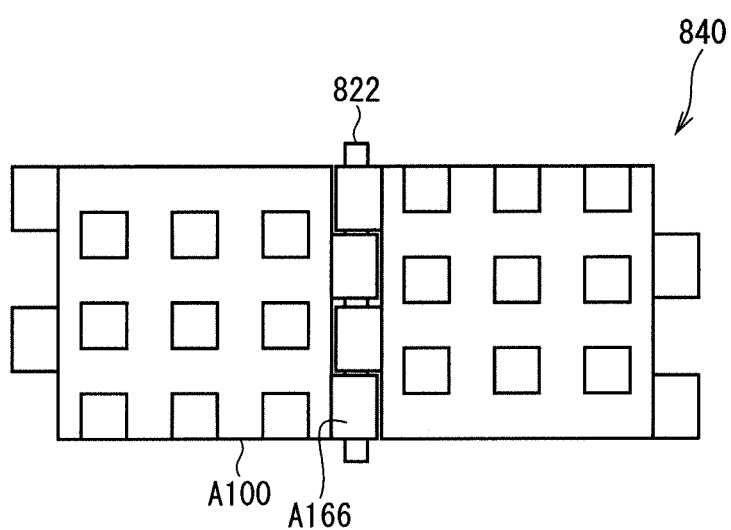

FIGS. 36A and 36B are top views schematically illustrating a cooling device 840 according to a modification of the eighth embodiment.

In the cooling device 840 illustrated in FIG. 36A, the cooler A100 includes one circular fitting part A166 and is connected to the coupling rod 822 at one joint. Connection is formed at one joint, mainly if the cooler A100 is compact in size. This is also applicable to the coolers B100 and C100.

In the cooling device 840 illustrated in FIG. 36B, the cooler A100 includes two circular fitting parts A166 and is connected to the coupling rod 822 at one joint. This also eliminates a cantilever shape, so that strength can be ensured at each joint. This is also applicable to a case where the cooler A100 is connected to the coupling rod 822 at three or more joints. This is also applicable to the coolers B100 and C100.

In plan views of the base plates A110 and B110 taken from directions in which the blade coupling surfaces A114 and B114 are pointed respectively, when the center A160 of the base plate A110 and the center B160 of the base plate B110 are matched to each other, the blades B112 are brought into point symmetry with the blades A112 with respect to the center A160 of the base plate A110 and the center B160 of the base plate B110. For this reason, the blades B112 are obtained by rotating the blades A112 180° about the center A160 of the base plate A110 as viewed from the direction in which the blade coupling surface A114 is pointed.

Likewise, in plan views of the base plates A110 and C110 taken from directions in which the blade coupling surfaces A114 and C114 are pointed respectively, when the center A160 of the base plate A110 and the center C160 of the base plate C110 are matched to each other, the blades C112 are brought into point symmetry with the blades A112 with respect to the center A160 of the base plate A110 and the center C160 of the base plate C110. For this reason, the blades C112 are obtained by rotating the blades A112 180° about the center A160 of the base plate A110 as viewed from the direction in which the blade coupling surface A114 is pointed.

Also, in plan views of the base plates A110 and B110 taken from directions in which the blade coupling surfaces A114 and B114 are pointed respectively, when the center A160 of the base plate A110 and the center B160 of the base plate B110 are matched to each other, the circular fitting parts B164 and B168 are brought into point symmetry with the circular fitting parts A164 and A166 respectively with respect to the center A160 of the base plate A110 and the center of the base plate B110. For this reason, the circular fitting parts B164 and B168 are obtained by rotating the circular fitting parts A164 and A166 180° about the center A160 of the base plate A110 as viewed from the direction in which the blade coupling surface A114 is pointed.

Likewise, in plan views of the base plates A110 and C110 taken from directions in which the blade coupling surfaces A114 and C114 are pointed respectively, when the center A160 of the base plate A110 and the center C160 of the base plate C110 are matched to each other, the circular fitting parts C166 and C170 are brought into point symmetry with the circular fitting parts A166 and A164 respectively with respect to the center A160 of the base plate A110 and the center C160 of the base plate C110. For this reason, the circular fitting parts C166 and C170 are obtained by rotating the circular fitting parts A166 and A164 180° about the center A160 of the base plate A110 as viewed from the direction in which the blade coupling surface A114 is pointed.

As a result, the coolers B100 and C100 are given the same shape as the cooler A100.

An exemplary method of manufacturing the cooling device 800 will be described below.

FIGS. 37A to 37F schematically illustrate the extruded coolers A130, B130, and C130 formed during manufacture of the cooling device 800 according to the eighth embodiment. FIGS. 37A, 37B, and 37C are top views. FIGS. 37D, 37E, and 37F are front views.

During manufacture of the cooling device 800, the extruded cooler A130 illustrated in FIGS. 37B and 37E, the extruded cooler B130 illustrated in FIGS. 37A and 37D, and the extruded cooler C130 illustrated in FIGS. 37C and 37F are formed by extrusion. The resultant extruded coolers A130, B130, and C130 have the same shape. Thus, only one type of mold for extrusion is sufficient for forming the extruded coolers A130, B130 and C130 by the extrusion.

The extruded cooler A130 includes the base plate A110, extruded blades A132, an extruded circular fitting part A172, and an extruded circular fitting part A174. The extruded cooler B130 includes the base plate B110, extruded blades B132, an extruded circular fitting part B172, and an extruded circular fitting part B176. The extruded cooler C130 includes the base plate C110, extruded blades C132, an extruded circular fitting part C174, and an extruded circular fitting part C178. The extruded blades A132, B132, and C132 each have a shape like a flat plate obtainable by extrusion. The extruded circular fitting parts A172, A174, B172, B176, C174, and C178 each have a cylindrical shape that can be formed by extrusion. The base plate A110 has one end to which the extruded circular fitting part A172 is coupled. The base plate A110 has the other end to which the extruded circular fitting part A174 is coupled. The base plate B110 has one end to which the extruded circular fitting part B172 is coupled. The base plate B110 has the other end to which the extruded circular fitting part B176 is coupled. If the circular fitting part B168 is omitted as described above, the extruded circular fitting part B172 is omitted. The base plate C110 has one end to which the extruded circular fitting part C174 is coupled. The base plate C110 has the other end to which the extruded circular fitting part C178 is coupled. If the circular fitting part C170 is omitted as described above, the extruded circular fitting part C174 is omitted.

The extruded coolers A130, B130, and C130 are made of the same material as the extruded coolers A130, B130, and C130 prepared during manufacture of the cooling device 100 according to the first embodiment.

Figure 38A:
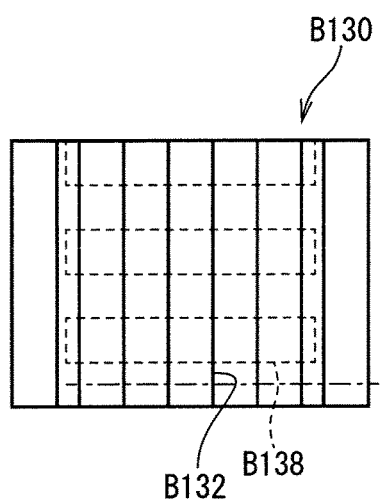
FIGS. 38A to 38C are top views schematically showing pin working on an extruded blade during manufacture of the cooling device according to the eighth embodiment.
Figure 38B:
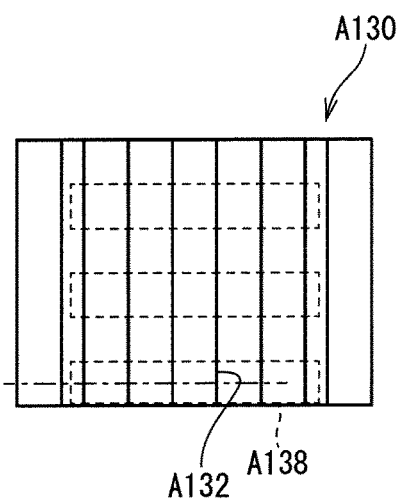
Figure 38C:
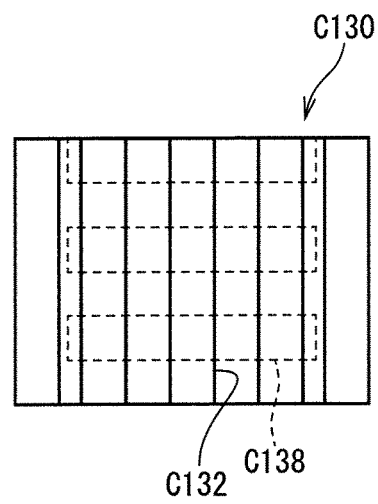

FIGS. 38A to 38C are top views schematically showing pin working on the extruded blades A132, B132, and C132 during manufacture of the cooling device 800 according to the eighth embodiment.

After formation of the extruded blades A132, B132, and C132 illustrated in FIGS. 38B, 38A, and 38C respectively, cutting is performed to cut regions A138, B138, and C138 in the extruded blades A132, B132, and C132 respectively with a cutter. As a result, blades A112, B112, and C112 having pin-like shapes are formed. Then, pin-worked coolers A140, B140, and C140 including the blades A112, B112, and C112 respectively are formed (FIGS. 39A to 39D).

The blades A112, B112, and C112 have the same shapes as the blades A112, B112, and C112 respectively formed during manufacture of the cooling device 100 according to the first embodiment.

As described above, the blades B112 and C112 are obtained by rotating the blades A112 180° about the center A160 of the base plate A110 as viewed from the direction in which the blade coupling surface A114 is pointed. Thus, the pin-worked coolers A140, B140, and C140 can be formed by performing the same pin working on the extruded blades A132, B132, and C132 having the same shape, and rotating a pin-worked cooler prepared by implementation of the pin working on the extruded blades A132 180° as viewed from the direction in which the blade coupling surface A114 is pointed. As a result, only one type of pin working is sufficient for forming the pin-worked coolers A140, B140, and C140.

FIGS. 39A to 39D are top views schematically showing additional working on the extruded circular fitting parts A172, A174, B172, B176, C174, and C178 during manufacture of the cooling device 800 according to the eighth embodiment.

After formation of the pin-worked coolers A140, B140, and C140 illustrated in FIGS. 39B, 39A, and 39C respectively, additional working is performed on the extruded circular fitting parts A172, A174, B172, B176, C174, and C178. The additional working on the extruded circular fitting parts A172, A174, B172, B176, C174, and C178 may be performed before implementation of the pin working on the extruded blades A132, B132, and C132.

For implementation of the additional working on the extruded circular fitting parts A172, A174, B172, B176, C174, and C178, the extruded circular fitting parts A172, A174, B172, B176, C174, and C178 are subjected to cutting out.

For cutting out in the extruded circular fitting parts A172 and A174, a portion along a cutting line A144 is removed. By doing so, the circular fitting parts A164 and A166 remain unremoved to form the circular fitting parts A164 and A166.

Likewise, for cutting out in the extruded circular fitting parts B172 and B176, a portion along a cutting line B144 is removed. By doing so, the circular fitting parts B164 and B168 remain unremoved to form the circular fitting parts B164 and B168.

Also, for cutting out in the extruded circular fitting parts C174 and C178, a portion along a cutting line C144 is removed. By doing so, the circular fitting parts C166 and C170 remain unremoved to form the circular fitting parts C166 and C170.

As a result of the foregoing, the cooler A100 including the circular fitting parts A164 and A166, the cooler B100 including the circular fitting parts B164 and B168, and the cooler C100 including the circular fitting parts C166 and C170 are formed.

As described above, the circular fitting parts B164 and B168 are obtained by rotating the circular fitting parts A164 and A166 respectively 180° about the center A160 of the base plate A110 as viewed from the direction in which the blade coupling surface A114 is pointed. Further, the circular fitting parts C166 and C170 are obtained by rotating the circular fitting parts A166 and A164 respectively 180° about the center A160 of the base plate A110 as viewed from the direction in which the blade coupling surface A114 is pointed. Thus, the coolers A100, B100, and C100 can be formed by forming the pin-worked coolers A140, B140, and C140 having the same shape, performing the same cutting out in the extruded circular fitting parts A172 and A174, the extruded circular fitting parts B172 and B176, and the extruded circular fitting parts C174 and C178, and rotating a cooler prepared by implementation of the cutting out in the extruded circular fitting parts A172 and A174 180° as viewed from the direction in which the blade coupling surface A114 is pointed. As a result, only one type of cutting out is sufficient for forming the coolers A100, B100, and C100.

A play a1 and a play a2 illustrated in FIG. 39D exist between the circular fitting part A164 and the circular fitting part B164, and between the circular fitting part A166 and the circular fitting part C166. The plays a1 and a2 are similar to the plays a1 and a2 generated during manufacture of the cooling device 100 according to the first embodiment.

FIGS. 40A to 40D are top views schematically showing coupling between the coolers A100, B100, and C100 during manufacture of the cooling device 800 according to the eighth embodiment.

Figure 40A:
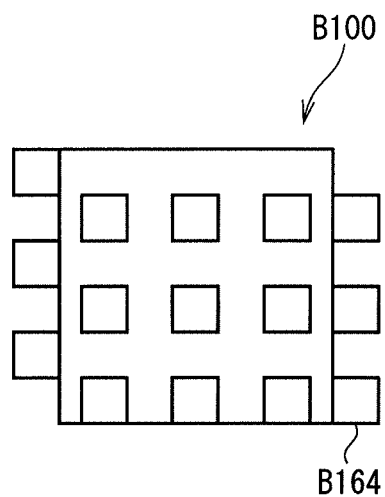
FIGS. 40A to 40D are top views schematically showing coupling between coolers during manufacture of the cooling device according to the eighth embodiment.
Figure 40B:
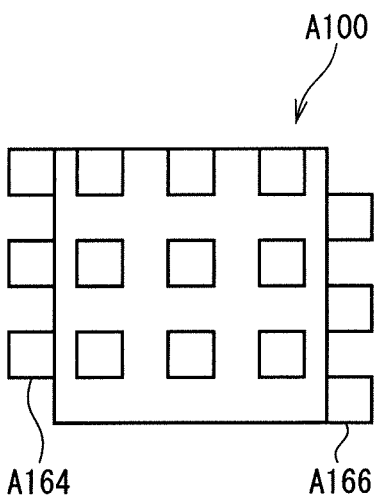
Figure 40C:
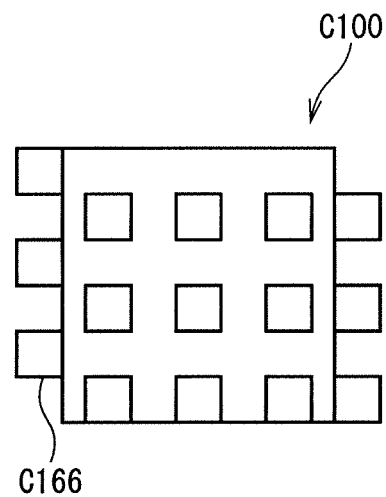
Figure 40D:
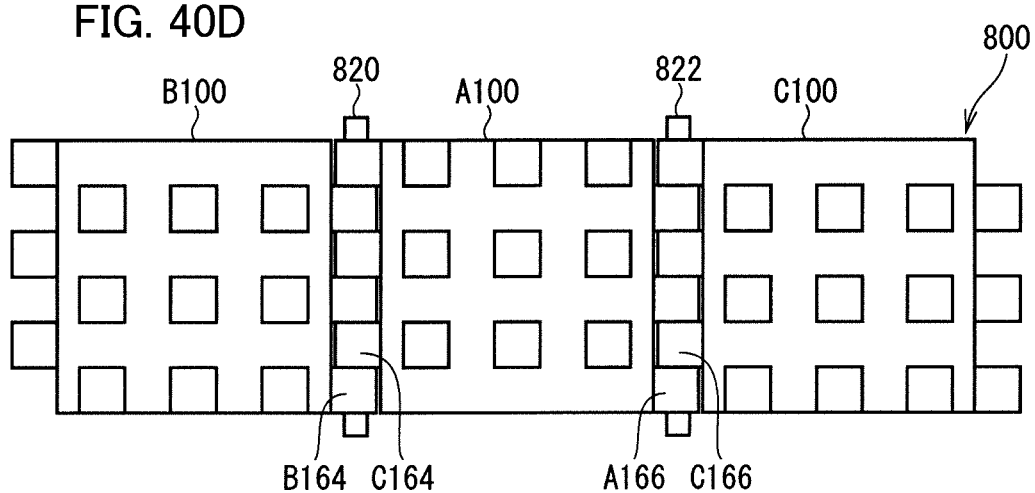

After formation of the coolers A100, B100, and C100 illustrated in FIGS. 40B, 40A, and 40C respectively, the coolers A100, B100, and C100 are coupled. As a result, the cooling device 800 in a semi-finished state illustrated in FIG. 40D is assembled.

For coupling of the cooler B100 to the cooler A100, the coolers A100 and B100 are arranged in a planar pattern to align the circular fitting parts A164 and B164. By doing so, the respective center axes of the shaft holes in the circular fitting parts A164 and B164 are matched to each other. Further, the coupling rod 820 is arranged on the respective center axes of the shaft holes in the circular fitting parts A164 and B164, moved toward the shaft holes in the circular fitting parts A164 and B164, and inserted into the shaft holes in the circular fitting parts A164 and B164. As a result, the cooler B100 is coupled to the cooler A100.

Likewise, for coupling of the cooler C100 to the cooler A100, the coolers A100 and C100 are arranged in a planar pattern to align the circular fitting parts A166 and C166. By doing so, the respective center axes of the shaft holes in the circular fitting parts A166 and C166 are matched to each other. Further, the coupling rod 822 is arranged on the respective center axes of the shaft holes in the circular fitting parts A166 and C166, moved toward the shaft holes in the circular fitting parts A166 and C166, and inserted into the shaft holes in the circular fitting parts A166 and C166. As a result, the cooler C100 is coupled to the cooler A100.

To prevent pulling out of the coupling rods 820 and 822, a retention member 860 illustrated in FIGS. 39A to 39D may be provided.

Figure 41A:
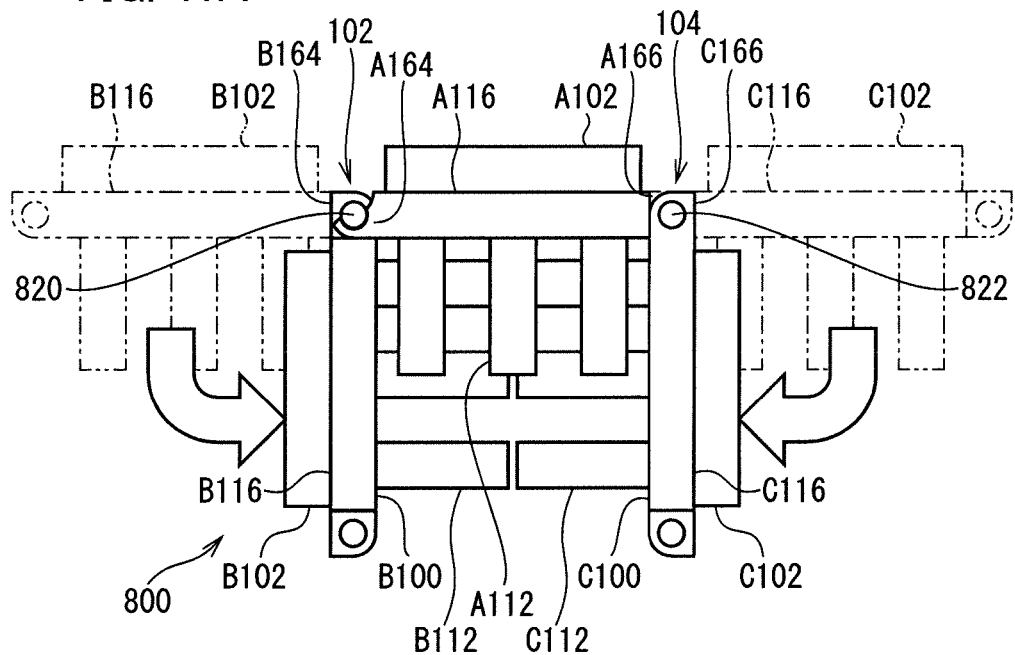
FIGS. 41A and 41B schematically show mounting of a heating component and assembling of the cooling device in a finished state during manufacture of the cooling device according to the eighth embodiment.
Figure 41B:
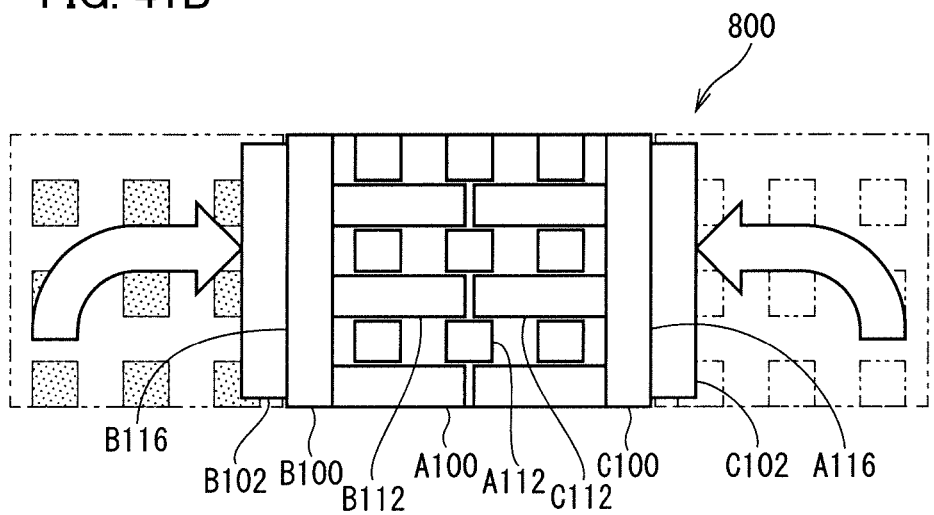

FIGS. 41A and 41B schematically show mounting of heating components A102, B102, and C102, and assembling of the cooling device 800 in a finished state during manufacture of the cooling device 800 according to the eighth embodiment. FIG. 41A is a front view. FIG. 41B is a bottom view.

After assembling of the cooling device 800 in a semi-finished state indicated by alternate long and two short dashed lines illustrated in FIGS. 41A and 41B, the heating components A102, B102, and C102 are mounted on the component mounting surfaces A116, B116, and C116 respectively. Further, components other than the heating components A102, B102, and C102 are mounted on the cooling device 800 in a semi-finished state. Then, the mounted components are electrically connected with wires. In this way, the electrically finished state is formed.

After mounting of the heating components A102, B102, and C102, the cooling device 800 in a finished state is assembled. For assembling of the cooling device 800 in a finished state, while the circular fitting parts A164 and B164 are fitted to the coupling rod 820, the circular fitting part B164 is rotated 90° inwardly relative to the circular fitting part A164. Further, while the circular fitting parts A166 and C166 are fitted to the coupling rod 822, the circular fitting part C166 is rotated 90° inwardly relative to the circular fitting part A166. In this way, rotary assembling is done by which the coolers B100 and C100 are rotated 90° relative to the cooler A100 using the rotary mechanisms 102 and 104 respectively as rotary axes. As a result, the cooling device 800 in a finished state is assembled in which the blades A112, B112, and C112 are arranged inside the cooling device 800. This forms a structurally finished state.

Like in manufacture of the cooling device 100 of the first embodiment, the manufacturing methods described in the section "1.9 Different example of method of manufacturing cooling device" are employed in manufacture of the cooling device 800 of the eighth embodiment.

The eighth embodiment achieves effect comparable to that achieved by the first embodiment.

In the eighth embodiment, the coolers A100, B100, and C100 can be formed by forming the extruded coolers A130, B130, and C130 having the same shape by extrusion, and performing the same machining on the extrusion on the resultant extruded coolers A130, B130, and C130. Thus, only one type of mold for extrusion is sufficient, and only use of setting for one type of machining is sufficient for forming the coolers A100, B100, and C100. This facilitates manufacture of the cooling device 800 and encourages cost reduction of the cooling device 800. This further encourages reduction in the occurrence of mixture of a cooler other than the coolers A100, B100 and C100 into a group of the coolers A100, B100, and C100. This also encourages reduction in the occurrence of a manufacturing mistake during machining. Further, this facilitates management of components forming the cooling device 800, encourages reduction in erroneous selection occurring in selecting a component to form the cooling device 800, and encourages reduction in a psychological burden on an administrator responsible for manufacturing management and a psychological burden on a worker responsible for manufacture.

In the eighth embodiment, the cooling device 800 can be assembled by forming an alternate configuration of a cooler not rotated 180° as viewed from a blade coupling surface and a cooler rotated 180° as viewed from the blade coupling surface, and then coupling the coolers A100, B100, and C100. This facilitates assembling of the cooling device 800.

In the eighth embodiment, even if each of the coolers A100, B100, and C100 receives force acting to cause each of the coolers A100, B100, and C100 to slide toward a cooler coupled to this cooler, the coupling rod 820, the coupling rod 822, the circular fitting part A164, the circular fitting part A166, the circular fitting part B164, and the circular fitting part C166 get snagged. Thus, sliding motion of each cooler toward a cooler coupled to this cooler is limited. In this way, the position of each cooler is maintained at a constant position. This encourages various works to be done easily on the cooling device 800 in a semi-finished state, making it possible to reduce the occurrence of a failed part. Additionally, the need for an alignment work for arranging the coolers in positions can be eliminated. Allowing reduction in the occurrence of a failed part and allowing elimination of the alignment work encourage reduction in a psychological burden on a worker responsible for assembling.

In the eighth embodiment, in constructing a manufacturing line, a measure for alignment to be taken by a part supplier can be simplified. This can reduce a burden on a person to construct the manufacturing line.

If rotary mechanisms same as the foregoing rotary mechanisms 102 and 104 are employed in a cooling device including a four-strand cooler, a first coupling rod, a second coupling rod, and a third coupling rod are inserted into corresponding ones of three coupling rod insertion positions of four coupling rod insertion positions to assemble the cooling device in a semi-finished state. The assembled cooling device in a semi-finished state is subjected to rotary assembling and then a fourth coupling rod is inserted into the remaining one coupling rod insertion position. As a result, formation the cooling device with an air passage is finished. In this case, blades are omissible from a fourth cooler, or a heating component may not be mounted on the fourth cooler. Namely, the fourth cooler may include only a base plate and a circular fitting part.

9 Ninth Embodiment

A ninth embodiment relates to a cooling device.

A cooling device 900 of a ninth embodiment described below differs from the cooling device 100 of the first embodiment in that the rotary mechanisms 102 and 140 provided in the cooling device 100 of the first embodiment are replaced with rotary mechanisms 102 and 104 described below respectively. The cooling device 900 of the ninth embodiment described below further differs from the cooling device 100 of the first embodiment in that the blades A112, B112, and C112 provided in the cooling device 100 of the first embodiment are replaced with blades A112, B112, and C112 described below respectively. The cooling device of the ninth embodiment described below further differs from the cooling device 100 of the first embodiment in that the cooler B100 further includes a male fitting part B188 and a female fitting part B190 described below, and the cooler C100 further includes a female fitting part C192 and a male fitting part C194 described below.

These differences will be described below. Regarding a structure not to be described below, a corresponding structure of the first embodiment is employed as it is or a modification of such a structure is employed in the ninth embodiment. A structure employed in an embodiment other than the first embodiment may be employed as it is or a modification of such a structure may be employed in the ninth embodiment.

Figure 42:
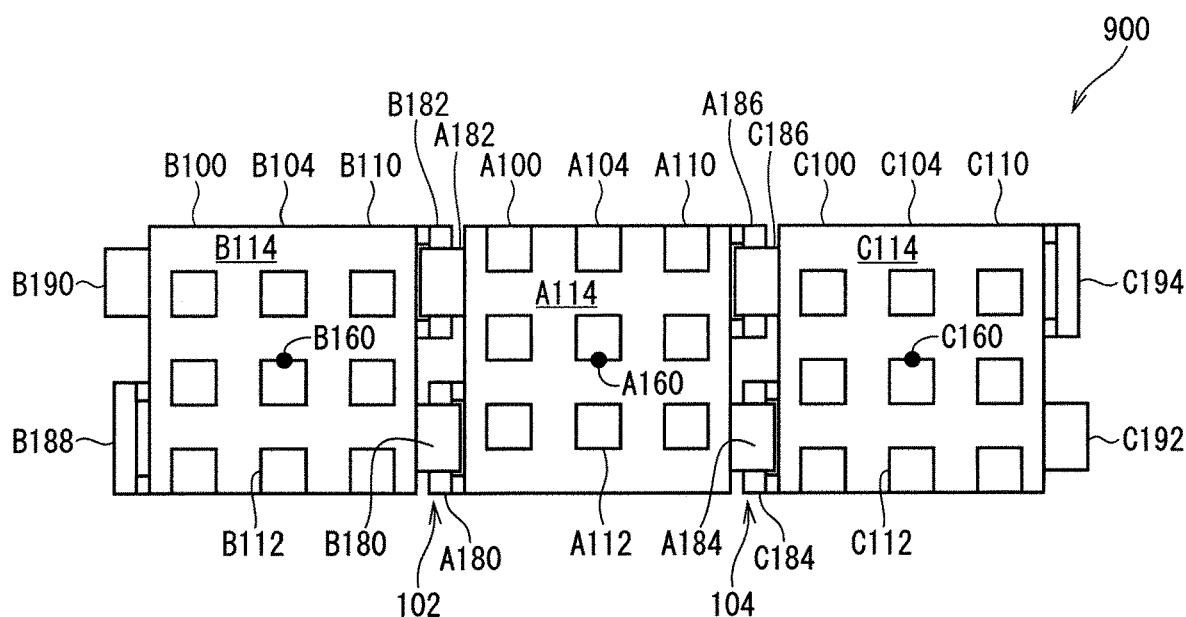
FIG. 42 is a top view schematically illustrating a cooling device according to a ninth embodiment.
Figure 43A:
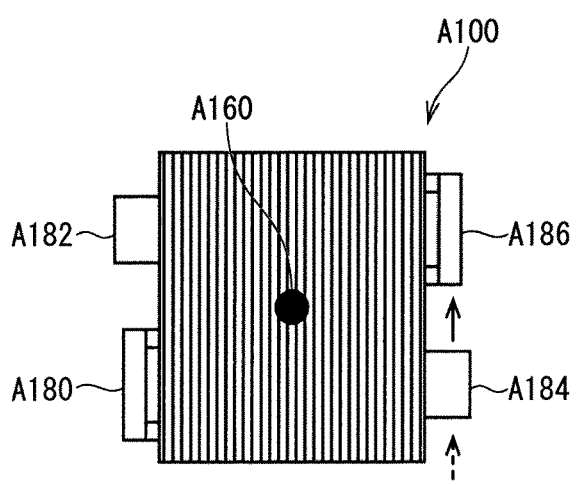
FIGS. 43A to 43D schematically illustrate a cooler provided in the cooling device according to the ninth embodiment.
Figure 43B:
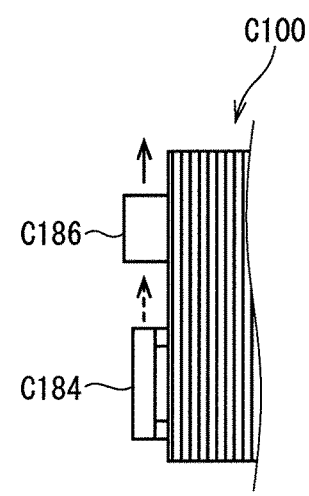
Figure 43C:
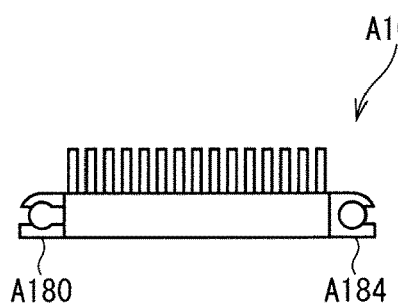
Figure 43D:
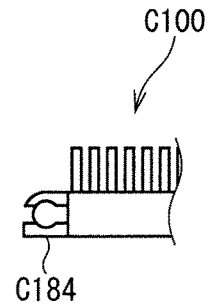
Figure 44A:
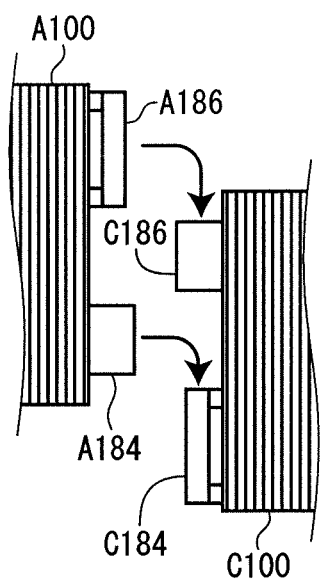
FIGS. 44A to 44C are enlarged top views schematically illustrating the cooler provided in the cooling device according to the ninth embodiment.
Figure 44B:
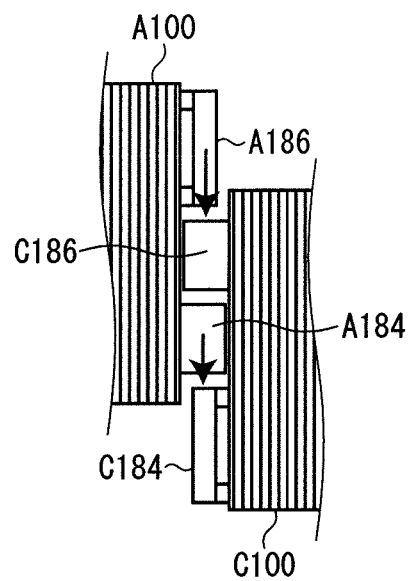
Figure 44C:
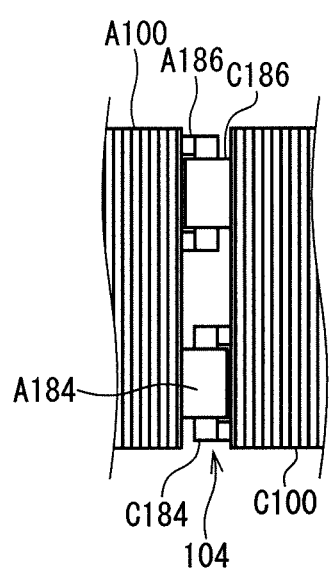

FIG. 42 is a top view schematically illustrating the cooling device 900 according to the ninth embodiment. FIGS. 43A to 43D schematically illustrate the coolers A100 and C100 provided in the cooling device 900 according to the ninth embodiment. FIGS. 43A and 43B are top views. FIGS. 43C and 43D are front views. FIGS. 44A to 44C are enlarged top views schematically illustrating the coolers A100 and C100 provided in the cooling device 900 according to the ninth embodiment.

The rotary mechanism 102 illustrated in FIG. 42 includes a male fitting part A180, a female fitting part A182, a female fitting part B180, and a male fitting part B182. The rotary mechanism 104 illustrated in FIGS. 42 and 44C includes a female fitting part A184, a male fitting part A186, a male fitting part C184, and a female fitting part C186. The cooler B100 illustrated in FIG. 42 further includes the male fitting part B188 and the female fitting part B190. The cooler C100 illustrated in FIG. 42 further includes the female fitting part C192 and the male fitting part C194.

The male fitting part A180 and the female fitting part A182 are coupled to one end of the base plate A110. The female fitting part A184 and the male fitting part A186 are coupled to the other end of the base plate A110. The female fitting part B180 and the male fitting part B182 are coupled to one end of the base plate B110. The male fitting part B188 and the female fitting part B190 are coupled to the other end of the base plate B110. The male fitting part C184 and the female fitting part C186 are coupled to one end of the base plate C110. The female fitting part C192 and the male fitting part C194 are coupled to the other end of the base plate C110. All or some of the male fitting part B188, the female fitting part B190, the female fitting part C192, and the male fitting part C194 are omissible.

The female fitting parts B180 and A182 are fitted to the male fitting parts A180 and B182 respectively. By doing so, the rotary mechanism 102 becomes functional to connect the cooler body B104 to the cooler body A104, thereby coupling the cooler B100 to the cooler A100. The female fitting parts B180 and A182 are rotatable relative to the male fitting parts A180 and B182 respectively while maintained fitted to the male fitting parts A180 and B182 respectively. By doing so, while the cooler body B104 is maintained connected to the cooler body A104, the rotary mechanism 102 becomes functional to allow the cooler body B104 to rotate relative to the cooler body A104 between a state in which the component mounting surfaces A116 and B116 are pointed to the same direction and a state in which the blades B112 get into gaps between the blades A112 without interfering with the blades A112.

Likewise, the female fitting parts A184 and C186 are fitted to the male fitting parts C184 and A186 respectively. By doing so, the rotary mechanism 104 becomes functional to connect the cooler body C104 to the cooler body A104, thereby coupling the cooler C100 to the cooler A100. The female fitting parts A184 and C186 are rotatable relative to the male fitting parts C184 and A186 respectively while maintained fitted to the male fitting parts C184 and A186 respectively. By doing so, while the cooler body C104 is maintained connected to the cooler body A104, the rotary mechanism 104 becomes functional to allow the cooler body C104 to rotate relative to the cooler body A104 between a state in which the component mounting surfaces A116 and C116 are pointed to the same direction and a state in which the blades C112 get into gaps between the blades A112 without interfering with the blades A112.

In plan views of the base plates A110 and B110 taken from directions in which the blade coupling surfaces A114 and B114 are pointed respectively, when the center A160 of the base plate A110 and the center B160 of the base plate B110 are matched to each other, the blades B112 are brought into point symmetry with the blades A112 with respect to the center A160 of the base plate A110 and the center B160 of the base plate B110. For this reason, the blades B112 are obtained by rotating the blades A112 180° about the center A160 of the base plate A110 as viewed from the direction in which the blade coupling surface A114 is pointed.

Likewise, in plan views of the base plates A110 and C110 taken from directions in which the blade coupling surfaces A114 and C114 are pointed respectively, when the center A160 of the base plate A110 and the center C160 of the base plate C110 are matched to each other, the blades C112 are brought into point symmetry with the blades A112 with respect to the center A160 of the base plate A110 and the center C160 of the base plate C110. For this reason, the blades C112 are obtained by rotating the blades A112 180° about the center A160 of the base plate A110 as viewed from the direction in which the blade coupling surface A114 is pointed.

Also, in plan views of the base plates A110 and B110 taken from directions in which the blade coupling surfaces A114 and B114 are pointed respectively, when the center A160 of the base plate A110 and the center B160 of the base plate B110 are matched to each other, the female fitting part B180, the male fitting part B182, the male fitting part B188, and the female fitting part B190 are brought into point symmetry with the female fitting part A182, the male fitting part A180, the male fitting part A186, and the female fitting part A184 respectively with respect to the center A160 of the base plate A110 and the center B160 of the base plate B110. For this reason, the female fitting part B180, the male fitting part B182, the male fitting part B188, and the female fitting part B190 are obtained by rotating the female fitting part A182, the male fitting part A180, the male fitting part A186, and the female fitting part A184 respectively 180° about the center A160 of the base plate A110 as viewed from the direction in which the blade coupling surface A114 is pointed.

Likewise, in plan views of the base plates A110 and C110 taken from directions in which the blade coupling surfaces A114 and C114 are pointed respectively, when the center A160 of the base plate A110 and the center C160 of the base plate C110 are matched to each other, the male fitting part C184, the female fitting part C186, the female fitting part C192, and the male fitting part C194 are brought into point symmetry with the male fitting part A186, the female fitting part A184, the female fitting part A182, and the male fitting part A180 respectively with respect to the center A160 of the base plate A110 and the center C160 of the base plate C110. For this reason, the male fitting part C184, the female fitting part C186, the female fitting part C192, and the male fitting part C194 are obtained by rotating the male fitting part A186, the female fitting part A184, the female fitting part A182, and the male fitting part A180 respectively 180° about the center A160 of the base plate A110 as viewed from the direction in which the blade coupling surface A114 is pointed.

As a result, the coolers B100 and C100 are given the same shape as the cooler A100.

A gap between the male fitting part A180 and the female fitting part A182 has a dimension allowing positioning of the female fitting part B180 or the male fitting part B182 in this gap. By doing so, before the female fitting parts B180 and A182 are fitted to the male fitting parts A180 and B182 respectively, shafts provided to the male fitting parts A180 and B182 can be arranged on the center axes of shaft holes in the female fitting parts B180 and A182 respectively.

Likewise, a gap between the female fitting part A184 and the male fitting part A186 has a dimension allowing positioning of the male fitting part C184 or the female fitting part C186 in this gap. Also, a gap between the female fitting part B180 and the male fitting part B182 has a dimension allowing positioning of the male fitting part A180 or the female fitting part A182 in this gap. Further, a gap between the male fitting part C184 and the female fitting part C186 has a dimension allowing positioning of the female fitting part A184 or the male fitting part A186 in this gap.

An exemplary method of manufacturing the cooling device 900 will be described below.

Figure 45A:
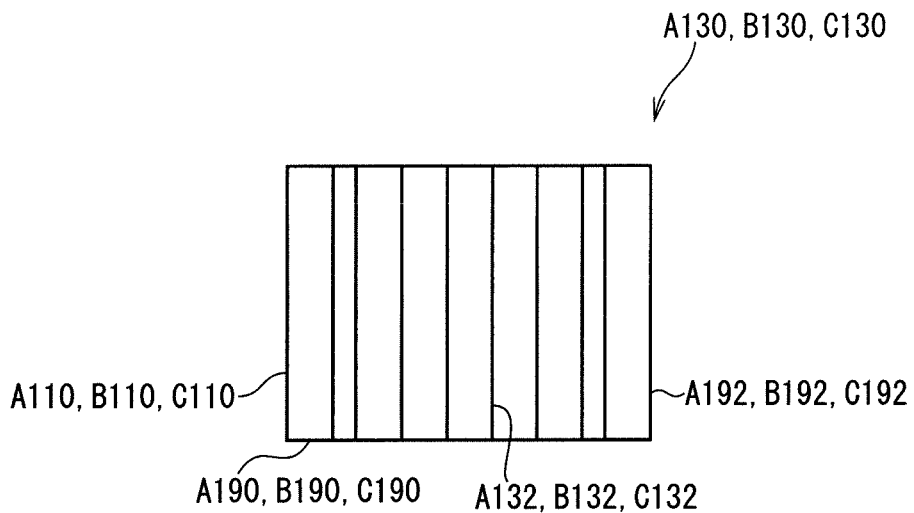
FIGS. 45A and 45B schematically illustrate each extruded cooler formed during manufacture of the cooling device according to the ninth embodiment.
Figure 45B:
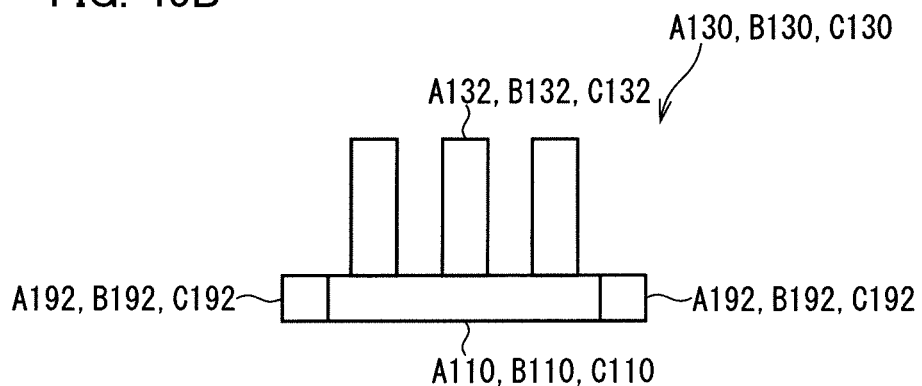

FIGS. 45A and 45B schematically illustrate an extruded cooler common to the extruded coolers A130, B130, and C130 formed during manufacture of the cooling device 900 according to the ninth embodiment. FIG. 45A is a top view. FIG. 45B is a front view.

During manufacture of the cooling device 900, the extruded coolers A130, B130, and C130 illustrated in FIGS. 45A and 45B are formed by extrusion. The resultant extruded coolers A130, B130, and C130 have the same shape. Thus, only one type of mold for extrusion is sufficient for forming the extruded coolers A130, B130, and C130 by the extrusion.

The extruded coolers A130, B130, and C130 include the base plates A110, B110, and C110 respectively, include the extruded blades A132, B132, and C132 respectively, include fitting part worked portions A190, B190, and C190 respectively, and include fitting part worked portions A192, B192, and C192 respectively. The extruded blades A132, B132, and C132 each have a shape like a flat plate obtainable by extrusion. Each of the fitting part worked portions A190, B190, and C190 is coupled to one end of a corresponding one of the base plates A110, B110, and C110. Each of the fitting part worked portions A192, B192, and C192 is coupled to a different end of a corresponding one of the base plates A110, B110, and C110.

The extruded coolers A130, B130, and C130 are made of the same material as the extruded coolers A130, B130, and C130 prepared during manufacture of the cooling device 100 according to the first embodiment.

Figure 46:
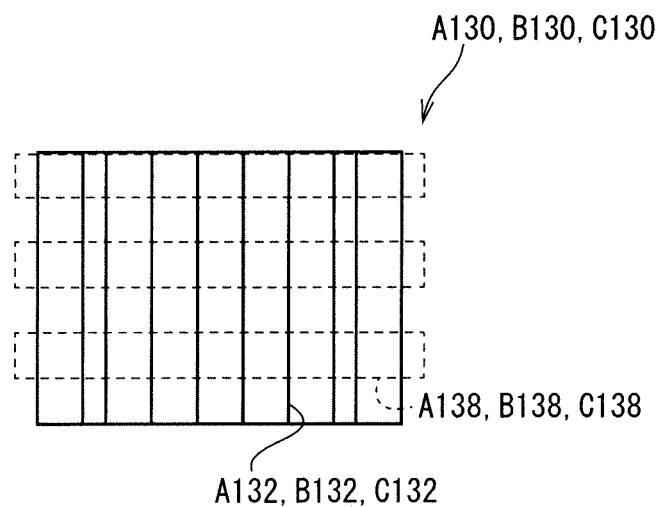
FIG. 46 is a top view schematically showing pin working on an extruded blade during manufacture of the cooling device according to the ninth embodiment.

FIG. 46 is a top view schematically showing pin working on the extruded blades A132, B132, and C132 during manufacture of the cooling device 900 according to the ninth embodiment.

After formation of the extruded coolers A130, B130, and C130 illustrated in FIG. 46, cutting is performed to cut regions A138, B138, and C138 in the extruded blades A132, B132, and C132 respectively with a cutter. As a result, blades A112, B112, and C112 having pin-like shapes are formed. Then, pin-worked coolers including corresponding ones of the blades A112, B112, and C112 are formed.

The blades A112, B112, and C112 have the same shapes as the blades A112, B112, and C112 respectively formed during manufacture of the cooling device 100 according to the first embodiment.

As described above, the blades B112 and C112 are obtained by rotating the blades A112 180° about the center A160 of the base plate A110 as viewed from the direction in which the blade coupling surface A114 is pointed. Thus, pin-worked coolers including corresponding ones of the blades A112, B112, and C112 can be formed by performing the same pin working on the extruded blades A132, B132, and C132 having the same shape, and rotating a pin-worked cooler prepared by implementation of the pin working on the extruded blades A132 180° as viewed from the direction in which the blade coupling surface A114 is pointed. As a result, only one type of pin working is sufficient for forming the pin-worked coolers including corresponding ones of the blades A112, B112, and C112.

Figure 47A:
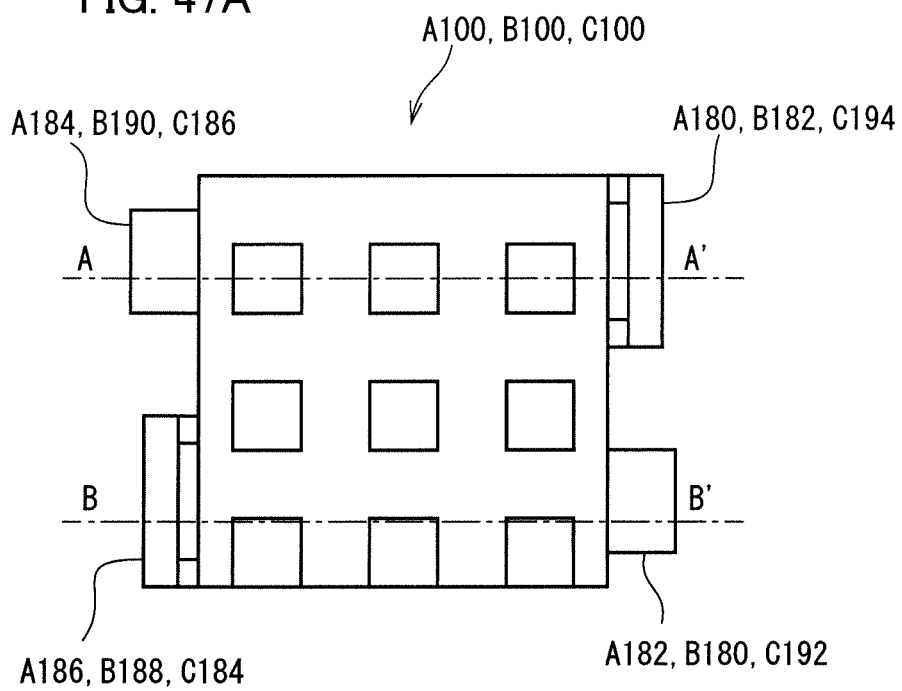
FIGS. 47A to 47C schematically show working on a fitting part worked portion during manufacture of the cooling device according to the ninth embodiment.
Figure 47B:
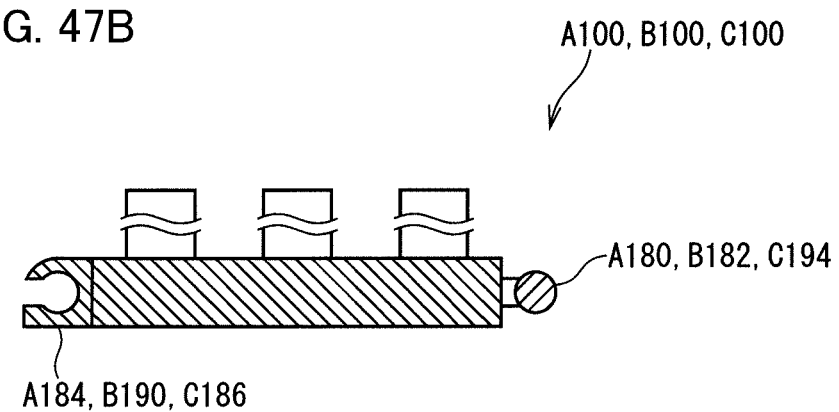
Figure 47C:
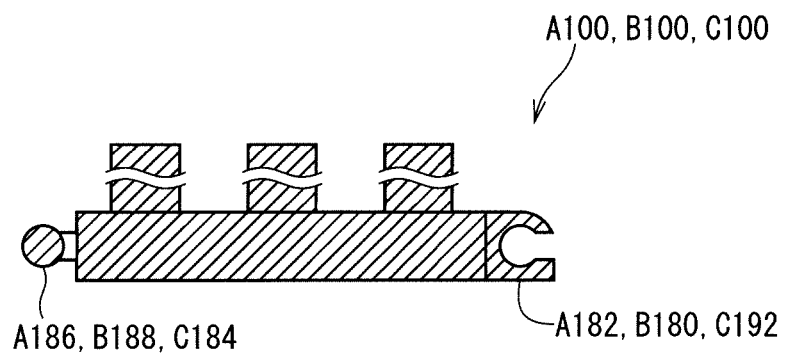

FIGS. 47A to 47C schematically show working on the fitting part worked portions A190, B190, C190, A192, B192, and C192 during manufacture of the cooling device 900 according to the ninth embodiment. FIG. 47A is a top view. FIG. 47B is a cross-sectional view taken at a position along a cutting line A-A in FIG. 47A. FIG. 47C is a cross-sectional view taken at a position along a cutting line B-B in FIG. 47A.

After formation of the pin-worked coolers including corresponding ones of the blades A112, B112, and C112, working is performed on the fitting part worked portions A190, B190, C190, A192, B192, and C192.

As a result, the male fitting part A180, the female fitting part A182, the female fitting part A184, the male fitting part A186, the female fitting part B180, the male fitting part B182, the male fitting part B188, the female fitting part B190, the male fitting part C184, the female fitting part C186, the female fitting part C192, and the male fitting part C194 are formed. Further, the cooler A100 including the male fitting part A180, the female fitting part A182, the female fitting part A184, and the male fitting part A186, the cooler B100 including the female fitting part B180, the male fitting part B182, the male fitting part B188, and the female fitting part B190, and the cooler C100 including the male fitting part C184, the female fitting part C186, the female fitting part C192, and the male fitting part C194 are formed.

The male fitting part A180, the female fitting part A182, the female fitting part A184, the male fitting part A186, the female fitting part B180, the male fitting part B182, the male fitting part B188, the female fitting part B190, the male fitting part C184, the female fitting part C186, the female fitting part C192, and the male fitting part C194 may be formed by a different method. For example, each of the male fitting part A180, the female fitting part A182, the female fitting part A184, the male fitting part A186, the female fitting part B180, the male fitting part B182, the male fitting part B188, the female fitting part B190, the male fitting part C184, the female fitting part C186, the female fitting part C192, and the male fitting part C194 may be formed independently from a cooler body to which this fitting part is to be coupled, and the resultant fitting part may be coupled to this cooler body.

As described above, the female fitting part B180, the male fitting part B182, the male fitting part B188, and the female fitting part B190 are obtained by rotating the female fitting part A182, the male fitting part A180, the male fitting part A186, and the female fitting part A184 respectively 180° about the center A160 of the base plate A110 as viewed from the direction in which the blade coupling surface A114 is pointed. Further, the male fitting part C184, the female fitting part C186, the female fitting part C192, and the male fitting part C194 are obtained by rotating the male fitting part A186, the female fitting part A184, the female fitting part A182, and the male fitting part A180 respectively 180° about the center A160 of the base plate A110 as viewed from the direction in which the blade coupling surface A114 is pointed. Thus, the coolers A100, B100, and C100 can be formed by forming pin-worked coolers having the same shape, performing the same working on the fitting part worked portions A190 and A192, on the fitting part worked portions B190 and B192, and on the fitting part worked portions C190 and C192, and rotating a cooler prepared by implementation of the working on the fitting part worked portions A190 and A192 180° as viewed from the direction in which the blade coupling surface A114 is pointed. As a result, only one type of working is sufficient for forming the coolers A100, B100, and C100.

9.1 Coupling Between Coolers

FIGS. 48A to 48D, 49A and 49B are top views schematically showing coupling between the coolers A100, B100, and C100 during manufacture of the cooling device 900 according to the ninth embodiment.

Figure 48A:
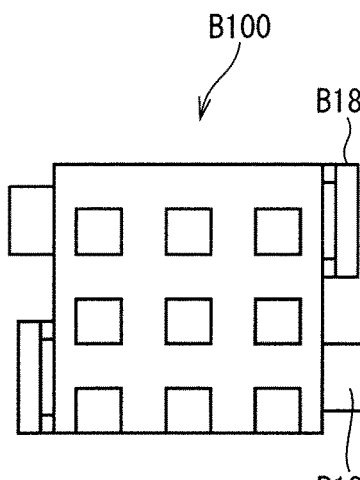
FIGS. 48A to 48D are top views schematically showing coupling between coolers during manufacture of the cooling device according to the ninth embodiment.
Figure 48B:
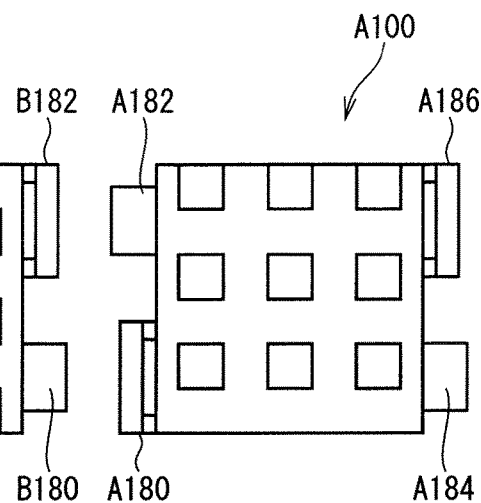
Figure 48C:
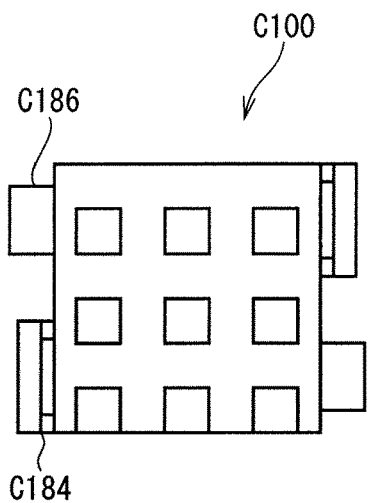
Figure 48D:
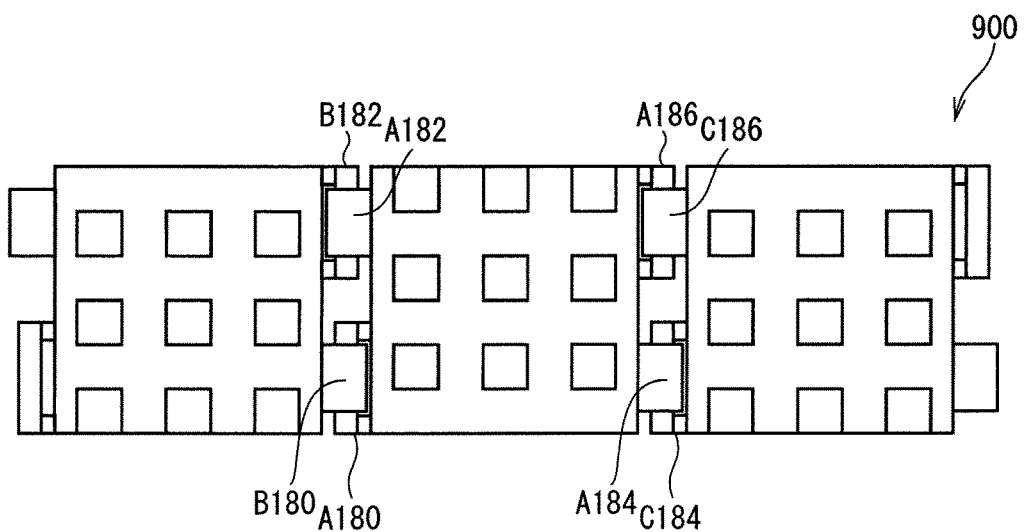

After formation of the coolers A100, B100, and C100 illustrated in FIGS. 48B, 48A, and 48C respectively, the coolers A100, B100, and C100 are coupled. As a result, the cooling device 900 in a semi-finished state illustrated in FIG. 48D is assembled.

For coupling of the cooler B100 to the cooler A100, respective shafts of the male fitting parts A180 and B182 are placed on the center axes of the shaft holes in the female fitting parts B180 and A182 respectively, moved toward the shaft holes in the female fitting parts B180 and A182 respectively, and inserted into the shaft holes in the female fitting parts B180 and A182 respectively. By doing so, the female fitting parts B180 and A182 are fitted to the male fitting parts A180 and B182 respectively. Then, the cooler B100 is coupled to the cooler A100.

Likewise, for coupling of the cooler C100 to the cooler A100, respective shafts of the male fitting parts A186 and C184 are placed on the center axes of shaft holes in the female fitting parts C186 and A184 respectively, moved toward the shaft holes in the female fitting parts C186 and A184 respectively, and inserted into the shaft holes in the female fitting parts C186 and A184 respectively. By doing so, the female fitting parts A184 and C186 are fitted to the male fitting parts C184 and A186 respectively. Then, the cooler C100 is coupled to the cooler A100.

In the cooling device 900 in a semi-finished state, the coolers A100, B100, and C100 are arranged in a planar pattern to align the coolers A100, B100, and C100.

Figure 49A:
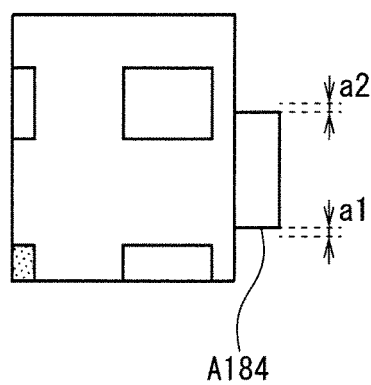
FIGS. 49A and 49B are top views schematically showing coupling between the coolers during manufacture of the cooling device according to the ninth embodiment.
Figure 49B:
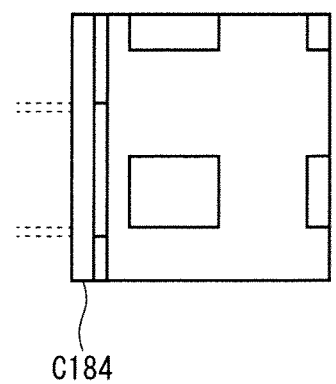

A play a1 and a play a2 illustrated in FIGS. 49A and 49B exist between the female fitting part A184 and a connection of the male fitting part C184, between the female fitting part B180 and a connection of the male fitting part A180, between the female fitting part A182 and a connection of the male fitting part B182, and between the female fitting part C186 and a connection of the male fitting part A186. The plays a1 and a2 are similar to the plays a1 and a2 generated during manufacture of the cooling device 100 according to the first embodiment.

Then, like in the first embodiment, the heating components A102, B102, and C102 are mounted on the component mounting surfaces A116, B116, and C116 respectively of the cooling device 900 in a semi-finished state. Further, the cooling device 900 in a finished state is assembled. This forms a structurally finished state.

Like in manufacture of the cooling device 100 of the first embodiment, the manufacturing methods described in the section "1.9 Different example of method of manufacturing cooling device" are employed in manufacture of the cooling device 900 of the ninth embodiment.

The ninth embodiment achieves effect comparable to that achieved by the first embodiment.

In the ninth embodiment, the coolers A100, B100, and C100 can be formed by forming the extruded coolers A130, B130, and C130 having the same shape by extrusion, and performing the same machining on the resultant extruded coolers A130, B130, and C130. Thus, only one type of mold for extrusion is sufficient, and only use of setting for one type of machining is sufficient for forming the coolers A100, B100, and C100. This facilitates manufacture of the cooling device 900 and encourages cost reduction of the cooling device 900. This further encourages reduction in the occurrence of mixture of a cooler other than the coolers A100, B100 and C100 into a group of the coolers A100, B100, and C100. This also encourages reduction in the occurrence of a manufacturing mistake during machining. Further, this facilitates management of components forming the cooling device 900, encourages reduction in erroneous selection occurring in selecting a component to form the cooling device 900, and encourages reduction in a psychological burden on an administrator responsible for manufacturing management and a psychological burden on a worker responsible for manufacture.

In the ninth embodiment, the cooling device 900 can be assembled by forming an alternate configuration of a cooler not rotated 180° as viewed from a blade coupling surface and a cooler rotated 180° as viewed from the blade coupling surface, and then coupling the coolers A100, B100, and C100. This facilitates assembling of the cooling device 900.

10 Tenth Embodiment

A tenth embodiment relates to a cooling device.

A cooling device 1000 of the tenth embodiment differs from the cooling device 100 of the first embodiment in that the blades A112, B112, and C112 provided in the cooling device 100 of the first embodiment are replaced with blades A112, B112, and C112 described below.

This difference will be described below. Regarding a structure not to be described below, a corresponding structure of the first embodiment is employed as it is or a modification of such a structure is employed in the tenth embodiment. A structure employed in an embodiment other than the first embodiment may be employed as it is or a modification of such a structure may be employed in the tenth embodiment.

Figure 50A:
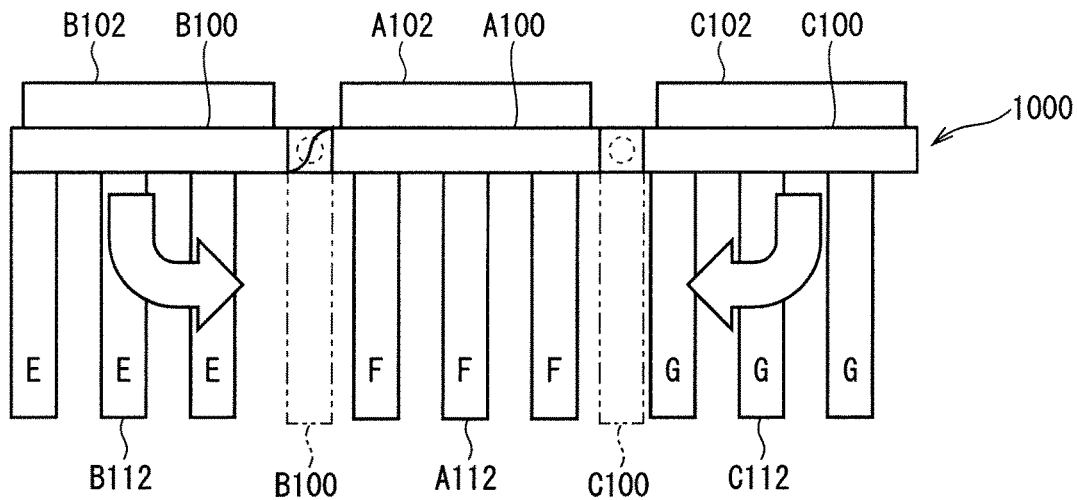
FIGS. 50A to 50C schematically illustrate a cooling device according to a tenth embodiment.
Figure 50B:
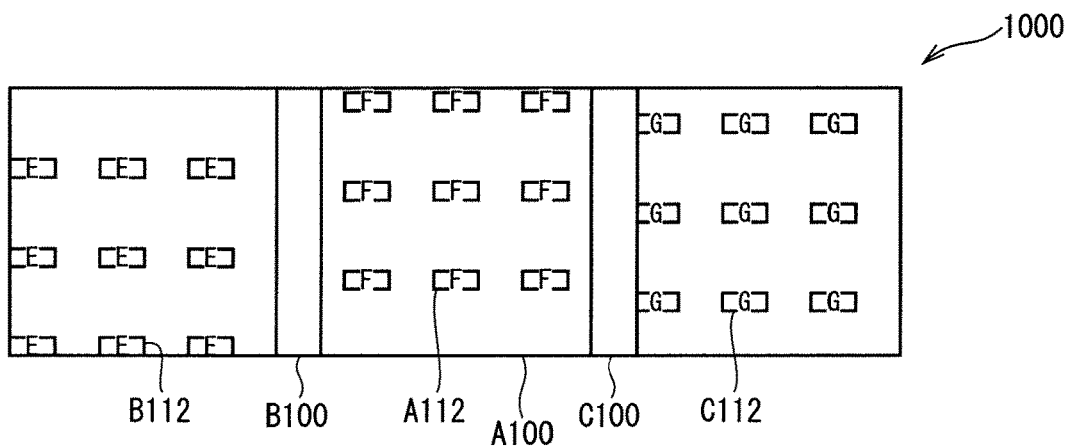
Figure 50C:
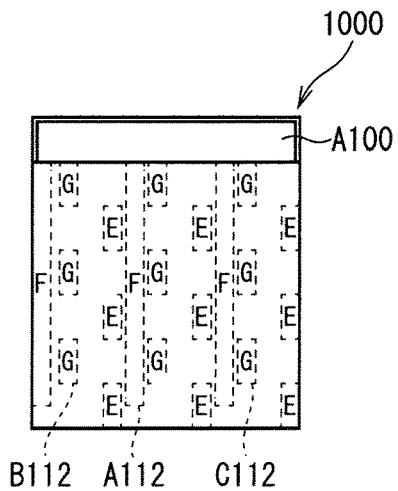

FIGS. 50A to 50C schematically illustrate the cooling device 1000 according to the tenth embodiment. FIG. 50A is a front view. FIG. 50B is a bottom view. FIG. 50C is a side view.

The blades A112, B112, and C112 illustrated in FIGS. 50A to 50C each have a pin-like shape.

The blades A112, B112, and C112 are greater in length than the blades A112, B112, and C112 respectively provided in the cooling device 100 of the first embodiment.

In the cooling device 1000 in a finished state, the blades B112 get into gaps between the blades A112 and do not interfere with the blades A112. Further, the blades C112 get into gaps between the blades A112 and do not interfere with the blades A112. Additionally, in the cooling device 1000 in a finished state, the blades C112 of the cooler C100 get into gaps between the blades B112 of the cooler B100 facing the cooler C100 and do not interfere with the blades B112. Further, the blades B112 of the cooler B100 get into gaps between the blades C112 of the cooler C100 facing the cooler B100 and do not interfere with the blades C112. As a result, the blades B112 and C112 are arranged in a central area between the cooler B100 and C100.

Desirably, the blades B112 and C112 each have the same length as a distance from the cooler B100 to the cooler C100. This can improve the cooling performance of each of the coolers B100 and C100.

The blades B112 and C112 are used preferably if a distance from the cooler B100 to the cooler C100 is short so the cooling performance of each of the coolers B100 and C100 achieved by the blades B112 and C112 provided in the cooling device 100 of the first embodiment is insufficient.

During manufacture of the cooling device 1000 of the tenth embodiment, three extruded coolers having basic shapes are formed by extrusion. Machining is performed on the three resultant extruded coolers. As a result, the coolers A100, B100, and C100 are formed.

Then, the coolers A100, B100, and C100 are coupled to assemble the cooling device 1000 into a semi-finished state.

Figure 51A:
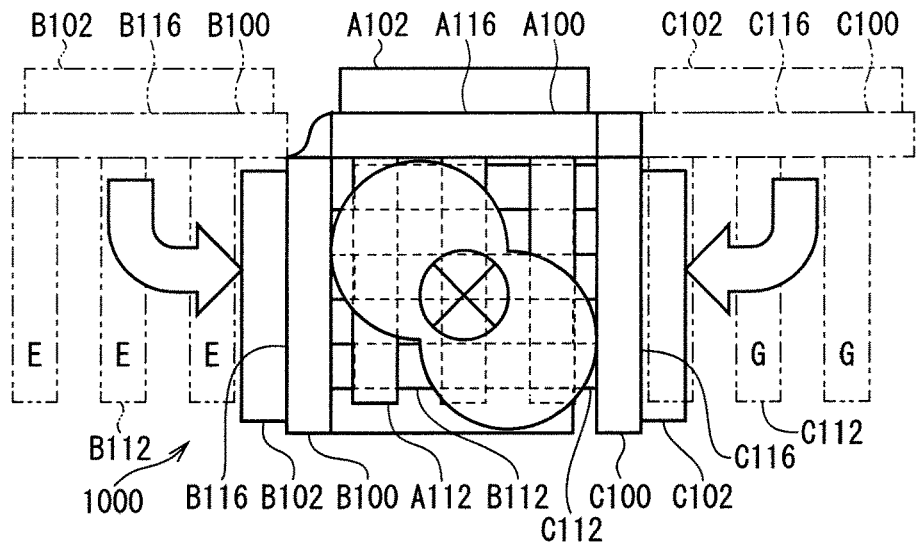
FIGS. 51A to 51C schematically show mounting of a heating component and assembling of the cooling device in a finished state during manufacture of the cooling device according to the tenth embodiment.
Figure 51B:
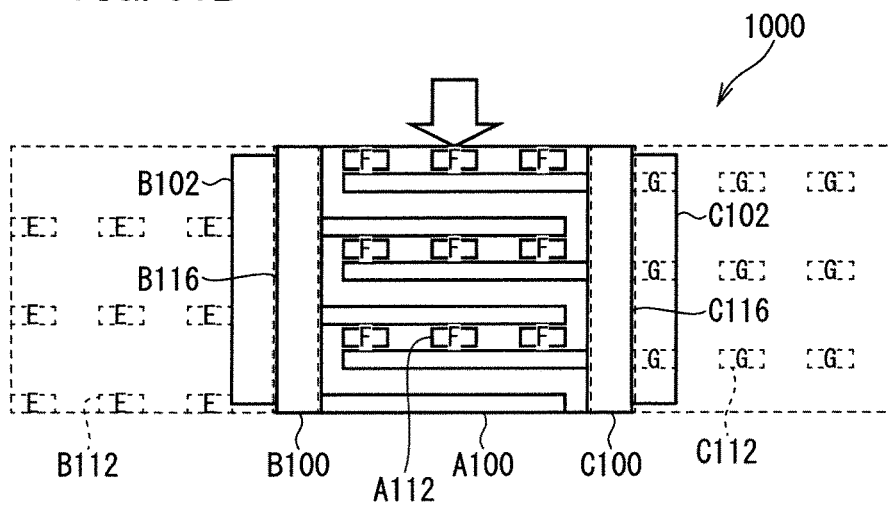
Figure 51C:
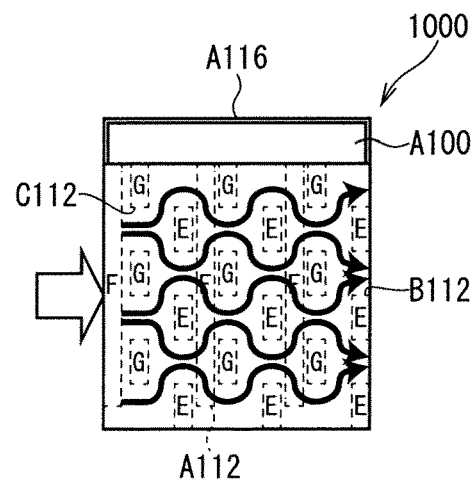

FIGS. 51A to 51C schematically show mounting of the heating components A102, B102, and C102, and assembling of the cooling device 1000 in a finished state during manufacture of the cooling device according to the tenth embodiment. FIG. 51A is a front view. FIG. 51B is a bottom view. FIG. 51C is a side view.

As illustrated in FIGS. 51A to 51C, after assembling of the cooling device 1000 in a semi-finished state, the heating components A102, B102, and C102 are mounted on the component mounting surfaces A116, B116, and C116 respectively. Further, components other than the heating components A102, B102, and C102 are mounted on the cooling device 1000 in a semi-finished state. Then, the mounted components are electrically connected with wires. In this way, the electrically finished state is formed. The cooling device 1000 in a semi-finished state is subjected to rotary assembling to assemble the cooling device 1000 into a finished state. This forms a structurally finished state. In the cooling device in a finished state, the blades A112, B112, and C112 are arranged so as not to overlap each other to form a wind tunnel configuration.

Like in manufacture of the cooling device 100 of the first embodiment, the manufacturing methods described in the section "1.9 Different example of method of manufacturing cooling device" are employed in manufacture of the cooling device 1000 of the tenth embodiment.

The tenth embodiment achieves effect comparable to that achieved by the first embodiment.

In the tenth embodiment, even if a distance from the cooler B100 to the cooler C100 is short, the lengths of the blades B112 and C112 can be ensured to allow improvement of the cooling performance of each of the coolers B100 and C100.

Figure 52A:
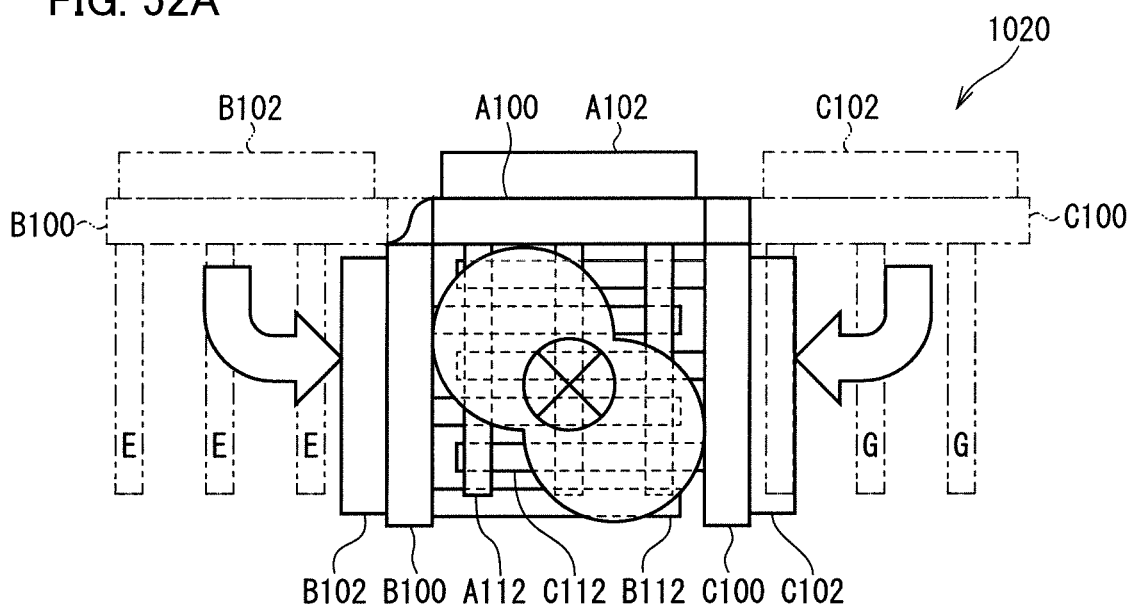
FIGS. 52A to 52C schematically illustrate mounting of a heating component and assembling of a cooling device in a finished state during manufacture of the cooling device according to a first modification of the tenth embodiment.
Figure 52B:
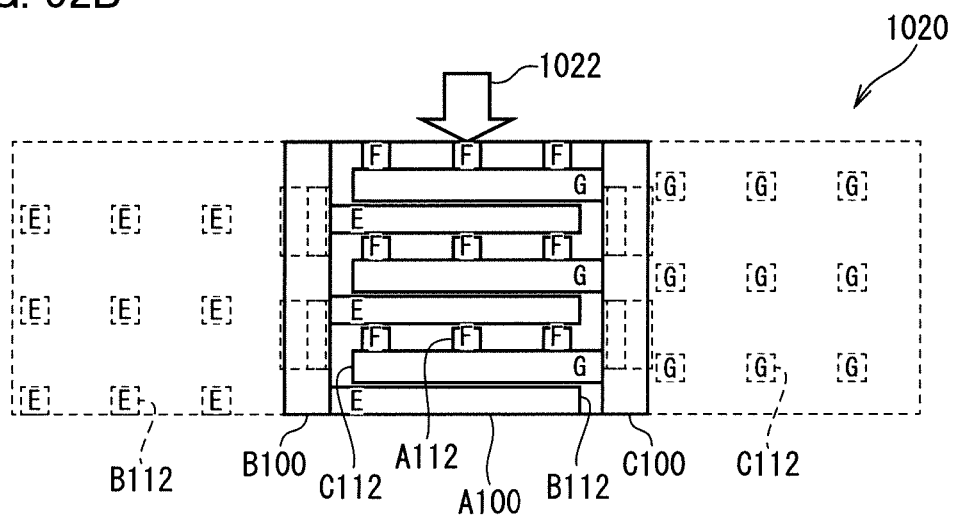
Figure 52C:
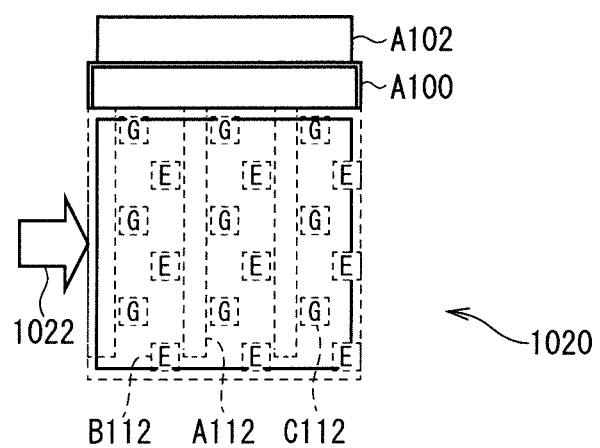

FIGS. 52A to 52C schematically show mounting of the heating components A102, B102, and C102, and assembling of a cooling device 1020 in a finished state during manufacture of the cooling device 1020 according to a first modification of the tenth embodiment. FIG. 52A is a front view. FIG. 52B is a bottom view. FIG. 52C is a side view.

As illustrated in FIGS. 52A to 52C, the blades A112, B112, and C112 each have a rectangular planar shape. The width of the rectangular planar shape is adjusted in response to the amount of heat to be generated by the heating components A102, B102, and C102. This reduces pressure loss to be caused during forced air cooling to allow optimized design of the cooling device 1020.

Figure 53A:
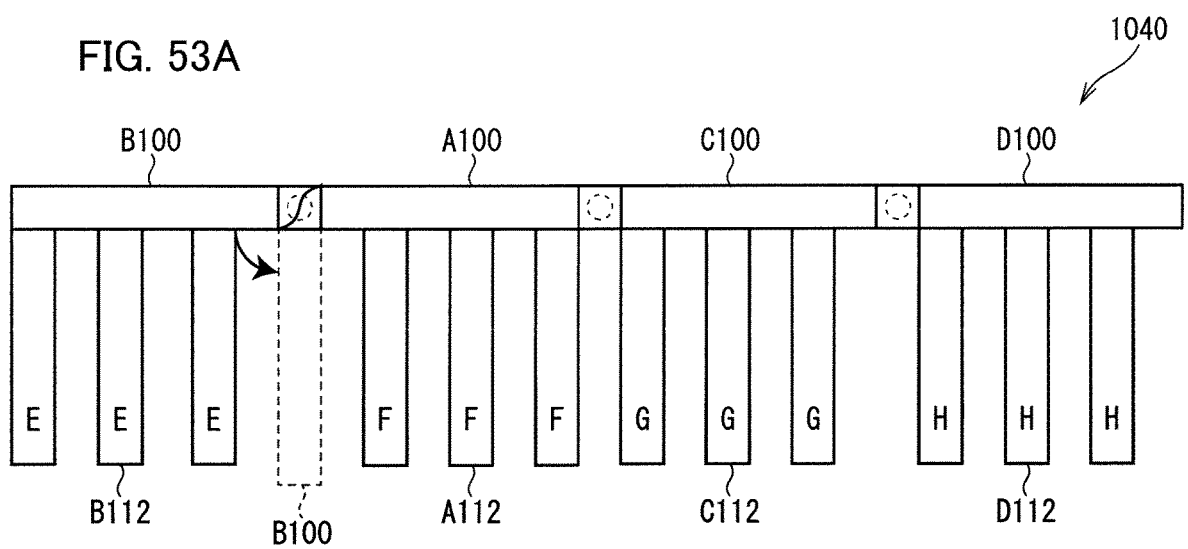
FIGS. 53A to 53C schematically illustrate a cooling device according to a second modification of the tenth embodiment.
Figure 53B:
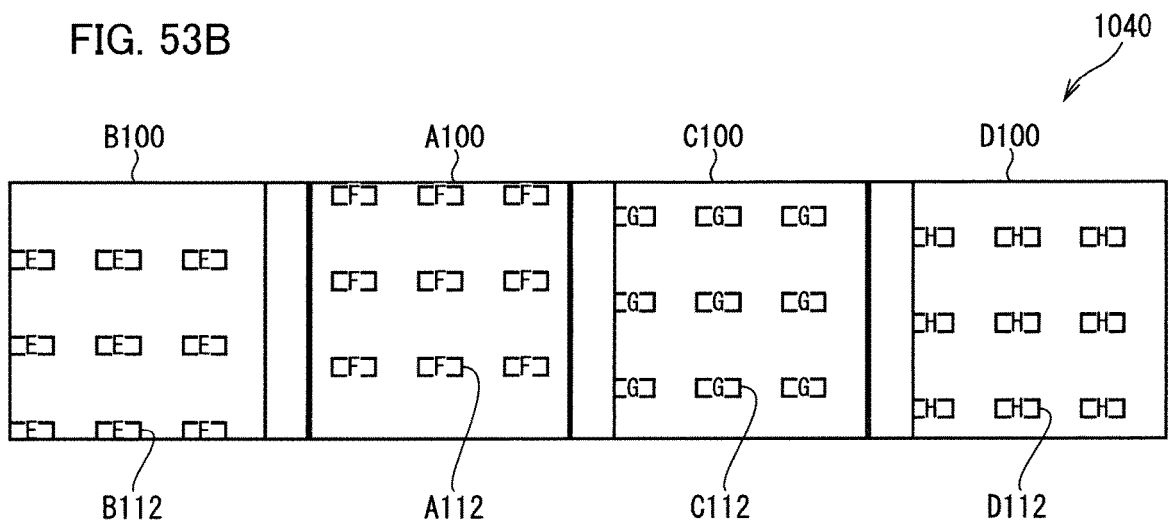
Figure 53C:
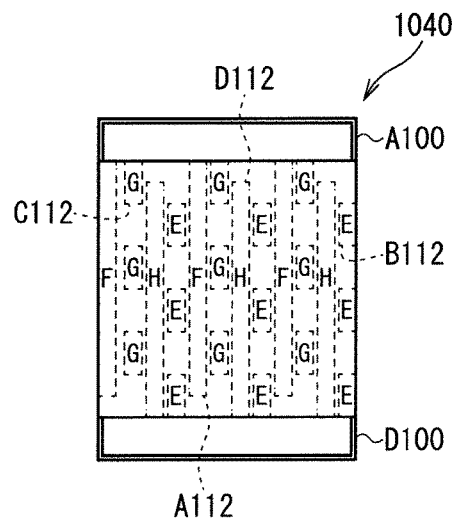

FIGS. 53A to 53C schematically illustrate a cooling device 1040 according to a second modification of the tenth embodiment. FIG. 53A is a front view. FIG. 53B is a bottom view. FIG. 53C is a side view.

As illustrated in FIGS. 53A to 53C, the cooling device 1040 according to the second modification of the tenth embodiment includes a four-strand cooler including coolers A100, B100, C100, and D100. The coolers A100, B100, C100, and D100 include blades A112, B112, C112, and D112 respectively. The blades A112 of the cooler A100 get into gaps between the blades D112 of the cooler D100 facing the cooler A100 and do not interfere with the blades D112. Further, the blades D112 get into gaps between the blades A112 and do not interfere with the blades A112. The blades A112 are arranged between the blades B112 and the blades C112.

11 Eleventh Embodiment

An eleventh embodiment relates to a cooling device.

A cooling device 1100 of the eleventh embodiment differs from the cooling device 100 of the first embodiment in that the blades A112, B112, and C112 provided in the cooling device 100 of the first embodiment are replaced with blades A112, B112, and C112 described below.

This difference will be described below. Regarding a structure not to be described below, a corresponding structure of the first embodiment is employed as it is or a modification of such a structure is employed in the eleventh embodiment. A structure employed in an embodiment other than the first embodiment may be employed as it is or a modification of such a structure may be employed in the eleventh embodiment.

FIGS. 54A to 57 show adjustment of cooling performance in the cooling device according to the eleventh embodiment.

Figure 54A:
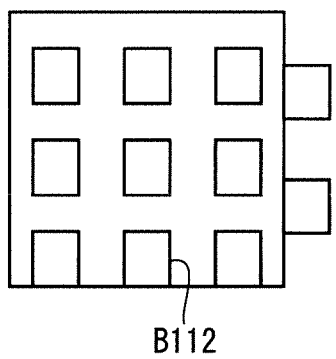
FIGS. 54A to 54C show adjustment of cooling performance in a cooling device according to an eleventh embodiment.
Figure 54B:
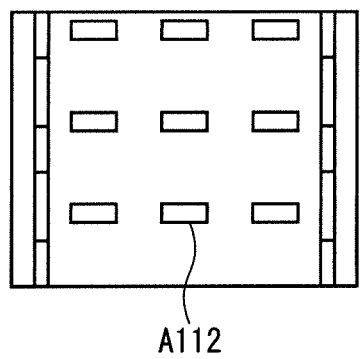
Figure 54C:
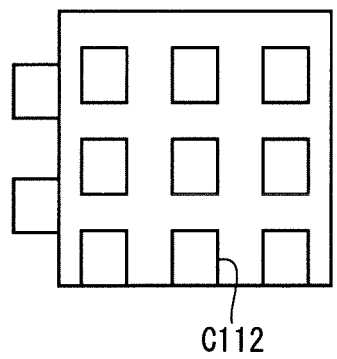
Figure 55:
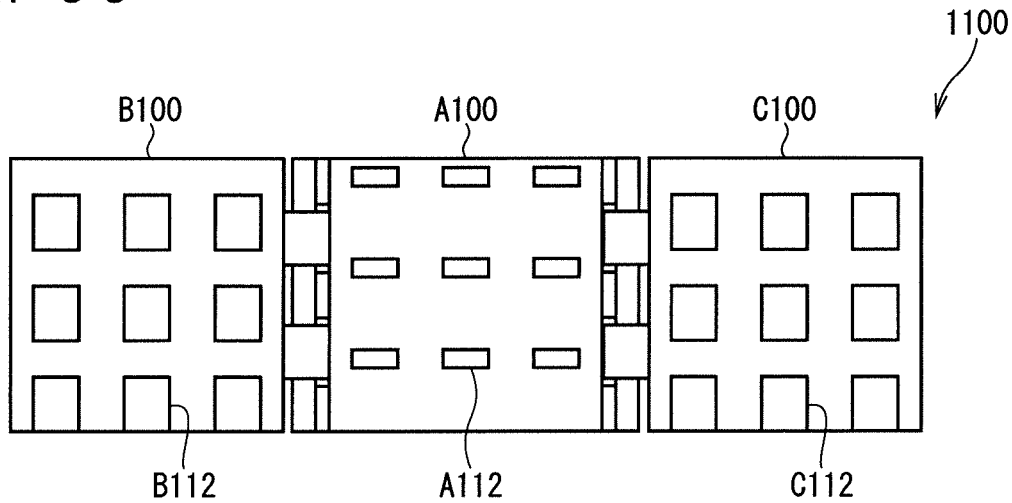
FIG. 55 shows adjustment of cooling performance in the cooling device according to the eleventh embodiment.
Figure 56:
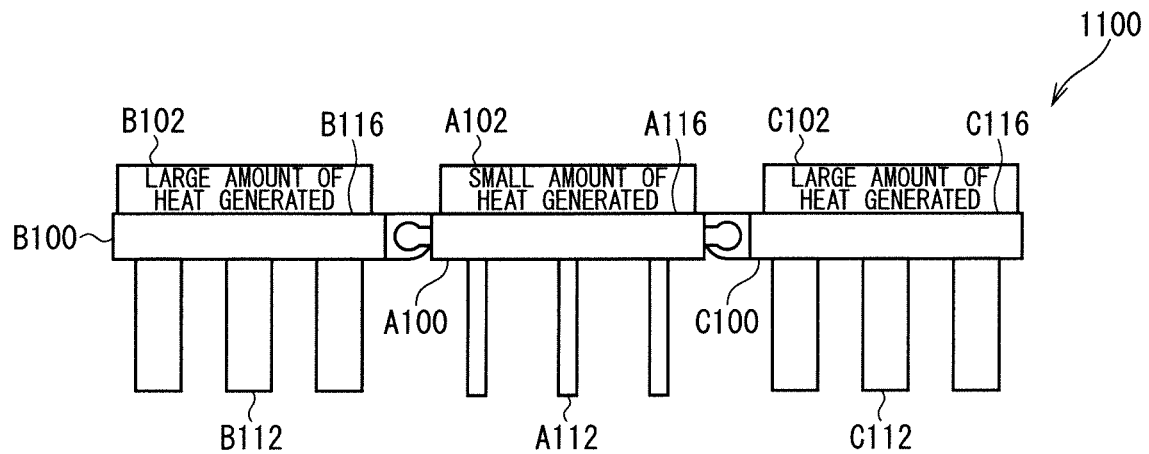
FIG. 56 shows adjustment of cooling performance in the cooling device according to the eleventh embodiment.
Figure 57:
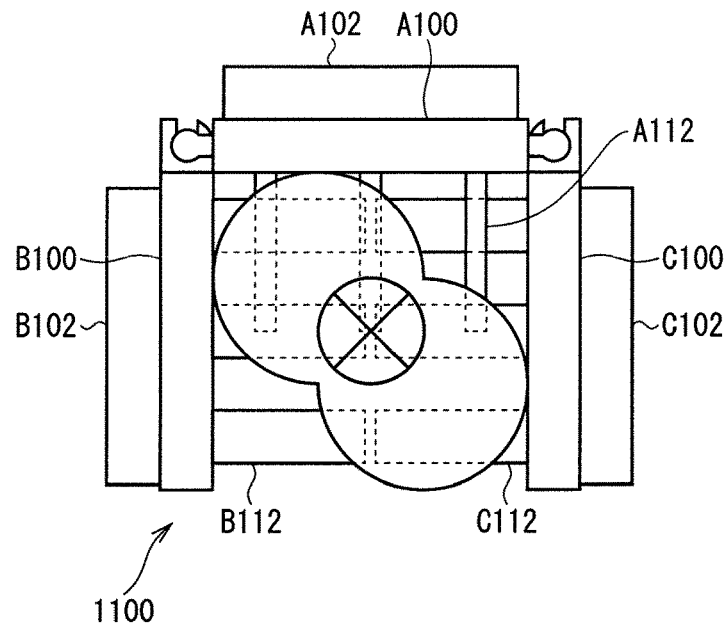
FIG. 57 shows adjustment of cooling performance in the cooling device according to the eleventh embodiment.

During manufacture of the cooling device 1100 of the eleventh embodiment, the coolers A100, B100, and C100 illustrated in FIGS. 54A to 54C are formed. Then, the prepared coolers A100, B100, and C100 are coupled to assemble the cooling device 1100 into a semi-finished state illustrated in FIG. 55. Further, as illustrated in FIG. 56, the heating components A102, B102, and C102 are mounted on the component mounting surfaces A116, B116, and C116 respectively of the assembled cooling device 1100 in a semi-finished state. Then, the cooling device 1100 in a finished state illustrated in FIG. 57 is assembled by rotary assembling. The cross-sectional shapes of the blades A112, B112, and C112 provided in the coolers A100, B100, and C100 respectively are set in such a manner as to increase the cooling performance of a cooler as a heating component to be cooled by this cooler generates a larger amount of heat. According to an example of this setting illustrated in FIGS. 54A to 57, the blades B112 and C112 have larger cross-sectional shapes than the blades A112 in order to provide each of the coolers B100 and C100 to cool the heating components B102 and C102 respectively with cooling performance higher than the cooling performance of the cooler A100 to cool the heating component A102 in response to a case where the heating components B102 and C102 are to generate large heat than the heating component A102.

In the eleventh embodiment, a heating component can be mounted on a cooler having required cooling performance. This makes it possible to supply the cooling device 1100 having an optimum size.

12 Twelfth Embodiment

A cooling device 100 in a finished state of a twelfth embodiment differs from the cooling device 100 in a finished state of the first embodiment in that it has a triangular tubular shape.

This difference will be described below. Regarding a structure not to be described below, a corresponding structure of the first embodiment is employed as it is or a modification of such a structure is employed in the twelfth embodiment. A structure employed in an embodiment other than the first embodiment may be employed as it is or a modification of such a structure may be employed in the twelfth embodiment.

Figure 58:
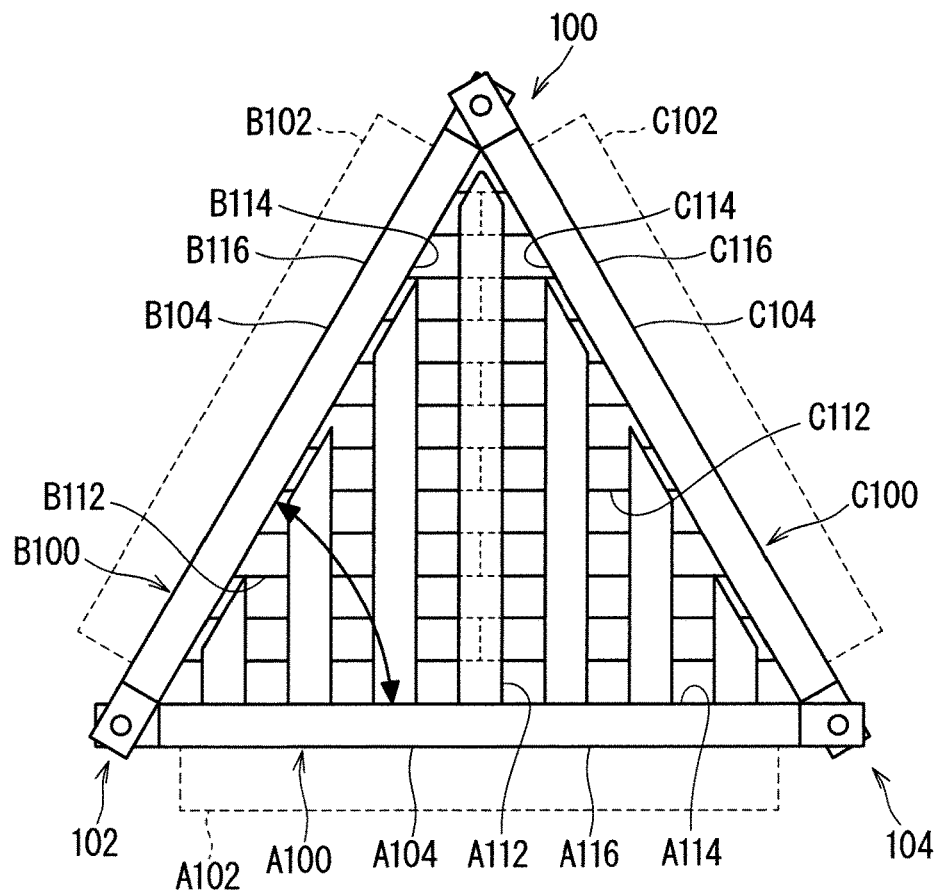
FIG. 58 is a front view schematically showing a cooling device in a finished state and a heating component according to a twelfth embodiment.
Figure 59:
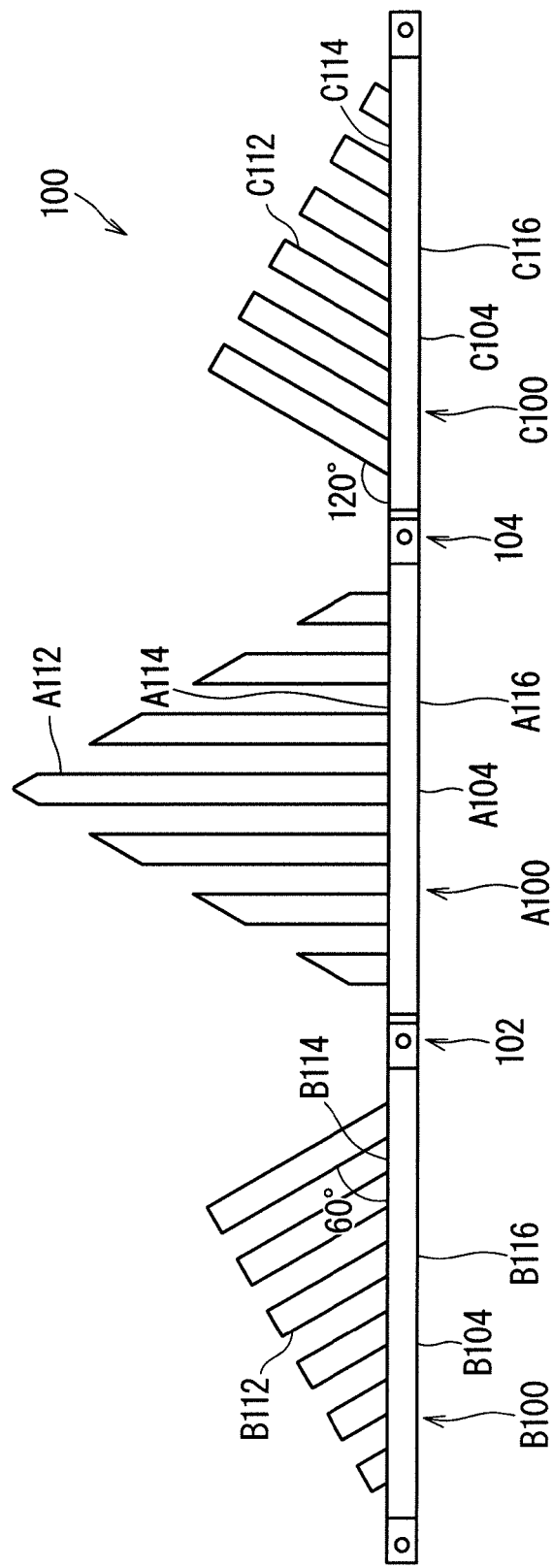
FIG. 59 is a front view schematically illustrating the cooling device in a semi-finished state according to the twelfth embodiment.
Figure 60:
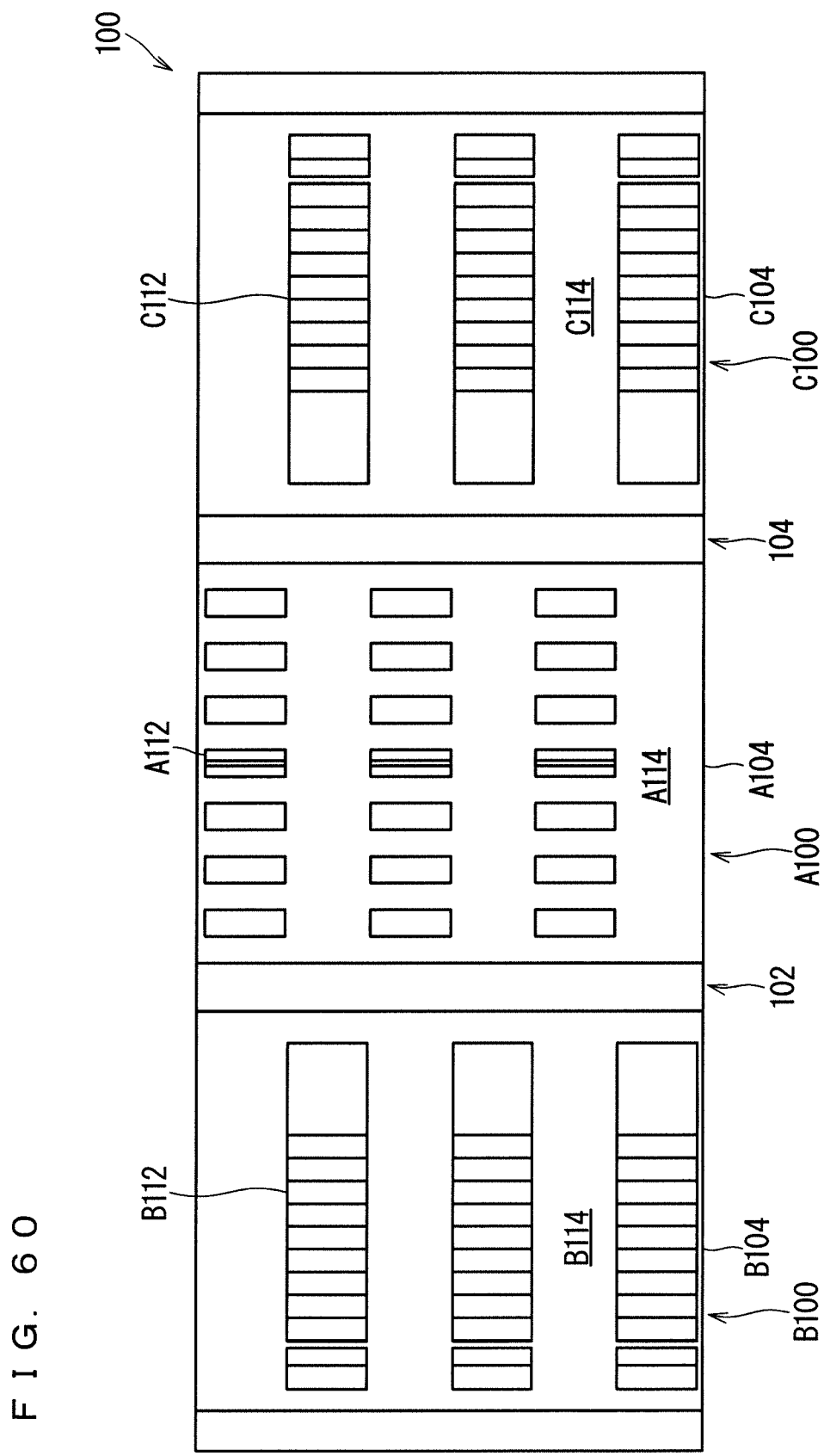
FIG. 60 is a top view schematically illustrating the cooling device in a semi-finished state according to the twelfth embodiment.
Figure 61:
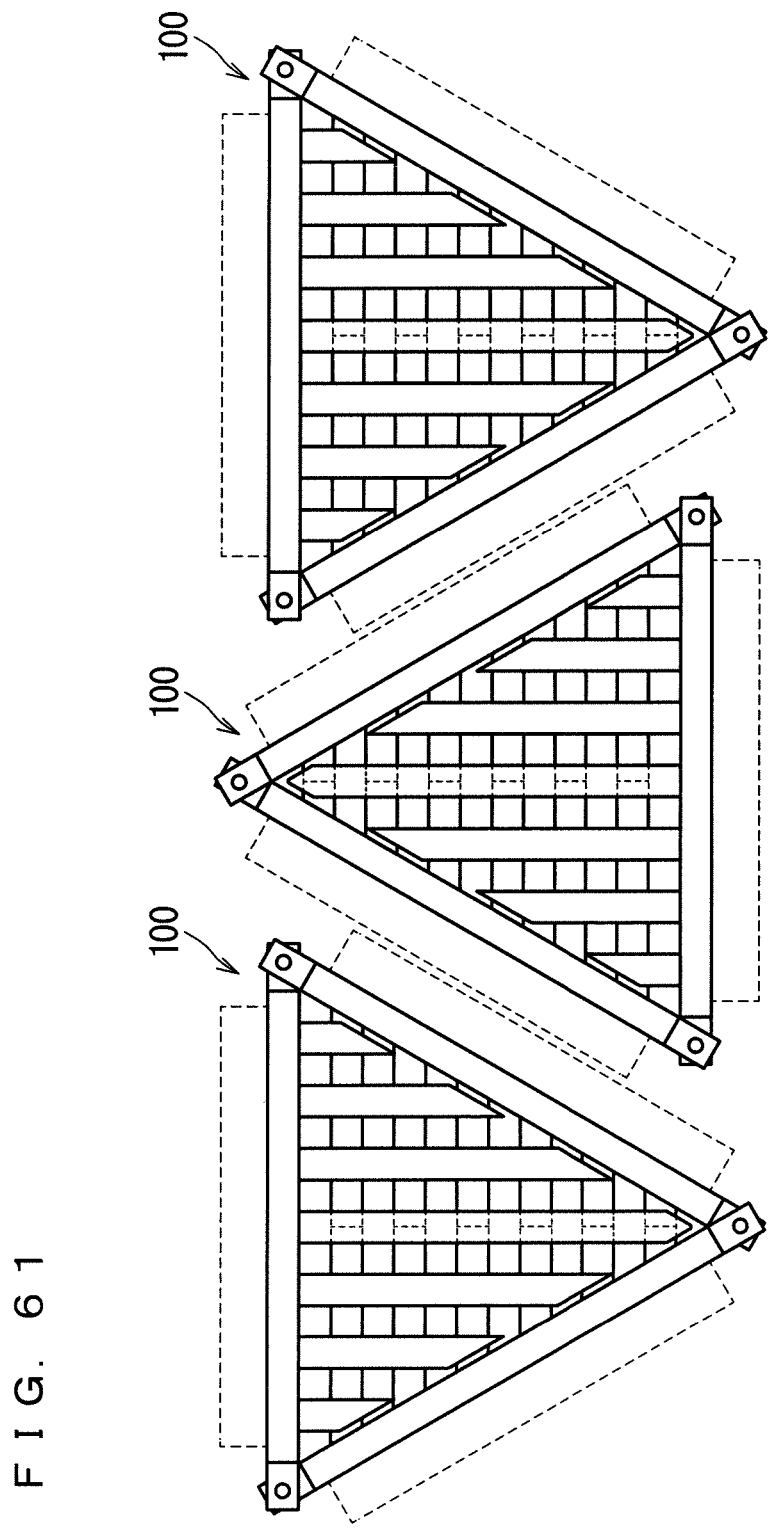
FIG. 61 is a front view schematically illustrating a state in which the cooling devices in a finished state according to the twelfth embodiment are arranged densely.

FIG. 58 is a front view schematically illustrating the cooling device in a finished state and a heating component according to the twelfth embodiment. FIG. 59 is a front view schematically illustrating the cooling device in a semi-finished state according to the twelfth embodiment. FIG. 60 is a top view schematically illustrating the cooling device in a semi-finished state according to the twelfth embodiment. FIG. 61 is a front view schematically illustrating a state in which the cooling devices in a finished state according to the twelfth embodiment are arranged densely.

The cooling device 100 in a finished state has a triangular tubular shape. In the cooling device 100 in a finished state, the component mounting surface A116 and the component mounting surface B116 form an acute angle, the component mounting surface B116 and the component mounting surface C116 form an acute angle, and the component mounting surface C116 and the component mounting surface A116 form an acute angle. By doing so, while the cooler body B104 is maintained connected to the cooler body A104, the rotary mechanism 102 becomes functional to allow the cooler body B104 to rotate relative to the cooler body A104 between a state in which the component mounting surfaces A116 and B116 are pointed to the same direction and a state in which the blades B112 get into gaps between the blades A112 without interfering with the blades A112 and the component mounting surface A116 and the component mounting surface B116 form an acute angle. Further, while the cooler body C104 is maintained connected to the cooler body A104, the rotary mechanism 104 becomes functional to allow the cooler body C104 to rotate relative to the cooler body A104 between a state in which the component mounting surfaces A116 and C116 are pointed to the same direction and a state in which the blades C112 get into gaps between the blades A112 without interfering with the blades A112 and the component mounting surface A116 and the component mounting surface C116 form an acute angle.

In the cooling device 100 in a finished state, the blades B112 and C112 face each other. This makes the blades B112 and C112 extend in directions tilted from directions vertical to the blade coupling surfaces B114 and C114 respectively.

The blades A112 extend in a direction vertical to the blade coupling surface A114. The blades A112 include a plurality of blades having different lengths. The blades B112 extend in a direction tilted from a direction vertical to the blade coupling surface B114. The blades B112 include a plurality of blades having different lengths. The blades C112 extend in a direction tilted from a direction vertical to the blade coupling surface C114. The blades C112 include a plurality of blades having different lengths. As a result of the foregoing, interference can be prevented between the blades A112, B112, and C112.

If the triangular tubular shape has a regular triangular cross-sectional shape, the blades A112 form an angle of about 90° with the blade coupling surface A114. The blades B112 form an angle of about 60° with the blade coupling surface B114. The blades C112 form an angle of about 120° with the blade coupling surface C114.

For formation of the coolers B100 and C100, extruded coolers having the same shape are formed by extrusion. Then, pin working is performed in such a manner as to obtain the coolers B100 and C100 as mirror images of each other. This means that only two types of molds for extrusion are sufficient for forming the coolers A100, B100, and C100.

The invention of the twelfth embodiment achieves effect comparable to that achieved by the invention of the first embodiment.

In addition, according to the invention of the twelfth embodiment, the number of structural components can be reduced if cooling is required only for the three heating components A102, B102, and C102. This can be understood from a difference from a case where the three heating components A102, B102, and C102 are to be cooled using the cooling device 100 of the first embodiment. This case requires a sheet metal component such as the lid 152 for blocking an air passage, and a component such as the male fitting part 154 or the male fitting part 156 for blocking an air passage using the case 172.

In addition, according to the invention of the twelfth embodiment, a large number of the cooling devices 100 in a finished state can be arranged densely as illustrated in FIG. 61 to achieve size reduction of an apparatus including a large number of the cooling devices 100 in a finished state.

In addition, according to the invention of the twelfth embodiment, an air passage is in a penetrated state to allow reduction in pressure loss occurring during cooling. Further, the chimney effect can be achieved by arranging the cooling devices 180 in a finished state in such a manner as to extend an air passage in the vertical direction.

13 Thirteenth Embodiment

A cooling device 100 in a finished state of a thirteenth embodiment differs from the cooling device 100 in a finished state of the first embodiment in that it has a triangular columnar shape.

This difference will be described below. Regarding a structure not to be described below, a corresponding structure of the first embodiment is employed as it is or a modification of such a structure is employed in the thirteenth embodiment. A structure employed in an embodiment other than the first embodiment may be employed as it is or a modification of such a structure may be employed in the thirteenth embodiment.

Figure 62:
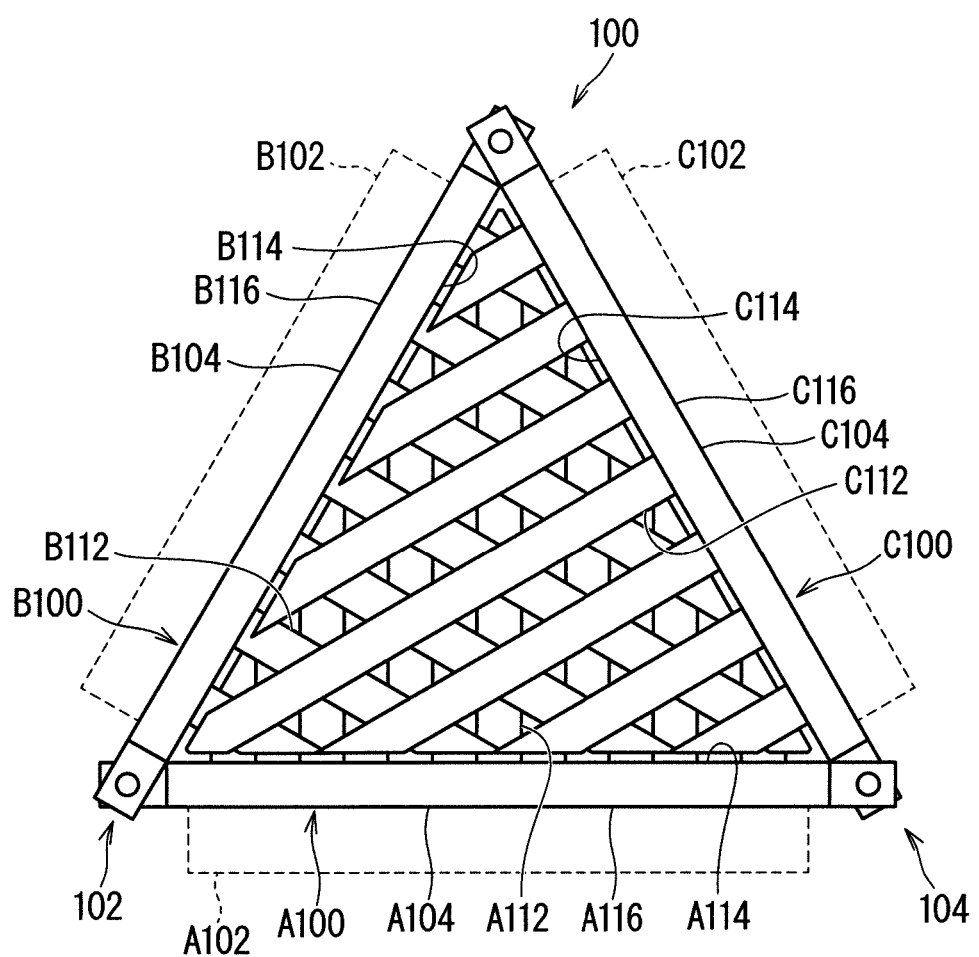
FIG. 62 is a front view schematically illustrating a cooling device in a finished state and a heating component according to a thirteenth embodiment.
Figure 63:
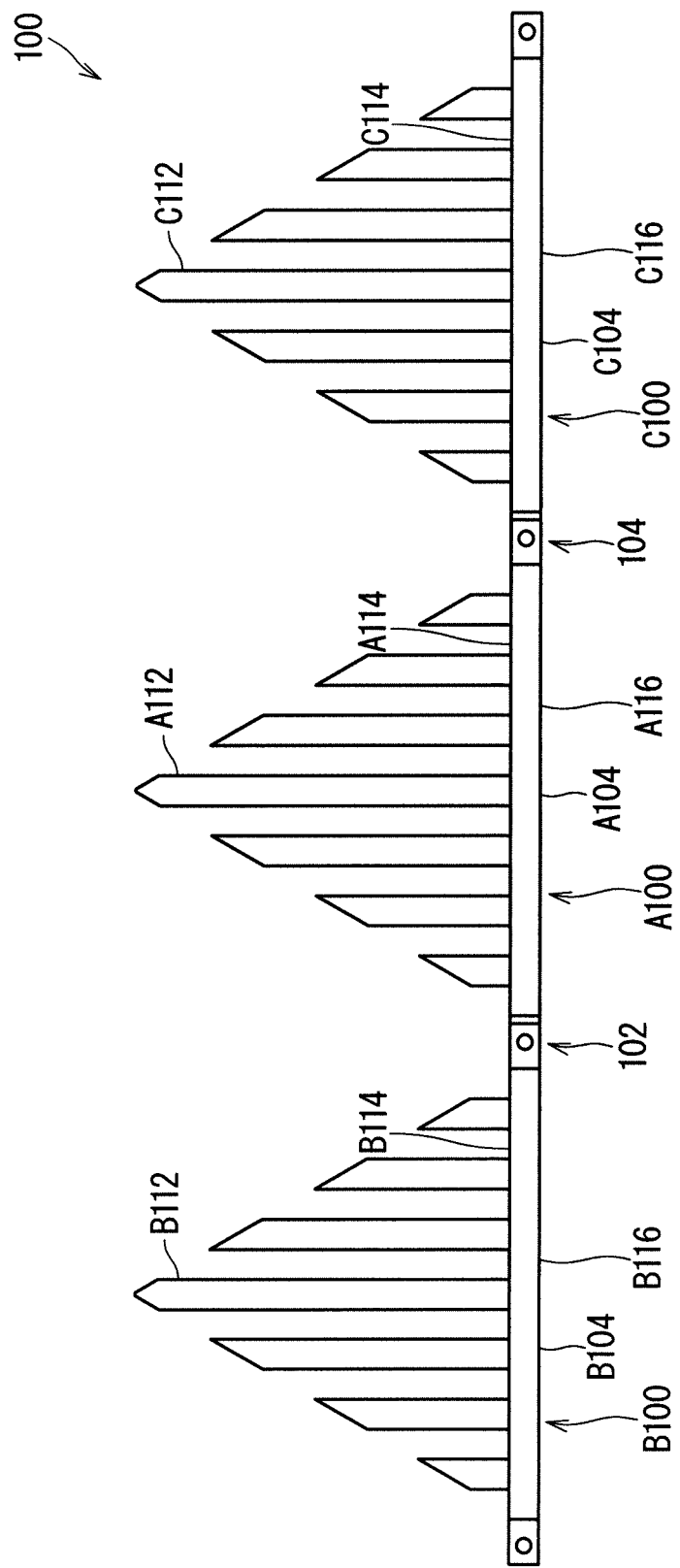
FIG. 63 is a front view schematically illustrating the cooling device in a semi-finished state according to the thirteenth embodiment.
Figure 64:
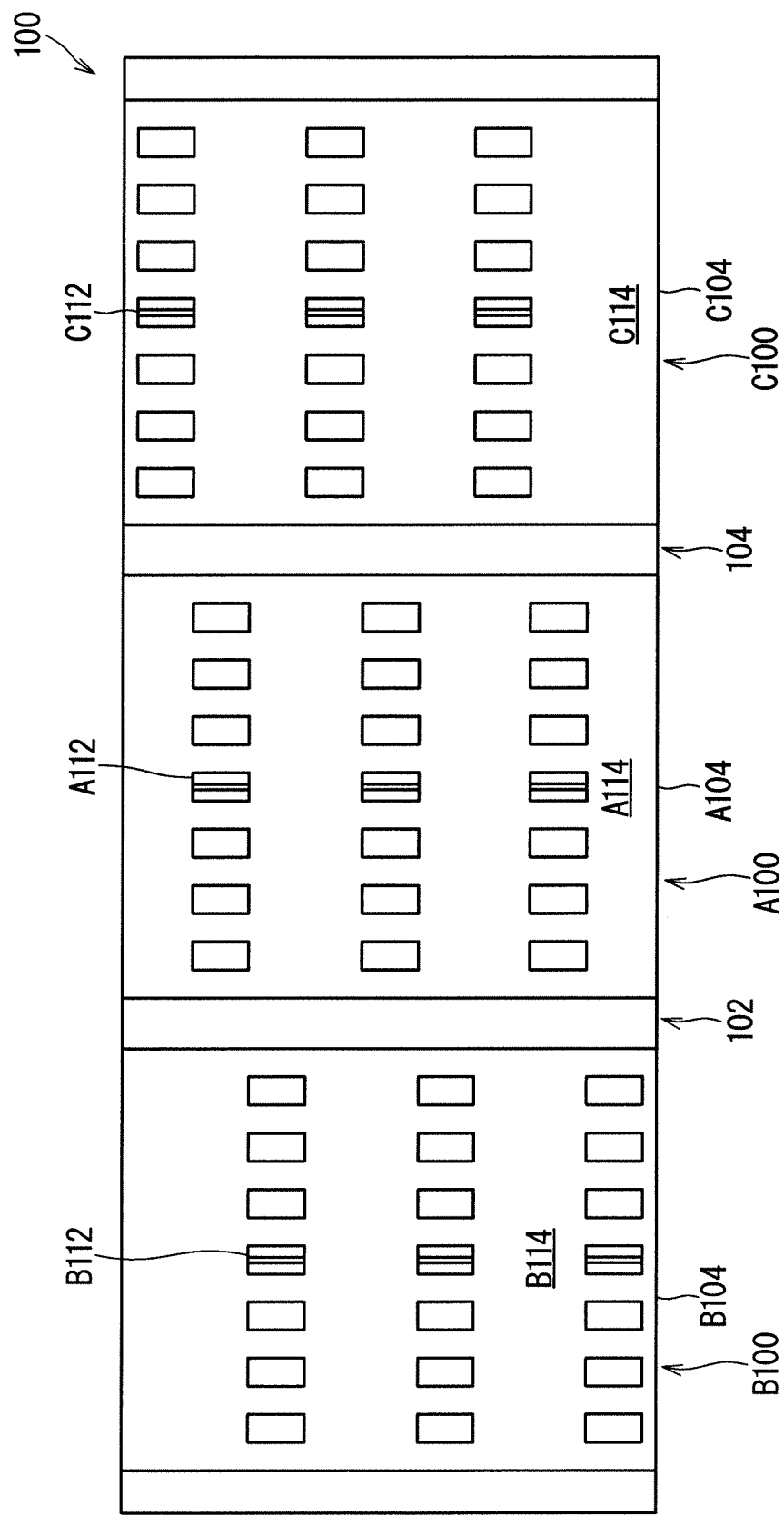
FIG. 64 is a top view schematically illustrating the cooling device in a semi-finished state according to the thirteenth embodiment.

FIG. 62 is a front view schematically illustrating the cooling device in a finished state and a heating component according to the thirteenth embodiment. FIG. 63 is a front view schematically illustrating the cooling device in a semi-finished state according to the thirteenth embodiment. FIG. 64 is a top view schematically illustrating the cooling device in a semi-finished state according to the thirteenth embodiment.

The cooling device 100 in a finished state has a triangular tubular shape. In the cooling device 100 in a finished state, the component mounting surface A116 and the component mounting surface B116 form an acute angle, the component mounting surface B116 and the component mounting surface C116 form an acute angle, and the component mounting surface A116C and the component mounting surface B116 form an acute angle. By doing so, while the cooler body B104 is maintained connected to the cooler body A104, the rotary mechanism 102 becomes functional to allow the cooler body B104 to rotate relative to the cooler body A104 between a state in which the component mounting surfaces A116 and B116 are pointed to the same direction and a state in which the blades B112 get into gaps between the blades A112 without interfering with the blades A112 and the component mounting surface A116 and the component mounting surface B116 form an acute angle. Further, while the cooler body C104 is maintained connected to the cooler body A104, the rotary mechanism 104 becomes functional to allow the cooler body C104 to rotate relative to the cooler body A104 between a state in which the component mounting surfaces A116 and C116 are pointed to the same direction and a state in which the blades C112 get into gaps between the blades A112 without interfering with the blades A112 and the component mounting surface A116 and the component mounting surface C116 form an acute angle.

The blades A112 extend in a direction vertical to the blade coupling surface A114. The blades A112 include a plurality of blades having different lengths. The blades A112 as a whole has a triangular planar shape in a front view. The blades B112 extend in a direction tilted from a direction vertical to the blade coupling surface B114. The blades B112 include a plurality of blades having different lengths. The blades B112 as a whole has a triangular planar shape in a front view. The blades C112 extend in a direction tilted from a direction vertical to the blade coupling surface C114. The blades C112 include a plurality of blades having different lengths. The blades C112 as a whole has a triangular planar shape in a front view. The blades A112, B112, and C112 are arranged at positions shifted in order to prevent the blades A112, B112, and C112 from interfering with each other. As a result of the foregoing, interference can be prevented between the blades A112, B112, and C112.

Each pin provided at a corresponding one of the blades A112, B112, and C112 has a sharp-pointed tip shape. Alternatively, each pin may have a flat tip surface or may have a tip shape pointed in a semispherical pattern.

For formation of the coolers A100, B100, and C100, extruded coolers having the same shape are formed by extrusion. Then, pin working is performed in such a manner as to obtain the three types of coolers A100, B100, and C100 with blades arranged at positions differing from each other. This means that only one type of mold for extrusion is sufficient for forming the coolers A100, B100, and C100.

The invention of the thirteenth embodiment achieves effect comparable to that achieved by the invention of the first embodiment.

In addition, according to the invention of the thirteenth embodiment, the number of structural components can be reduced if cooling is required only for the three heating components A102, B102, and C102, like in the invention of the twelfth embodiment.

In addition, according to the invention of the thirteenth embodiment, a large number of the cooling devices 100 can be arranged densely, like in the invention of the twelfth embodiment. This achieves size reduction of an apparatus including a large number of the cooling devices 100 in a finished state.

In addition, according to the invention of the thirteenth embodiment, the blades A112, B112, and C112 each have a length distribution in which a length is increased at the center. This can improve cooling performance at the center of an air passage where a blade length is increased.

In addition, according to the invention of the thirteenth embodiment, the blades B112 and C112 can be given greater lengths than the corresponding lengths in the invention of the twelfth embodiment.

14 Fourteenth Embodiment

A cooling device 100 in a finished state of a fourteenth embodiment differs from the cooling device 100 in a finished state of the first embodiment in that it has a triangular columnar shape.

This difference will be described below. Regarding a corresponding structure not to be described below, a corresponding structure of the first embodiment is employed as it is or a modification of such a structure is employed in the fourteenth embodiment. A structure employed in an embodiment other than the first embodiment may be employed as it is or a modification of such a structure may be employed in the fourteenth embodiment.

Figure 65:
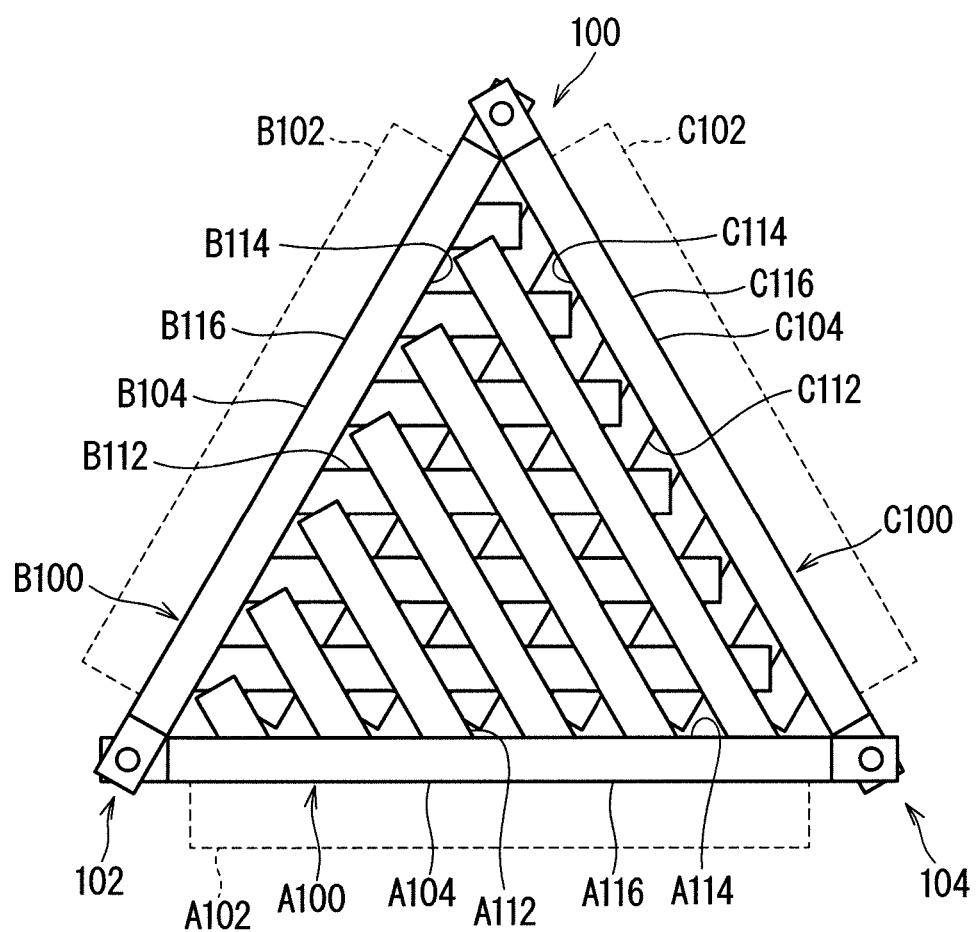
FIG. 65 is a front view schematically illustrating a cooling device in a finished state and a heating component according to a fourteenth embodiment.
Figure 66:
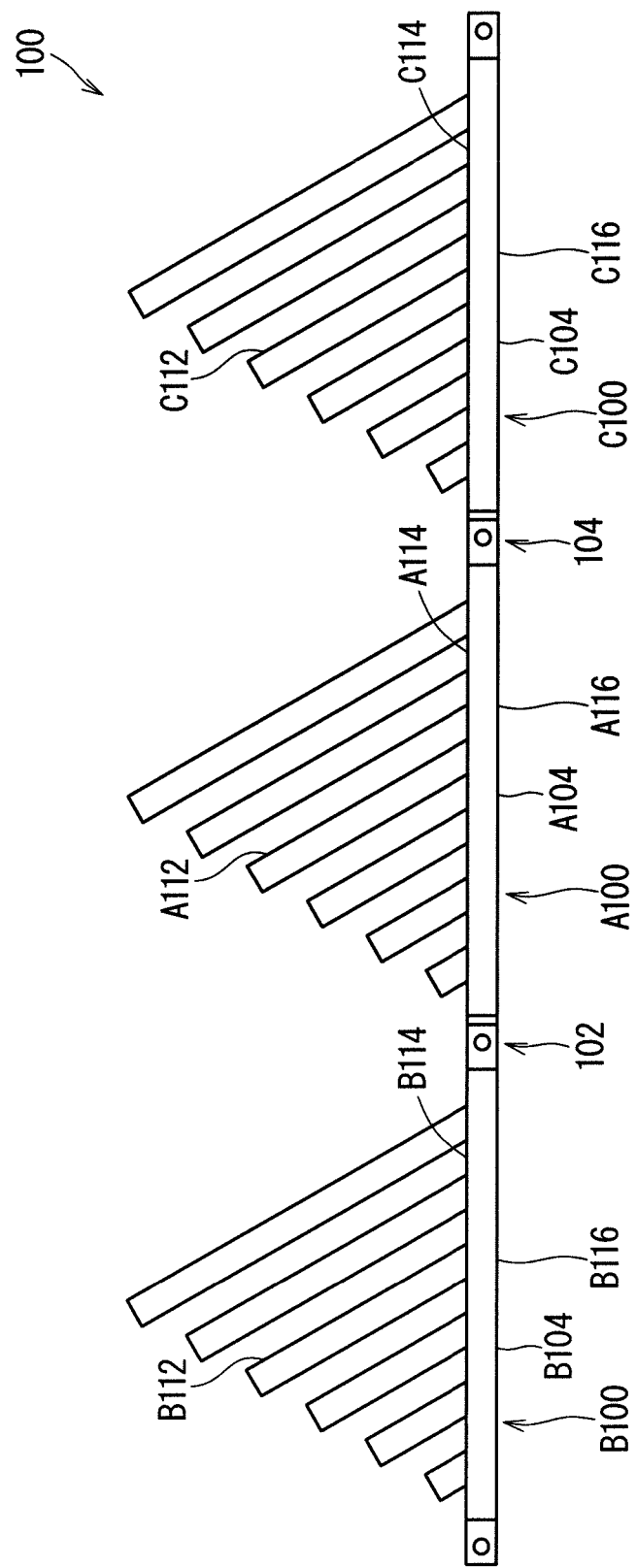
FIG. 66 is a front view schematically illustrating the cooling device in a semi-finished state according to the fourteenth embodiment.
Figure 67:
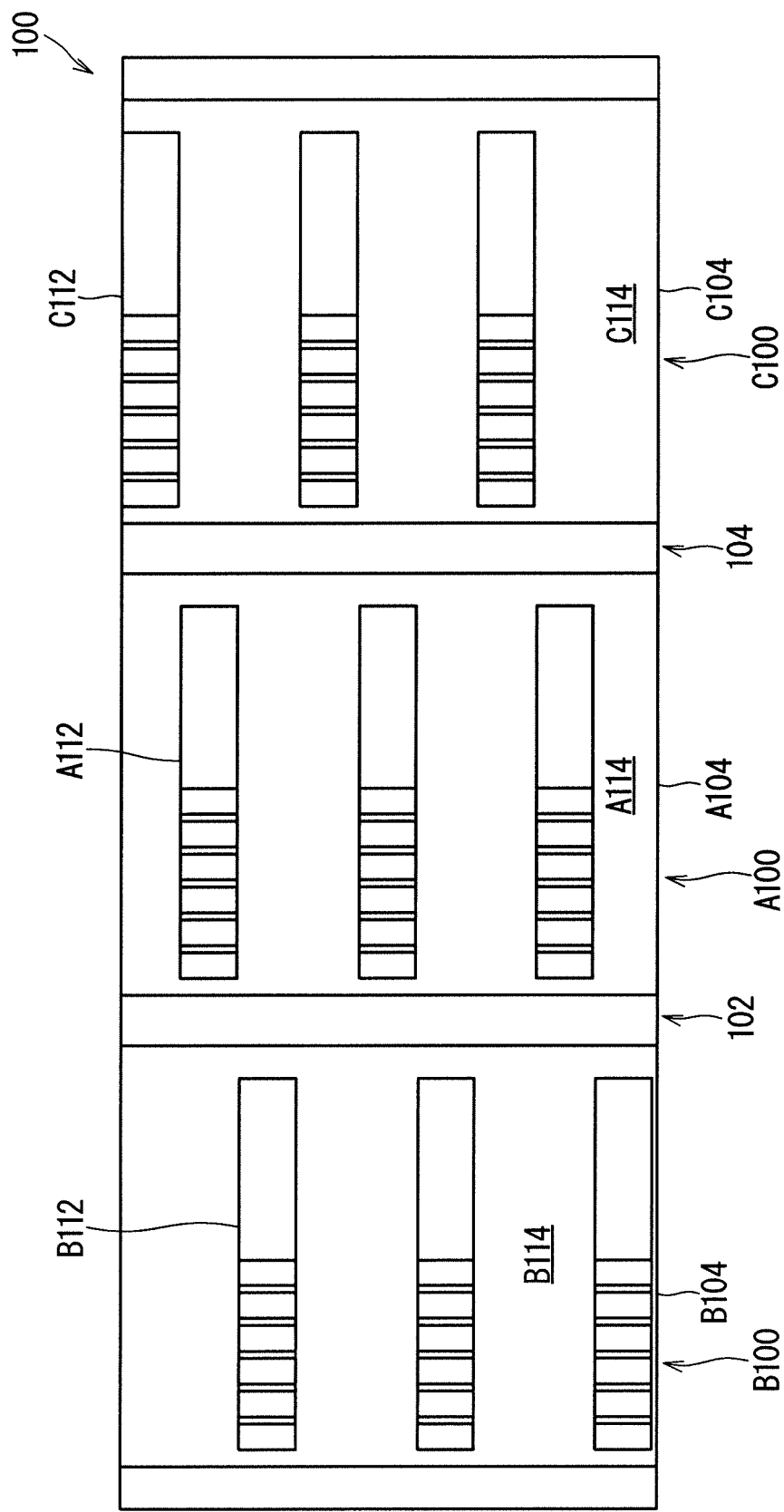
FIG. 67 is a top view schematically illustrating the cooling device in a semi-finished state according to the fourteenth embodiment.

FIG. 65 is a front view schematically illustrating the cooling device in a finished state and a heating component according to the fourteenth embodiment. FIG. 66 is a front view schematically illustrating the cooling device in a semi-finished state according to the fourteenth embodiment. FIG. 67 is a top view schematically illustrating the cooling device in a semi-finished state according to the fourteenth embodiment.

The cooling device 100 in a finished state has a triangular tubular shape. In the cooling device 100 in a finished state, the component mounting surface A116 and the component mounting surface B116 form an acute angle, the component mounting surface B116 and the component mounting surface C116 form an acute angle, and the component mounting surface C116 and the component mounting surface A116 form an acute angle. By doing so, while the cooler body B104 is maintained connected to the cooler body A104, the rotary mechanism 102 becomes functional to allow the cooler body B104 to rotate relative to the cooler body A104 between a state in which the component mounting surfaces A116 and B116 are pointed to the same direction and a state in which the blades B112 get into gaps between the blades A112 without interfering with the blades A112 and the component mounting surface A116 and the component mounting surface B116 form an acute angle. Further, while the cooler body C104 is maintained connected to the cooler body A104, the rotary mechanism 104 becomes functional to allow the cooler body C104 to rotate relative to the cooler body A104 between a state in which the component mounting surfaces A116 and C116 are pointed to the same direction and a state in which the blades C112 get into gaps between the blades A112 without interfering with the blades A112 and the component mounting surface A116 and the component mounting surface C116 form an acute angle.

The blades A112 extend in a direction tilted from the blade coupling surface A114. The blades A112 include a plurality of blades having different lengths. The blades A112 as a whole has a triangular planar shape in a front view. The blades B112 extend in a direction tilted from a direction vertical to the blade coupling surface B114. The blades B112 include a plurality of blades having different lengths. The blades B112 as a whole has a triangular planar shape in a front view. The blades C112 extend in a direction tilted from a direction vertical to the blade coupling surface C114. The blades C112 include a plurality of blades having different lengths. The blades C112 as a whole has a triangular planar shape in a front view. If the triangular tubular shape has a regular triangular shape, the blades A112, B112, and C112 form angles from about 60 to about 120° with the blade coupling surfaces A114, B114, and C114 respectively. The blades A112, B112, and C112 are arranged at positions shifted in order to prevent the blades A112, B112, and C112 from interfering with each other. As a result of the foregoing, interference can be prevented between the blades A112, B112, and C112.

Each pin provided at a corresponding one of the blades A112, B112, and C112 has a sharp-pointed tip shape. Alternatively, each pin may have a flat tip surface or may have a tip shape pointed in a semispherical pattern.

For formation of the coolers A100, B100, and C100, extruded coolers having the same shape are formed by extrusion. Then, pin working is performed in such a manner as to obtain the coolers A100, B100, and C100 with blades arranged at positions differing from each other. This means that only one type of mold for extrusion is sufficient for forming the coolers A100, B100, and C100.

The invention of the fourteenth embodiment achieves effect comparable to that achieved by the invention of the first embodiment.

In addition, according to the invention of the fourteenth embodiment, the number of structural components can be reduced if cooling is required only for the three heating components A102, B102, and C102, like in the invention of the twelfth embodiment.

In addition, according to the invention of the fourteenth embodiment, a large number of the cooling devices 100 in a finished state can be arranged densely, like in the invention of the twelfth embodiment. This achieves size reduction of an apparatus including a large number of the cooling devices 100.

In addition, according to the invention of the fourteenth embodiment, the blades A112, B112, and C112 each have a length distribution in which a length becomes greater in a closer position to an edge. This can improve cooling performance at a peripheral portion of an air passage where a blade length is increased.

If the cooling device 100 in a finished state has a columnar shape with an odd number of sides such as a triangular columnar shape, a pentagonal columnar shape, or a heptagonal columnar shape, parallel arrangement of coolers is not formed. Thus, like in the twelfth, thirteenth, and fourteenth embodiments, blades provided at each cooler are required to include a plurality of blades having different lengths. By contrast, if the cooling device 100 in a finished state has a columnar shape with an even number of sides such a rectangular columnar shape, a hexagonal columnar shape, or an octagonal columnar shape, parallel arrangement of coolers is formed. Thus, blades provided at each cooler can include a plurality of blades having the same length.

15 Fifteenth Embodiment

A cooling device 100 of a fifteenth embodiment differs from the cooling device 100 of the first embodiment in that the three-strand cooler including the coolers A100, B100, and C100 is replaced with a six-strand cooler including coolers A100, B100, C100, D100, E100, and F100.

This difference will be described below. Regarding a structure not to be described below, a corresponding structure of the first embodiment is employed as it is or a modification of such a structure is employed in the fifteenth embodiment. A structure employed in an embodiment other than the first embodiment may be employed as it is or a modification of such a structure may be employed in the fifteenth embodiment.

Figure 68:
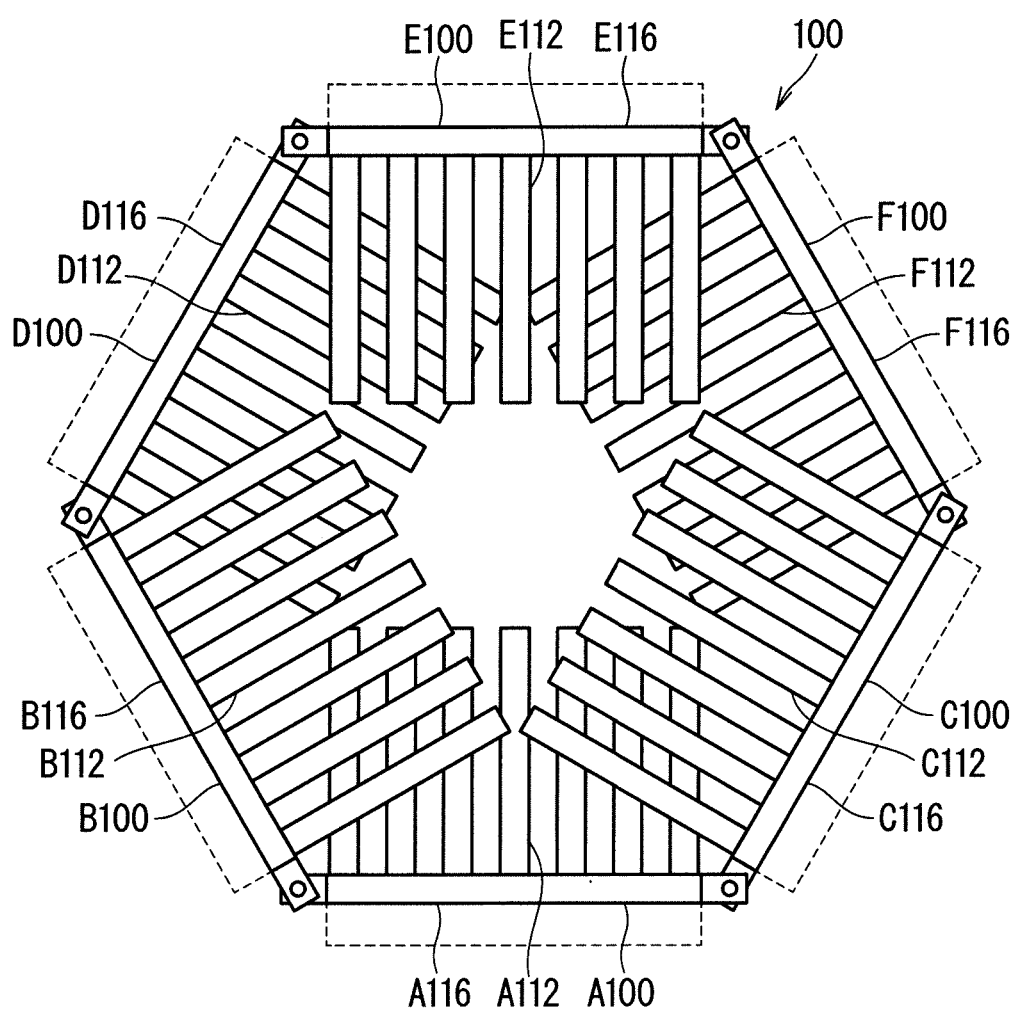
FIG. 68 is a front view schematically illustrating a cooling device in a finished state and a heating component according to a fifteenth embodiment.
Figure 69:
FIG. 69 is a front view schematically illustrating the cooling device in a semi-finished state according to the fifteenth embodiment.

FIG. 68 is a front view schematically illustrating the cooling device in a finished state and a heating component according to the fifteenth embodiment. FIG. 69 is a front view schematically illustrating the cooling device in a semi-finished state according to the fifteenth embodiment. FIG. 70 is a top view schematically illustrating the cooling device in a semi-finished state according to the fifteenth embodiment.

The cooling device 100 in a finished state of the fifteenth embodiment has a hexagonal tubular shape. In the cooling device 100 in a finished state, a component mounting surface A116 and a component mounting surface B116 form an obtuse angle, the component mounting surface B116 and a component mounting surface D116 form an obtuse angle, the component mounting surface D116 and a component mounting surface E116 form an obtuse angle, the component mounting surface E116 and a component mounting surface F116 form an obtuse angle, the component mounting surface F116 and the component mounting surface C116 form an obtuse angle, and the component mounting surface C116 and the a component mounting surface A116 form an obtuse angle.

Blades A112, B112, C112, D112, E112, and F112 each include a plurality of blades having the same shape. This forms a region in the absence of the blades A112, B112, C112, D112, E112, and F112 at the center of an air passage to allow flow of an air current in the air passage using a cross-flow blower for ejecting air in a circumferential direction. The cross-flow blower is also called a sirocco fan. The cross-flow blower has a feature of low noise. Thus, a configuration allowing flow of an air current in the air passage using the cross-flow blower achieves a cooling system with low noise.

The cooling device 100 has a hexagonal tubular shape. Thus, at the coolers A100, B100, C100, D100, E100, and F100, positions for arranging blades are limited to two types. This makes it possible to form the cooling device 100 using two types of coolers.

The chimney effect can be achieved by arranging the cooling devices 180 in a finished state in such a manner as to extend an air passage in the vertical direction in the cooling device 100 in a finished state.

16 Sixteenth Embodiment

A cooling device 100 of a sixteenth embodiment differs from the cooling device 100 of the first embodiment in that the three-strand cooler including the coolers A100, B100, and C100 is replaced with a five-strand cooler including coolers A100, B100, C100, D100, and E100.

This difference will be described below. Regarding a structure not to be described below, a corresponding structure of the first embodiment is employed as it is or a modification of such a structure is employed in the sixteenth embodiment. A structure employed in an embodiment other than the first embodiment may be employed as it is or a modification of such a structure may be employed in the sixteenth embodiment.

Figure 72:
FIG. 72 is a front view schematically illustrating the cooling device in a semi-finished state according to the sixteenth embodiment.

FIG. 71 is a front view schematically illustrating the cooling device in a finished state and a heating component according to the sixteenth embodiment. FIG. 72 is a front view schematically illustrating the cooling device in a semi-finished state according to the sixteenth embodiment. FIG. 73 is a top view schematically illustrating the cooling device in a semi-finished state according to the sixteenth embodiment.

The cooling device 100 in a finished state has a pentagonal tubular shape. In the cooling device 100 in a finished state, a component mounting surface A116 and a component mounting surface B116 form an obtuse angle, the component mounting surface B116 and a component mounting surface D116 form an obtuse angle, the component mounting surface D116 and a component mounting surface E116 form an obtuse angle, the component mounting surface E116 and a component mounting surface C116 form an obtuse angle, and the component mounting surface C116 and the component mounting surface A116 form an obtuse angle.

Blades A112, B112, C112, D112 and E112 each include a plurality of blades having the same shape. This forms a region in the absence of the blades A112, B112, C112, D112, and E112 at the center of an air passage to allow flow of an air current in the air passage using a cross-flow blower for ejecting air in a circumferential direction. The cross-flow blower is also called a sirocco fan. The cross-flow blower has a feature of low noise. Thus, a configuration allowing flow of an air current in the air passage using the cross-flow blower achieves a cooling system with low noise.

17 Different Exemplary Blade Shape

Figure 74A:
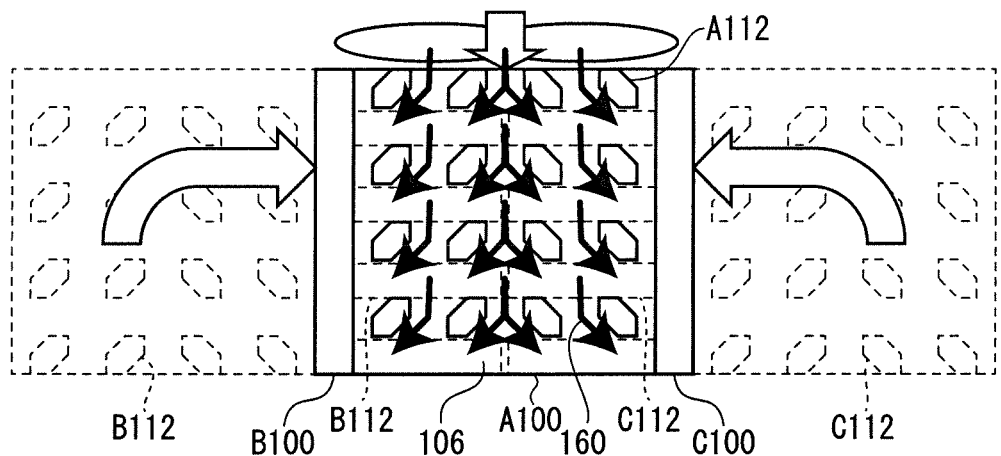
FIGS. 74A and 74B show a different exemplary shape of the blade provided in the cooling device according to each of the first to eleventh embodiments.
Figure 74B:
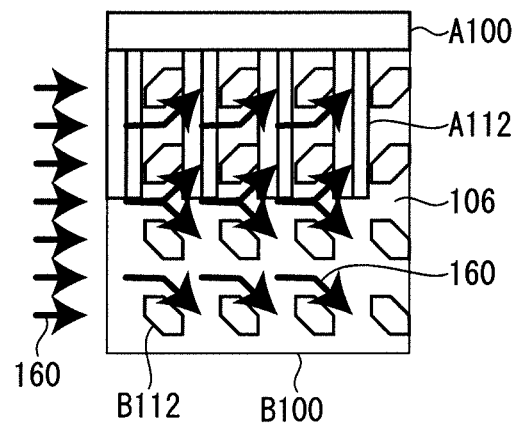
Figure 75:
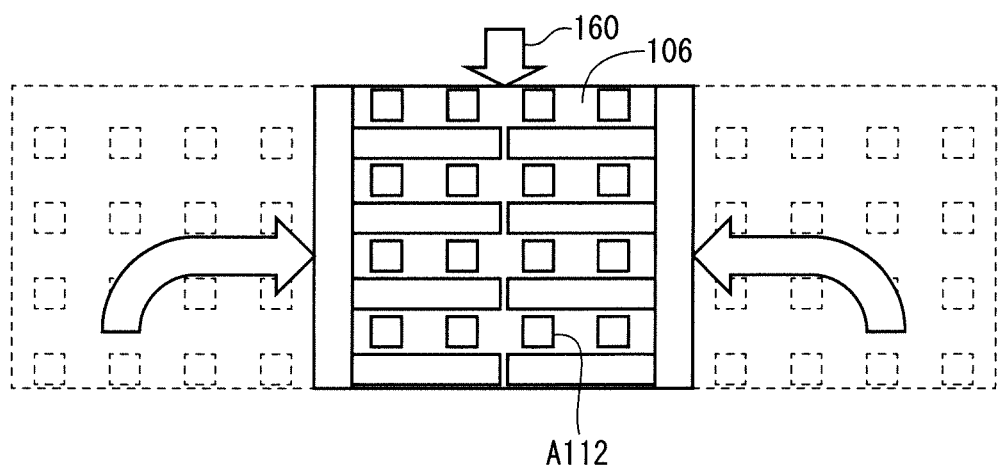
FIG. 75 shows a different exemplary shape of the blade provided in the cooling device according to each of the first to eleventh embodiments.
Figure 76:
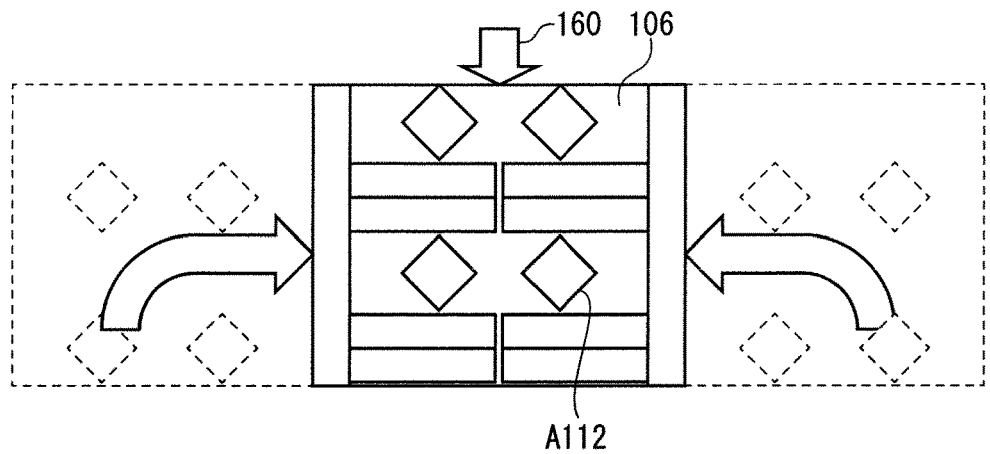
FIG. 76 shows a different exemplary shape of the blade provided in the cooling device according to each of the first to eleventh embodiments.
Figure 77:
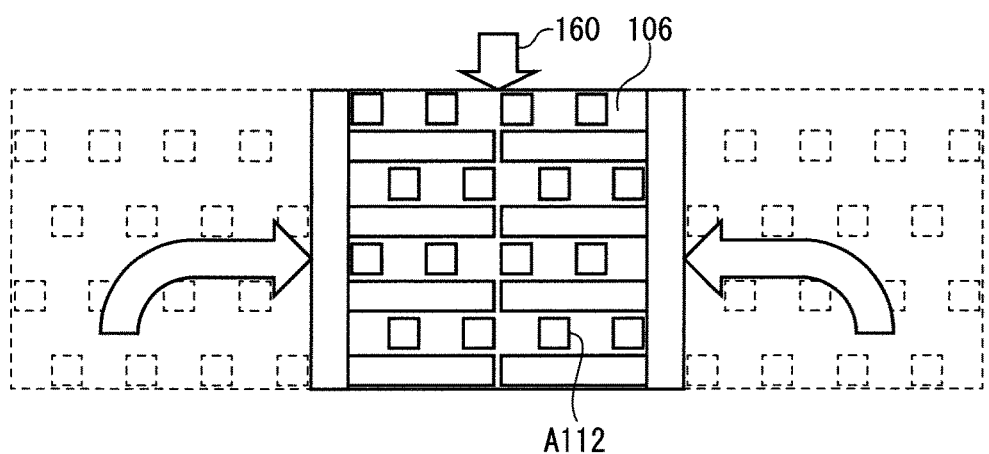
FIG. 77 shows a different exemplary shape of the blade provided in the cooling device according to each of the first to eleventh embodiments.
Figure 78:
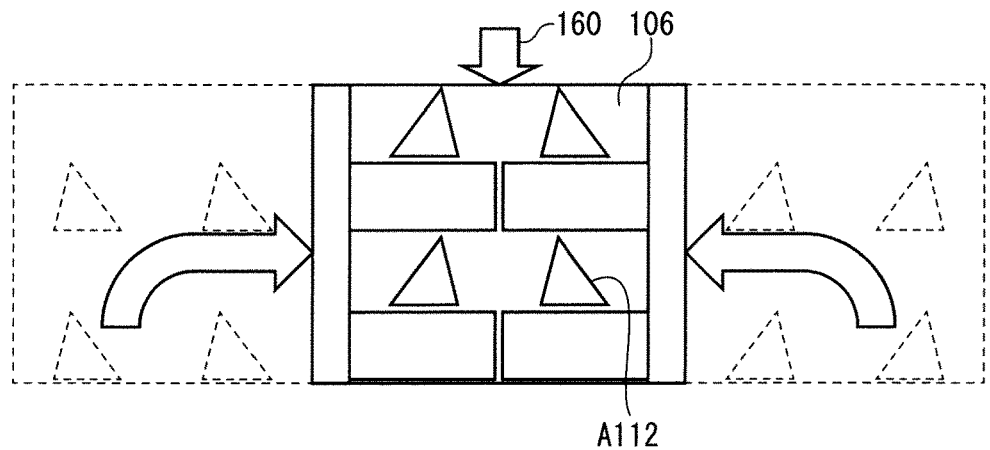
FIG. 78 shows a different exemplary shape of the blade provided in the cooling device according to each of the first to eleventh embodiments.
Figure 79:
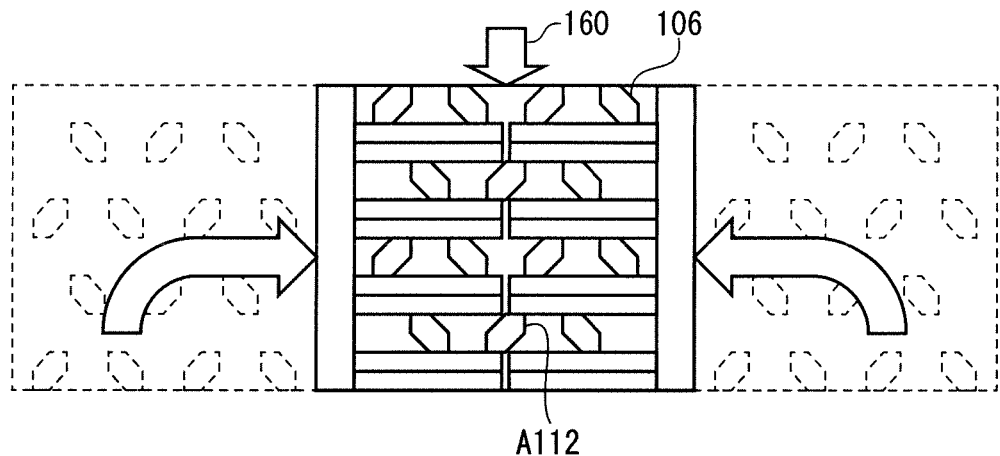
FIG. 79 shows a different exemplary shape of the blade provided in the cooling device according to each of the first to eleventh embodiments.

FIGS. 74A and 74B show different exemplary shapes of the blades A112, B112, and C112 provided in the cooling device according to each of the first to eleventh embodiments. FIG. 74A is a bottom view. FIG. 74B is a side view.

The blades A112, B112, and C112 can be used for controlling a direction in which the cooling air 160 is to flow in the air passage 106 during implementation of forced air cooling, thereby improving the cooling performance of the cooling device. As an example, the blades A112 illustrated in FIGS. 74A and 74B are used for controlling a direction in which the cooling air 160 is to flow in the air passage 106 during implementation of forced air cooling. The blades A112 are used for guiding the cooling air 160 flowing in the air passage 106 from the center of the air passage 106 toward the roots of the blades B112 and C112, thereby concentrating the cooling air at the roots of the blades B112 and C112. In this way, the cooling performance of the cooling device can be improved.

FIGS. 75 to 84 each show different exemplary shapes of the blades A112, B112, and C112 provided in the cooling device according to each of the first to eleventh embodiments.

Figure 80:
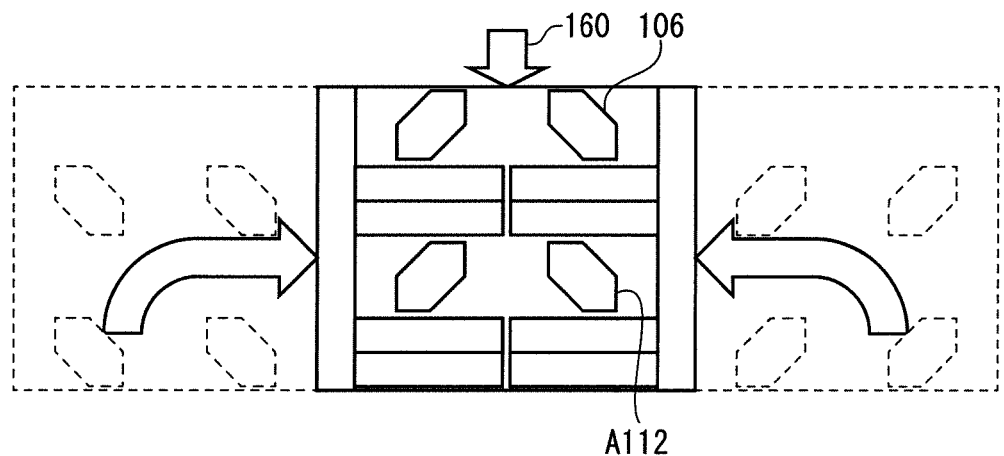
FIG. 80 shows a different exemplary shape of the blade provided in the cooling device according to each of the first to eleventh embodiments.
Figure 81:
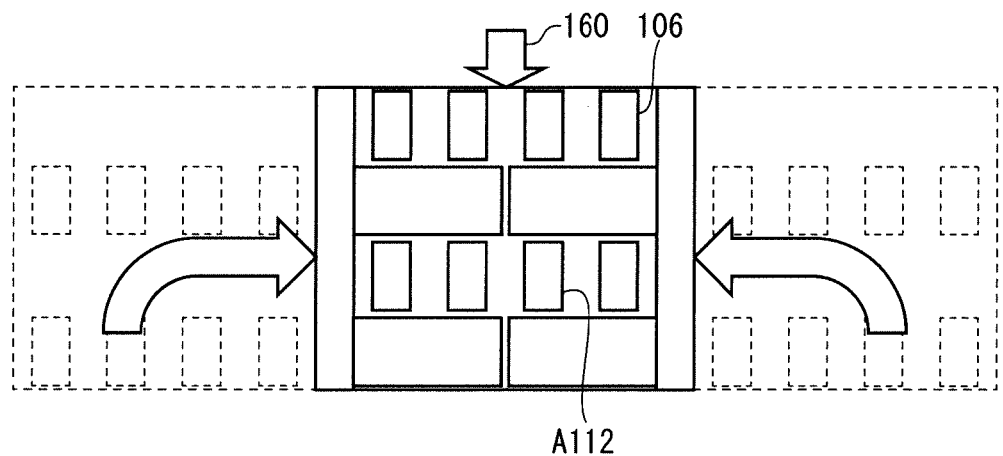
FIG. 81 shows a different exemplary shape of the blade provided in the cooling device according to each of the first to eleventh embodiments.
Figure 82:
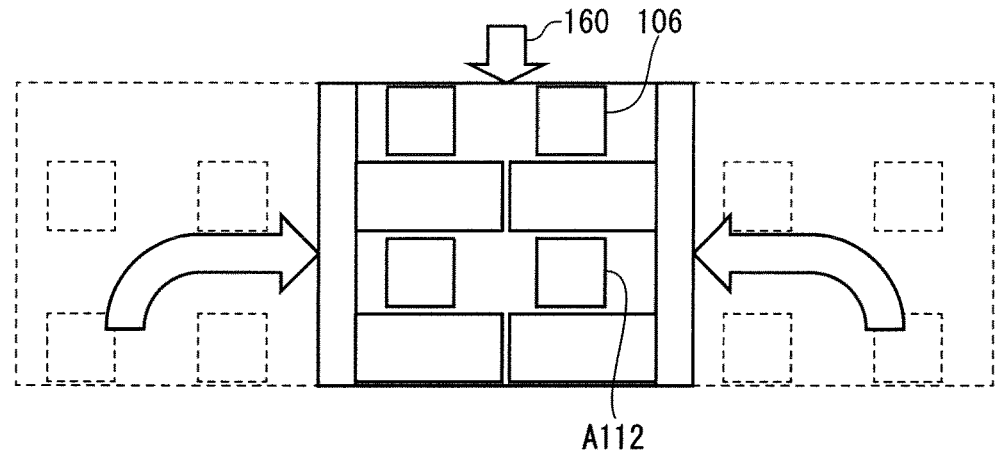
FIG. 82 shows a different exemplary shape of the blade provided in the cooling device according to each of the first to eleventh embodiments.
Figure 83:
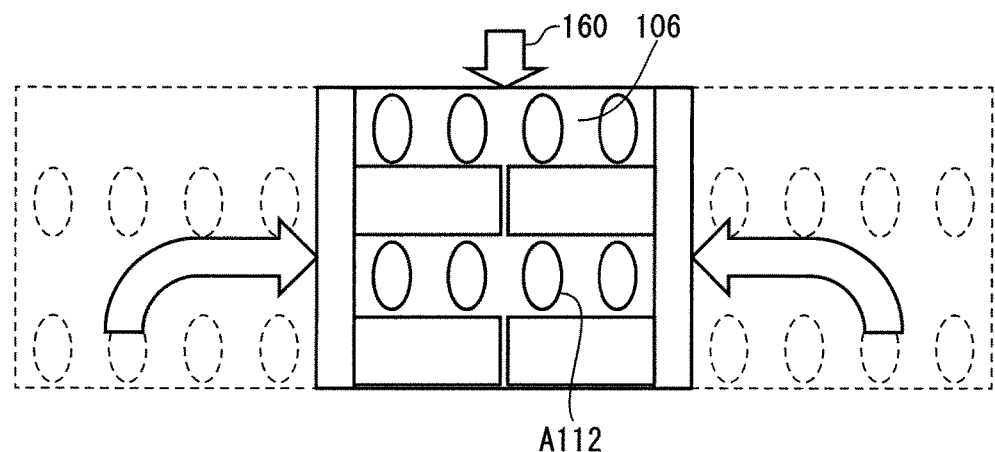
FIG. 83 shows a different exemplary shape of the blade provided in the cooling device according to each of the first to eleventh embodiments.
Figure 84:
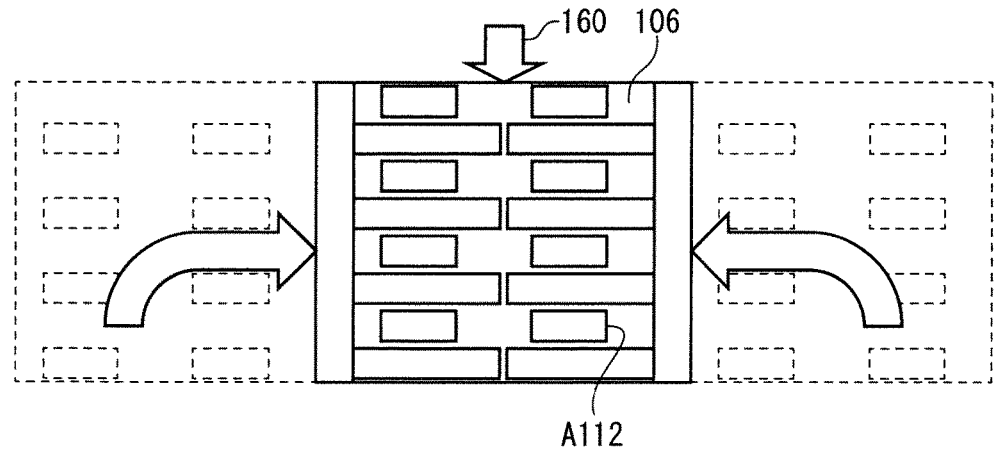
FIG. 84 shows a different exemplary shape of the blade provided in the cooling device according to each of the first to eleventh embodiments.

The blades A112, B112, and C112 can be used for generating a turbulent flow in the cooling air 160 to flow in the air passage 106 during implementation of forced air cooling, thereby improving the cooling performance of the cooling device. As an example, the blades A112 illustrated in each of FIGS. 75 to 84 can be used for generating a turbulent flow in the cooling air 160 to flow in the air passage 106 during implementation of forced air cooling, thereby improving the cooling performance of the cooling device. The blades A112 illustrated in FIG. 75 each have a square cross-sectional shape. The blades A112 illustrated in FIG. 76 each have a diamond cross-sectional shape. The blades A112 illustrated in FIG. 77 each have a square cross-sectional shape and are arranged in a zigzag pattern. The blades A112 illustrated in FIG. 78 each have a triangular cross-sectional shape. The blades A112 illustrated in FIG. 79 each have a polygonal cross-sectional shape and are pointed to random directions. This makes it possible to cause the cooling air 160 to flow in random directions. The blades A112 illustrated in FIG. 80 each have a polygonal cross-sectional shape. The blades A112 illustrated in FIG. 80 are thicker than the blades A112 illustrated in FIG. 79. The blades A112 illustrated in FIG. 81 each have a rectangular cross-sectional shape. The blades A112 illustrated in FIG. 82 each have a square cross-sectional shape. The blades A112 illustrated in FIG. 82 are thicker than the blades illustrated in FIG. 75. The blades A112 illustrated in FIG. 83 each have an oval cross-sectional shape. The blades A112 illustrated in FIG. 84 each have a rectangular shape. The cross-sectional shape of each of the blades A112 illustrated in FIG. 84 has a lengthwise direction differing by 90° from the lengthwise direction of the cross-sectional shape of each of the blades A112 illustrated in FIG. 81. The blades A112 having cross-sectional shapes other than the foregoing cross-sectional shapes may be employed.

Each of the blades A112, B112, and C112 can be formed by the foregoing formation methods.

18 Incorporation into Three-Phase Inverter

An example of cooling of a circuit device 1200 by the cooling device 100 provided in the cooler-equipped case 170 according to the third embodiment will be described below. The circuit device 1200 may be cooled by a cooling device other than the cooling device 100 provided in the cooler-equipped case 170 according to the third embodiment.

Figure 85:
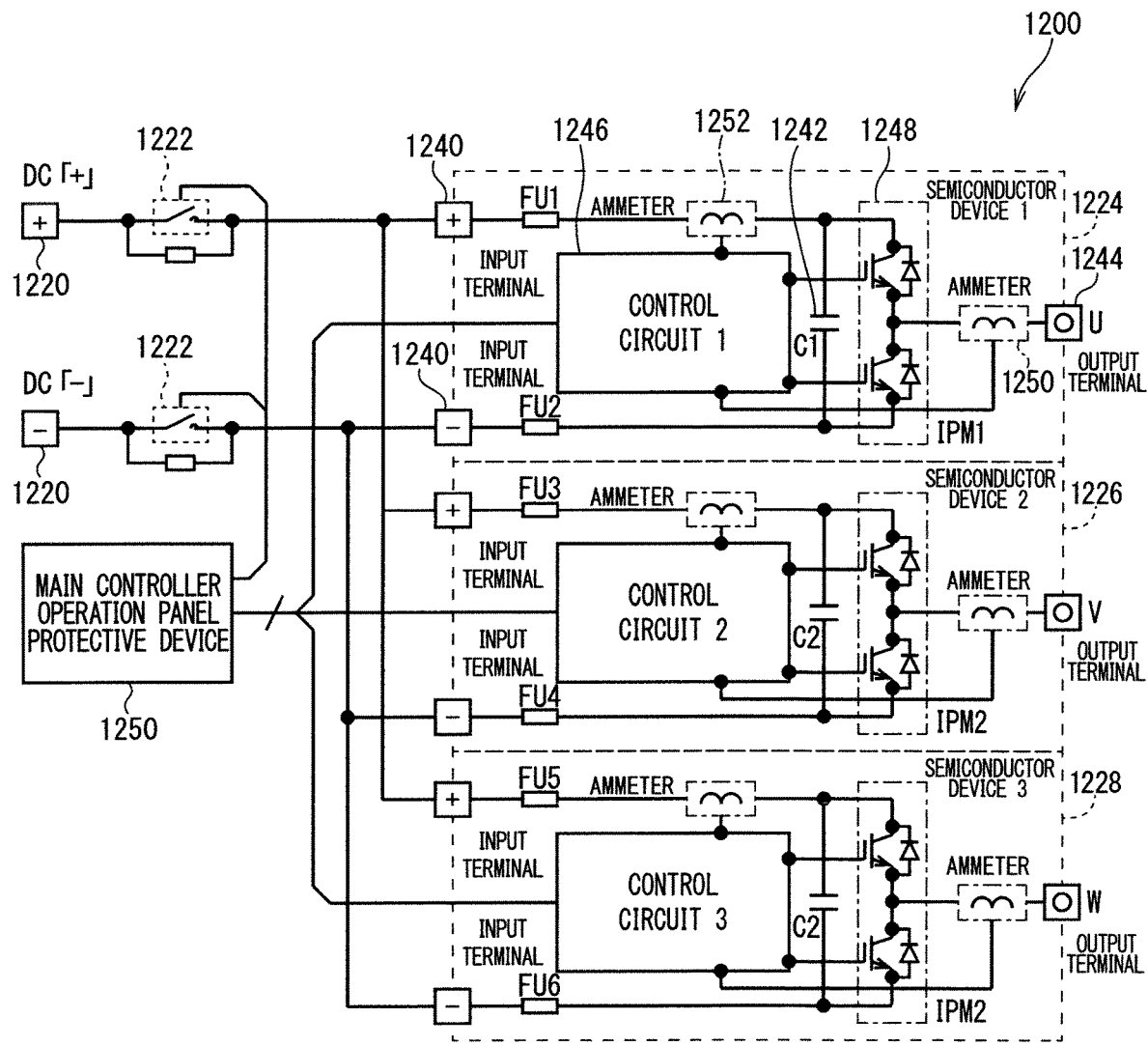
FIG. 85 is a circuit diagram of a circuit device to be cooled by the cooling device provided in the cooler-equipped case according to the third embodiment.

FIG. 85 is a circuit diagram of the circuit device 1200 to be cooled by the cooling device 100 provided in the cooler-equipped case 170 according to the third embodiment.

The circuit device 1200 illustrated in FIG. 85 includes a DC input terminal 1220, a switch 1222, a U-phase circuit 1224, a V-phase circuit 1226, and a W-phase circuit 1228. The U-phase circuit 1224, the V-phase circuit 1226, and the W-phase circuit 1228 each performs pulse width modulation (PWM) on a direct current input to the input terminal 1220 to generate an alternating current. The U-phase circuit 1224, the V-phase circuit 1226, and the W-phase circuit 1228 each include an input terminal 1240, a smoothing capacitor 1242, an output terminal 1244, a control circuit 1246, an IGBT power module 1248, an ammeter 1250, and an ammeter 1252. A direct current is input to the input terminal 1240. The smoothing capacitor 1242 smoothens the input direct current. The IGBT power module 1248 switches the smoothed direct current to generate an alternating current. The generated U-phase, V-phase, and W-phase are output from the corresponding output terminals 1244. The control circuit 1246 controls switching by the IGBT power module 1248 under control by a main controller 1250. The ammeter 1250 senses the level of a current to be output. The ammeter 1252 senses the level of an input current.

Figure 86A:
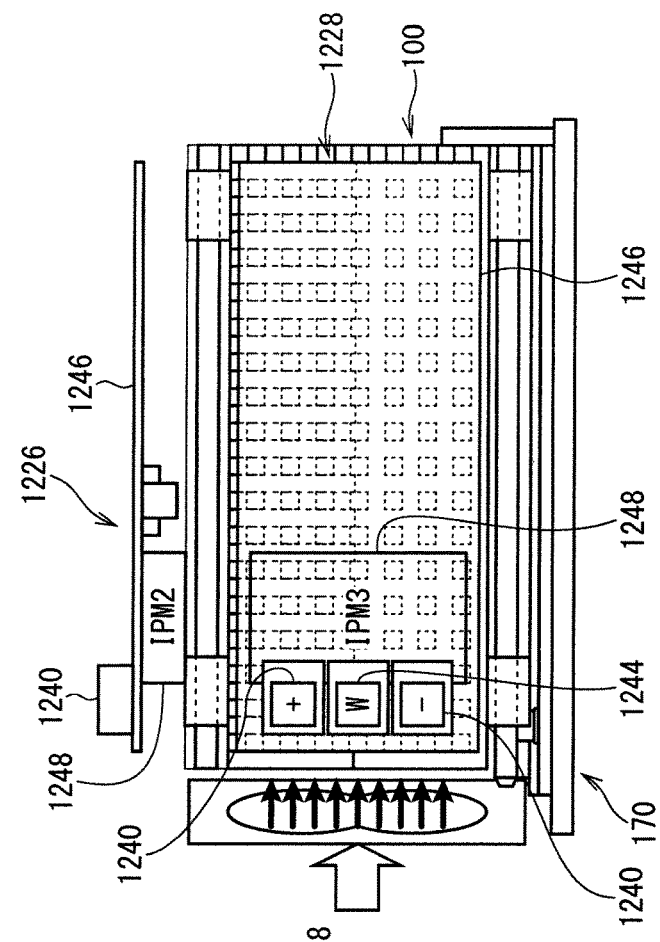
FIGS. 86A and 86B schematically illustrate a state in which the circuit device is cooled by the cooling device provided in the cooler-equipped case according to the third embodiment.
Figure 86B:
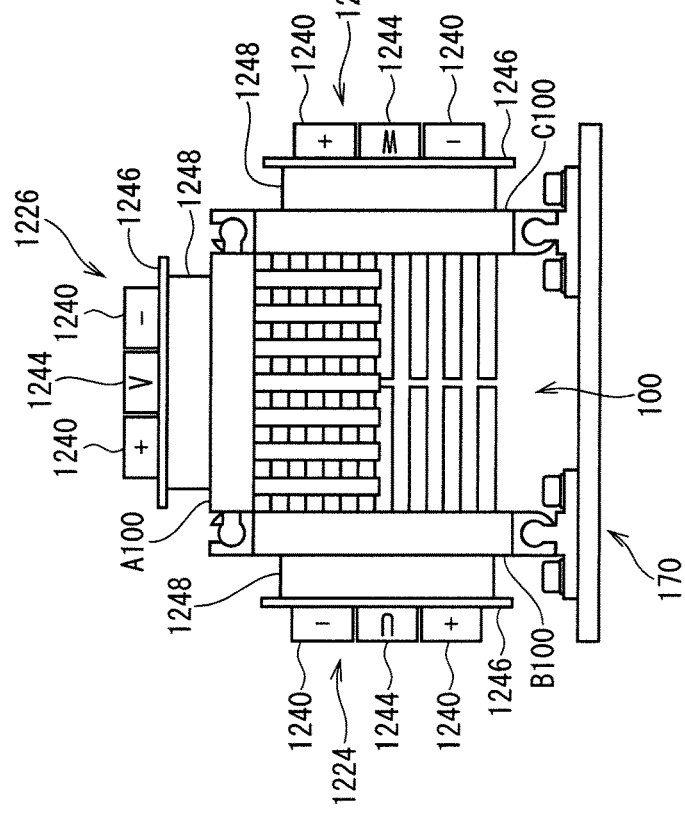

FIGS. 86A and 86B are front views schematically illustrating a state in which the circuit device 1200 is cooled by the cooling device 100 provided in the cooler-equipped case 170 according to the third embodiment. FIG. 86A is a front view. FIG. 86B is a side view.

FIGS. 86A and 86B illustrate a state in which the IGBT power module 1248 provided in the U-phase circuit 1224, the IGBT power module 1248 provided in the V-phase circuit 1226, and the IGBT power module 1248 provided in the W-phase circuit 1228 are cooled by the cooler B100, the cooler A100, and the cooler C100 respectively.

The embodiments of the present invention can be combined freely, and each embodiment can be modified or omitted, where appropriate, within a range of the invention.

While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS

100 Cooling device
102, 104 Rotary mechanism
A100, B100, C100 D100 Cooler
A104, B104, C104, D104 Cooler body
A102, B102, C102, D102 Heating component
A112, B112, C112, D112 Blade
A110, B110, C110, D110 Base plate
A114, B114, C114, D114 Blade coupling surface
A116, B116, C116, D116 Component mounting surface
A118, A124 Shaft B118, C124 Shaft hole
B122, C128 Cutout
A106, A108, A180, A186, B182, B188, B184, C194, D150, D152, 154, 156, 310 Male fitting part
A182, A184, B106, B180, B188. B190, C108, C150, C186, C192, 300 Female fitting part
A164, B164, A166, C166, C170 Circular fitting part

The invention claimed is:

1. A cooling device comprising:
a first cooler body including a first base plate and first blades, the first base plate having a first component mounting surface, the first blades being coupled to the first base plate;
a second cooler body including a second base plate and second blades, the second base plate having a second component mounting surface, the second blades being coupled to the second base plate; and
a fitting part, with the second cooler body maintained connected to the first cooler body, realizing a state in which the first component mounting surface and the second component mounting surface are pointed in the same direction and a state in which the second blades get into gaps between the first blades without interfering with the first blades.

2. The cooling device according to claim 1, wherein the fitting part includes:
a rotary mechanism allowing the second cooler body to rotate relative to the first cooler body, and
the rotary mechanism includes:
a male fitting part coupled to one of the first cooler body and the second cooler body; and
a female fitting part coupled to the other of the first cooler body and the second cooler body and fitted to the male fitting part.

3. The cooling device according to claim 2, wherein
the second cooler body includes a component mounting surface that is either the first component mounting surface or the second component mounting surface,
the male fitting part includes a shaft,
the female fitting part has a shaft hole, a cutout, and a surface that is either an R surface or a C chamfered surface,
the shaft is housed in the shaft hole,
the cutout extends from the shaft hole to reach a surface of the female fitting part, and is arranged in a direction tilted toward a peripheral direction of the shaft hole from a direction vertical to both a direction in which the component mounting surface is pointed and a direction in which the shaft hole extends as viewed from the shaft hole, and
when a transition is made from a state in which the first component mounting surface and the second component mounting surface are pointed in the same direction to a state in which the second blades get into gaps between the first blades without interfering with the first blades, the surface is arranged at a position closer to the first cooler body and does not interfere with the first cooler body when the transition is made.

4. The cooling device according to claim 2, wherein
the second cooler body includes a component mounting surface that is either the first component mounting surface or the second component mounting surface,
the male fitting part includes a shaft,
the female fitting part has a shaft hole and a cutout,
the shaft is housed in the shaft hole, and the shaft hole has an oval shape extending in a direction in which the component mounting surface is pointed as viewed from a direction in which the shaft hole extends, and
the cutout extends from the shaft hole to reach a surface of the female fitting part, and is arranged in such a manner as to generate an offset from the center of the shaft hole as viewed in the direction in which the component mounting surface is pointed.

5. The cooling device according to claim 2, to wherein
the first base plate has a blade coupling surface to which the first blades are coupled,
the second base plate has a blade coupling surface to which the second blades are coupled, and
in plan views of the first base plate and the second base plate taken from directions in which the first blade coupling surface and the second blade coupling surface are pointed respectively, when the respective centers of the first base plate and the second base plate are matched to each other, the male fitting part is brought into point symmetry with the female fitting part with respect to the respective centers of the first base plate and the second base plate.

6. The cooling device according to claim 1, wherein
the fitting part includes:
a rotary mechanism allowing the second cooler body to rotate relative to the first cooler body, and
the rotary mechanism includes:
a coupling rod;
a first circular fitting part fitted to the coupling rod and coupled to the first cooler body; and
a second circular fitting part fitted to the coupling rod and coupled to the second cooler body.

7. The cooling device according to claim 6, wherein
the first base plate has a blade coupling surface to which the first blades are coupled,
the second base plate has a blade coupling surface to which the second blades are coupled, and
in plan views of the first base plate and the second base plate taken from directions in which the first blade coupling surface and the second blade coupling surface are pointed respectively, when the respective centers of the first base plate and the second base plate are matched to each other, the second circular fitting part is brought into point symmetry with the first circular fitting part with respect to the respective centers of the first base plate and the second base plate.

8. The cooling device according to claim 1, wherein
the first base plate has a blade coupling surface to which the first blades are coupled,
the second base plate has a blade coupling surface to which the second blades are coupled, and
in plan views of the first base plate and the second base plate taken from directions in which the first blade coupling surface and the second blade coupling surface are pointed respectively, when the respective centers of the first base plate and the second base plate are matched to each other, the second blades are brought into point symmetry with the first blades with respect to the respective centers of the first base plate and the second base plate.

9. The cooling device according to claim 1, wherein
the fitting part is a first fitting part,
the cooling device further comprises:
a third cooler body including a third base plate and third blades, the third base plate having a third component mounting surface, the third blades being coupled to the third base plate; and a second fitting part, with the third cooler body maintained connected to the first cooler body, realizing a state in which the first component mounting surface and the third component mounting surface are pointed in the same direction and a state in which the third blades get into gaps between the first blades without interfering with the first blades, and in the state in which the second blades and the third blades get into gaps between the first blades without interfering with the first blades, the third blades get into gaps between the second blades without interfering with the second blades.

10. The cooling device according to claim 1, wherein
the first blades include a plurality of first blades having different lengths,
the second blades include a plurality of second blades having different lengths,
the fitting part is a first fitting part,
the state in which the second blades get into gaps between the first blades without interfering with the first blades is a state in which the first component mounting surface and the second component mounting surface form an acute angle, and
the cooling device further comprises:
a third cooler body including a third base plate and third blades, the third base plate having a third component mounting surface, the third blades including a plurality of third blades having different lengths, and being coupled to the third base plate; and
a second fitting part, with the third cooler body maintained connected to the first cooler body, realizing a state in which the first component mounting surface and the third component mounting surface are pointed in the same direction and a state in which the third blades get into gaps between the first blades without interfering with the first blades and the first component mounting surface and the third component mounting surface form an acute angle.

11. The cooling device according to claim 1, wherein
the first cooler body cools a first heating component,
the second cooler body cools a second heating component to generate a larger amount of heat than the first heating component,
the first blades and the second blades have cross-sectional shapes that provide the second cooler body with higher cooling performance than the first cooler body.

12. The cooling device according to claim 1, wherein
the fitting part is a first fitting part, and
the cooling device further comprises:
a third cooler body including a third base plate and third blades, the third base plate having a third component mounting surface, the third blades being coupled to the third base plate;
a second fitting part, with the third cooler body maintained connected to the first cooler body, realizing a state in which the first component mounting surface and the third component mounting surface are pointed in the same direction and a state in which the third blades get into gaps between the first blades without interfering with the first blades;
a first female fitting part coupled to the second cooler body; and
a second female fitting part coupled to the third cooler body.

13. A lid-equipped cooling device comprising:
the cooling device according to claim 12;
a lid;
a first male fitting part coupled to the lid and to which the first female fitting part is fitted; and
a second male fitting part coupled to the lid and to which the second female fitting part is fitted.

14. A case with a cooling device comprising:
the cooling device according to claim 12;
a case housing the cooling device;
a first male fitting part coupled to the case and to which the first female fitting part is fitted; and
a second male fitting part coupled to the case and to which the second female fitting part is fitted.

15. The cooling device according to claim 9, wherein
the second fitting part includes the rotary mechanism allowing the third cooler body to rotate relative to the first cooler body.

16. The cooling device according to claim 10, wherein
the second fitting part includes the rotary mechanism allowing the third cooler body to rotate relative to the first cooler body.

17. The cooling device according to claim 12, wherein
the second fitting part allows the third cooler body to rotate relative to the first cooler body.

18. The cooling device according to claim 9, wherein
the third blades each has a pin-like shape.

19. The cooling device according to claim 1, wherein
the first blades and the second blades each has a pin-like shape.

20. An inverter comprising:
the case with the cooling device according to claim 14; and
a circuit device that is cooled by the cooling device.

* * * * *